United States Patent
Toyotaka et al.

(10) Patent No.: US 11,575,013 B2
(45) Date of Patent: Feb. 7, 2023

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Kouhei Toyotaka, Kanagawa (JP); Hideki Uochi, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 8 days.

(21) Appl. No.: 17/279,735

(22) PCT Filed: Oct. 22, 2019

(86) PCT No.: PCT/IB2019/058970
§ 371 (c)(1),
(2) Date: Mar. 25, 2021

(87) PCT Pub. No.: WO2020/089729
PCT Pub. Date: May 7, 2020

(65) Prior Publication Data
US 2022/0037475 A1    Feb. 3, 2022

(30) Foreign Application Priority Data
Nov. 2, 2018 (JP) .............................. JP2018-207026

(51) Int. Cl.
*H01L 29/10* (2006.01)
*H01L 29/26* (2006.01)
(Continued)

(52) U.S. Cl.
CPC .......... *H01L 29/26* (2013.01); *H01L 27/0629* (2013.01); *H01L 27/088* (2013.01); *H02M 7/103* (2013.01)

(58) Field of Classification Search
CPC ....... H01L 27/06; H01L 27/12; H01L 27/108; H01L 27/0629; H01L 27/088;
(Continued)

(56) References Cited

U.S. PATENT DOCUMENTS 6,563,480 B1   5/2003  Nakamura
7,663,140 B2   2/2010  Yamazaki et al.
(Continued)

FOREIGN PATENT DOCUMENTS

JP   2000-208018 A   7/2000
JP   2004-112944 A   4/2004
(Continued)

OTHER PUBLICATIONS

International Search Report (Application No. PCT/IB2019/058970) dated Jan. 28, 2020.
(Continued)

*Primary Examiner* — Chuong A Luu
(74) *Attorney, Agent, or Firm* — Nixon Peabody LLP; Jeffrey L. Costellia

(57) ABSTRACT

A semiconductor device and the like with low power consumption are provided. In a semiconductor device including an electrostatic actuator group, an OS transistor and a capacitor are provided in each electrostatic actuator, and a power supply voltage supplied from the outside is boosted in each electrostatic actuator. The use of the OS transistor can retain the boosted voltage for a long period even after the supply of the power supply voltage is stopped. The use of the OS transistor can miniaturize the capacitor.

14 Claims, 39 Drawing Sheets

(51) Int. Cl.
*H01L 27/06* (2006.01)
*H01L 27/088* (2006.01)
*H02M 7/10* (2006.01)

(58) Field of Classification Search
CPC ............ H01L 27/1225; H01L 27/1255; H01L 27/1082; H01L 27/10838; H01L 27/10852; H01L 27/10805; H01L 27/10832; H01L 27/10867; H01L 27/10876; H01L 27/10855; H01L 27/10847; H01L 27/10858; H01L 27/0635; H01L 27/0711; H01L 27/0738; H01L 29/26; H01L 29/66; H01L 29/417; H01L 29/41725; H01L 29/41791; H01L 29/41741; H01L 29/78; H01L 29/7839; H01L 29/806; H01L 29/0843; H01L 29/0891; H01L 29/08291; H01L 29/66636; H01L 29/66643; H01L 29/66727; H01L 29/66696; H01L 21/8234; H01L 21/8238; H01L 21/823414; H01L 21/823425; H01L 21/823814
USPC ........................................................ 257/43
See application file for complete search history.

(56) References Cited

U.S. PATENT DOCUMENTS

| | | | |
|---|---|---|---|
| 7,956,349 | B2 | 6/2011 | Tsutsui et al. |
| 8,860,108 | B2 | 10/2014 | Yamazaki et al. |
| 10,199,592 | B2 | 2/2019 | Yamazaki et al. |
| 2009/0141204 | A1 | 6/2009 | Numao |
| 2009/0243498 | A1 | 10/2009 | Childs et al. |
| 2010/0109985 | A1 | 5/2010 | Ono |
| 2011/0074762 | A1 | 3/2011 | Shirasaki et al. |
| 2011/0316897 | A1 | 12/2011 | Teranishi |
| 2013/0082906 | A1 | 4/2013 | Toyomura et al. |
| 2013/0249883 | A1 | 9/2013 | Hwang |
| 2013/0292671 | A1 | 11/2013 | Yamazaki et al. |
| 2015/0138183 | A1 | 5/2015 | Kishi et al. |
| 2017/0110052 | A1 | 4/2017 | Kuo |
| 2017/0309856 | A1 | 10/2017 | Yamazaki et al. |
| 2018/0364531 | A1* | 12/2018 | Kimura ............... G02F 1/13624 |
| 2019/0348442 | A1* | 11/2019 | Umezaki ................ G09G 3/325 |
| 2019/0378859 | A1 | 12/2019 | Kawashima et al. |
| 2020/0234668 | A1* | 7/2020 | Umezaki .............. G11C 19/184 |
| 2020/0395486 | A1* | 12/2020 | Yamazaki ......... H01L 29/66969 |

FOREIGN PATENT DOCUMENTS

| | | |
|---|---|---|
| JP | 2011-119674 A | 6/2011 |
| WO | WO-2016/067154 | 5/2016 |
| WO | WO-2019/030595 | 2/2019 |
| WO | WO-2019/043483 | 3/2019 |
| WO | WO-2019/102315 | 5/2019 |

OTHER PUBLICATIONS

Written Opinion (Application No. PCT/IB2019/058970) dated Jan. 28, 2020.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and Its Transistor Characteristics", ECS Journal of Solid State Science and Technology, July 1,2 014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

FIG. 3A1
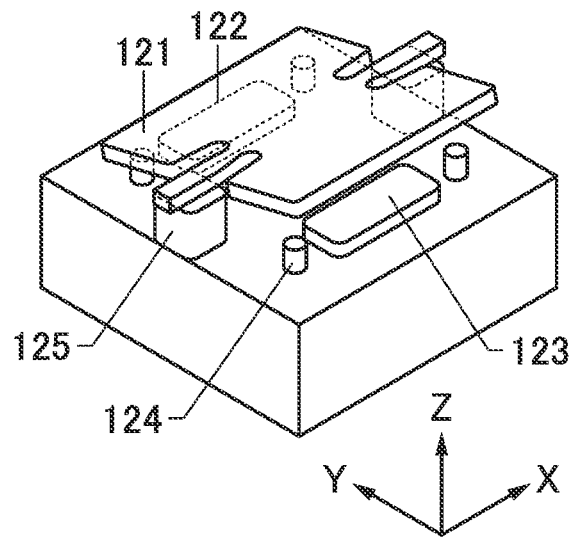
FIG. 3B1
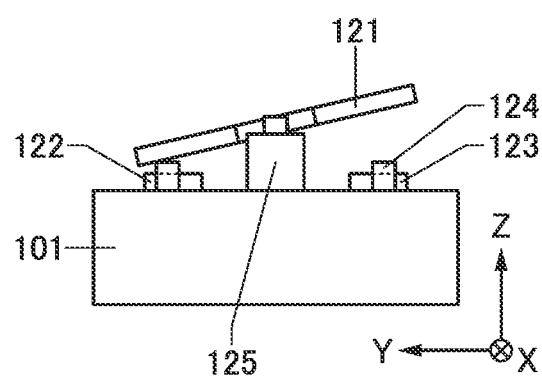
FIG. 3A2
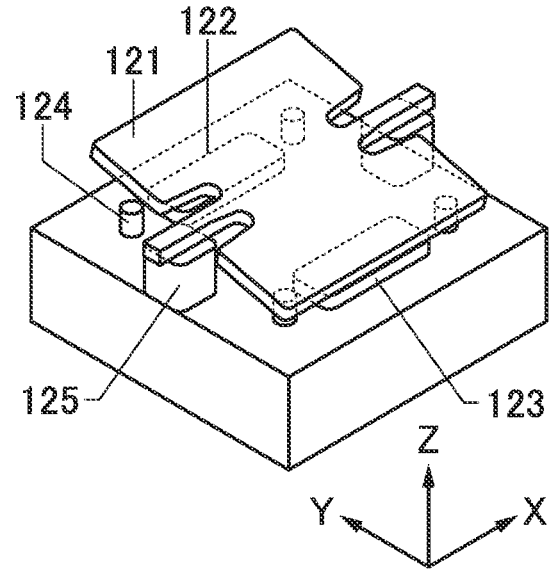
FIG. 3B2
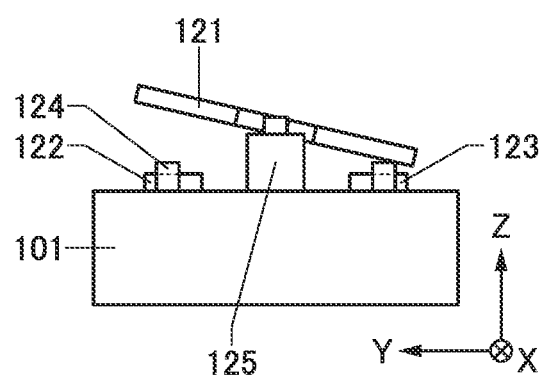

FIG. 6

SEMICONDUCTOR DEVICE AND ELECTRONIC DEVICE

TECHNICAL FIELD

One embodiment of the present invention relates to a semiconductor device. Alternatively, one embodiment of the present invention relates to a driving method of the semiconductor device.

Note that one embodiment of the present invention is not limited to the above technical field. For example, one embodiment of the present invention relates to an object, a method, or a manufacturing method. Alternatively, the present invention relates to a process, a machine, manufacture, or a composition (composition of matter). Alternatively, one embodiment of the present invention relates to a micromachine, a display element, a display device, or an electronic device.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like include a semiconductor element or a semiconductor circuit in some cases. Thus, a display device, a light-emitting device, a lighting device, an electro-optical device, an imaging device, an electronic device, and the like include a semiconductor device in some cases.

BACKGROUND ART

A micromachine is called MEMS (Micro Electro Mechanical System), MST (Micro System Technology), and the like and refers to a comprehensive system combining a mechanical microstructure and an electric circuit. The above-described microstructure is different from a general semiconductor element and has a three-dimensional structure, and part of the microstructure is movable in many cases. The micromachine can have various functions of a passive element such as a sensor, an actuator, an inductor, a motor, or a variable capacitor, a switch, an optical element, or the like.

Note that the electric circuit is generally formed using a semiconductor element and can control the operation of the microstructure, or receive and process a weak signal output from the microstructure.

Micromachines can be classified into groups according to their manufacturing methods. For example, there are bulk micromachines in which microstructures are manufactured using crystal anisotropy of a silicon substrate, and surface micromachines in which thin films are stacked over various substrates to manufacture three-dimensional microstructures (see Patent Document 1). In particular, surface micromachines have been attracting attention because a microstructure and an electric circuit can be formed over the same substrate.

Micromachines functioning as actuators can be classified into static electricity, piezoelectricity, electromagnetism, heat, and the like by a driving principle. In particular, micromachines functioning as electrostatic actuators can be manufactured by a standard semiconductor process, so that they are easily produced and have high reliability.

The electrostatic actuators can be classified into a parallel-plate-type, a cantilever type, a comb-shape type, a rotating type, and the like. A display device using a DMD (Digital Micromirror Device) is known as an example of a parallel-plate-type electrostatic actuator. A display device using a DMD uses a polarizing plate or a color filter and thus has high light use efficiency. Therefore, it is said that a display device using a DMD can display a high-quality image with high contrast.

In addition, a voltage higher than or equal to 10 V is required to drive an electrostatic actuator in some cases. Meanwhile, a power supply voltage of the electric circuit is approximately several volts in many cases. Thus, to drive a micromachine, a plurality of power supply devices with different supply voltages need to be provided.

Patent Document 2 discloses a structure in which a voltage for driving an electric circuit is increased to be a voltage for driving an electrostatic actuator by using a Cockcroft-Walton power source circuit for a structure of a power supply device. The voltage boosted in the Cockcroft-Walton power source circuit is supplied to the whole of the electrostatic actuator group through a buffer capacitor or the like.

REFERENCE

Patent Document

[Patent Document 1] Japanese Published Patent Application No. 2000-208018

[Patent Document 2] Japanese Published Patent Application No. 2004-112944

SUMMARY OF THE INVENTION

Problems to be Solved by the Invention

In the structure disclosed in Patent Document 2, the voltage boosted in the Cockcroft-Walton power source circuit is likely to be changed in accordance with operation of the electrostatic actuator group, and thus it is difficult to stabilize the power supply voltage. When the buffer capacitor is made large to stabilize the power supply voltage, the area occupied by the power source circuit is increased and power consumption is also increased. Patent Document 2 discloses the usage of a mechanical relay switch such as a thermal relay or an electrostatic relay or a semiconductor diode as a switch included in the Cockcroft-Walton power source circuit. However, the mechanical relay switch has problems in that the operating speed is slow, the size is difficult to be reduced, and it tends to be a noise source. In the case where the semiconductor diode is used, there is a problem in that the power consumption tends to be increased due to a leakage current or the like at the time of applying a reverse voltage.

An object of one embodiment of the present invention is to provide a semiconductor device, a micromachine, a display element, a display device, an electronic device, or the like with low power consumption. Another object is to provide a semiconductor device, a micromachine, a display element, a display device, an electronic device, or the like with stable operation. Another object is to provide a semiconductor device, a micromachine, a display element, a display device, an electronic device, or the like with favorable reliability.

Another object of one embodiment of the present invention is to provide a semiconductor device, a display device, an electronic device, or the like with favorable display quality. Another object of one embodiment of the present invention is to provide a semiconductor device, a micromachine, a display element, a display device, an electronic device, or the like with favorable productivity. Another object of one embodiment of the present invention is to provide a novel semiconductor device, a novel micromachine, a novel display element, a novel display device, a novel electronic device, or the like.

Note that the description of these objects does not preclude the existence of other objects. One embodiment of the present invention does not have to achieve all these objects. Objects other than these are apparent from the description of the specification, the drawings, the claims, and the like, and objects other than these can be derived from the description of the specification, the drawings, the claims, and the like.

Means for Solving the Problems

In a semiconductor device including an electrostatic actuator group, a transistor using an oxide semiconductor, which is one kind of metal oxide, in a semiconductor layer where a channel is formed (also referred to as an "OS transistor") and a capacitor are provided, and a power supply voltage supplied from the outside is boosted in each electrostatic actuator. The use of an OS transistor can retain the boosted voltage for a long period even after stopping the supply of the power supply voltage. The use of an OS transistor can miniaturize the capacitor.

One embodiment of the present invention is a semiconductor device including first to fourth transistors, a first capacitor, a second capacitor, first to third electrodes, and first to sixth wirings, where one of a source and a drain of the first transistor is electrically connected to the first wiring, the other of the source and the drain of the first transistor is electrically connected to one electrode of the first capacitor and the first electrode, a gate of the first transistor is electrically connected to the fifth wiring, one of a source and a drain of the second transistor is electrically connected to the second wiring, the other of the source and the drain of the second transistor is electrically connected to the other electrode of the first capacitor, a gate of the second transistor is electrically connected to the sixth wiring, one of a source and a drain of the third transistor is electrically connected to the third wiring, the other of the source and the drain of the third transistor is electrically connected to one electrode of the second capacitor and the second electrode, a gate of the third transistor is electrically connected to the fifth wiring, one of a source and a drain of the fourth transistor is electrically connected to the fourth wiring, the other of the source and the drain of the fourth transistor is electrically connected to the other electrode of the second capacitor, a gate of the fourth transistor is electrically connected to the sixth wiring, semiconductor layers of the first to the fourth transistors each include an oxide semiconductor, and the third electrode has a function of tilting in accordance with potentials of the first electrode and the second electrode.

Another embodiment of the present invention is a semiconductor device including first to fourth transistors, a first capacitor, a second capacitor, first to third electrodes, and first to sixth wirings, where one of a source and a drain of the first transistor is electrically connected to the first wiring, the other of the source and the drain of the first transistor is electrically connected to one electrode of the first capacitor and the first electrode, a gate of the first transistor is electrically connected to the fifth wiring, one of a source and a drain of the second transistor is electrically connected to the second wiring, the other of the source and the drain of the second transistor is electrically connected to the other electrode of the first capacitor, a gate of the second transistor is electrically connected to the sixth wiring, one of a source and a drain of the third transistor is electrically connected to the third wiring, the other of the source and the drain of the third transistor is electrically connected to one electrode of the second capacitor and the second electrode, a gate of the third transistor is electrically connected to the fifth wiring, one of a source and a drain of the fourth transistor is electrically connected to the fourth wiring, the other of the source and the drain of the fourth transistor is electrically connected to the other electrode of the second capacitor, a gate of the fourth transistor is electrically connected to the sixth wiring, semiconductor layers of the first to the fourth transistors each include an oxide semiconductor, a distance between the first electrode and the third electrode changes in accordance with a potential of the first electrode, and a distance between the second electrode and the third electrode changes in accordance with a potential of the second electrode.

The first to the fourth transistors may each have a back gate. The oxide semiconductor preferably contains one or both of indium and zinc. The first electrode and the second electrode function as fixed electrodes. The third electrode functions as a movable electrode. The third electrode preferably has a visible light reflectivity of higher than or equal to 70% and lower than or equal to 100%.

Effect of the Invention

According to one embodiment of the present invention, a semiconductor device, a micromachine, a display element, a display device, an electronic device, or the like with low power consumption can be provided. Alternatively, a semiconductor device, a micromachine, a display element, a display device, an electronic device, or the like with stable operation can be provided. Alternatively, a semiconductor device, a micromachine, a display element, a display device, an electronic device, or the like with favorable reliability can be provided.

Alternatively, according to one embodiment of the present invention, a semiconductor device, a display device, an electronic device, or the like with favorable display quality can be provided. Alternatively, according to one embodiment of the present invention, a semiconductor device, a micromachine, a display element, a display device, an electronic device, or the like with favorable productivity can be provided. Alternatively, according to one embodiment of the present invention, a novel semiconductor device, a novel micromachine, a novel display element, a novel display device, a novel electronic device, or the like can be provided.

Note that the description of these effects does not preclude the existence of other effects. One embodiment of the present invention does not have to achieve all these effects. Effects other than these are apparent from the description of the specification, the drawings, the claims, and the like, and effects other than these can be derived from the description of the specification, the drawings, the claims, and the like.

BRIEF DESCRIPTION OF THE DRAWINGS

FIG. 3A1, FIG. 3A2, FIG. 3B1, and FIG. 3B2 are cross-sectional views illustrating one embodiment of a micromachine.

FIG. 6 is a timing chart showing operation of a micromachine.

FIG. 7A and FIG. 78 are views illustrating operation states of a micromachine.

MODE FOR CARRYING OUT THE INVENTION

Figure 1A:
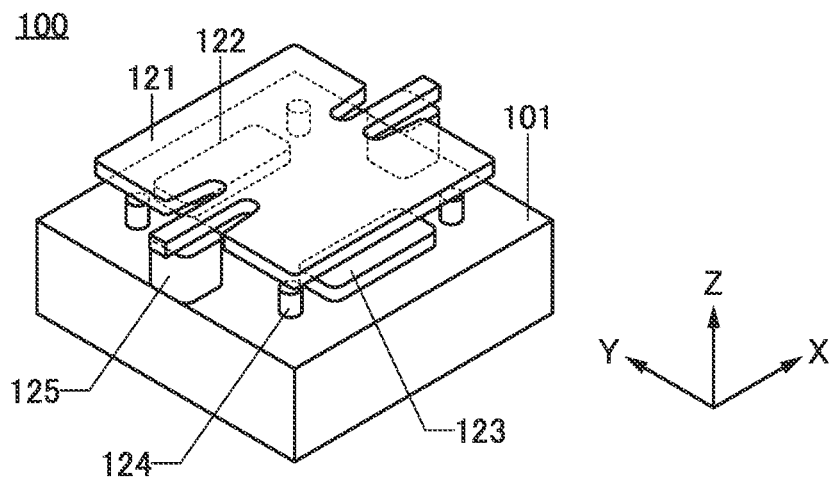
FIG. 1A and FIG. 1B are perspective views illustrating one embodiment of a micromachine.

Embodiments will be described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the present invention described below, the same portions or portions having similar functions are denoted by the same reference numerals in different drawings, and description thereof is not repeated.

The position, size, range, and the like of each component illustrated in the drawings and the like are not accurately represented in some cases to facilitate understanding of the invention. Therefore, the disclosed invention is not necessarily limited to the position, size, range, or the like disclosed in drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might be omitted for easy understanding of the drawings.

In this specification and the like, the term such as "electrode" or "wiring" does not limit the function of a component. For example, an "electrode" is used as part of a "wiring" in some cases, and vice versa. Furthermore, the term "electrode" or "wiring" can also mean the case where a plurality of "electrodes" or "wirings" are formed in an integrated manner.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

Furthermore, functions of a source and a drain are interchanged with each other depending on operation conditions, for example, when a transistor of different polarity is employed or when the direction of current flow is changed in circuit operation; therefore, it is difficult to define which is the source or the drain. Thus, the terms a source and a drain are interchangeable for use in this specification.

In this specification and the like, "electrically connected" includes the case where connection is made through an "object having any electric function". Here, there is no particular limitation on the "object having any electric function" as long as electric signals can be transmitted and received between components that are connected through the object. Accordingly, even when the expression "being electrically connected" is used, there is a case in which no physical connection portion is made and a wiring is just extended in an actual circuit.

In this specification and the like, "parallel" indicates a state where two straight lines are placed at an angle of greater than or equal to −10° and less than or equal to 100, for example. Accordingly, the case where the angle is greater than or equal to −5° and less than or equal to 5° is also included. Furthermore, "perpendicular" and "orthogonal" indicate a state where two straight lines are placed at an angle of greater than or equal to 800 and less than or equal to 1000, for example. Accordingly, the case where the angle is greater than or equal to 850 and less than or equal to 950 is also included.

In this specification and the like, the terms "identical", "same", "equal", "uniform", and the like used in describing calculation values and measurement values allow for a margin of error of ±20% unless otherwise specified.

Furthermore, in this specification, in the case where an etching treatment is performed after a resist mask is formed, the resist mask is removed after the etching treatment, unless otherwise specified.

A voltage refers to a potential difference between a given potential and a reference potential (e.g., a ground potential or a source potential) in many cases. Thus, a voltage can be replaced with a potential.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In this specification and the like, in some cases, "on-state current" means a current that flows between a source and a drain when a transistor is in an on state. Furthermore, in some cases, "off-state current" means a current that flows between a source and a drain when a transistor is in an off state.

In this specification and the like, a high power supply potential VDD (hereinafter also simply referred to as "VDD" or an "H potential") is a power supply potential higher than a low power supply potential VSS. The low power supply potential VSS (hereinafter also simply referred to as "VSS" or an "L potential") is a power supply potential lower than the high power supply potential VDD. In addition, a ground potential can be used as VDD or VSS. For example, in the case where VDD is a ground potential, VSS is a potential lower than the ground potential, and in the case where VSS is a ground potential, VDD is a potential higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Embodiment 1

Examples of a micromachine 100 will be described with reference to FIG. 1 to FIG. 11. Note that in this specification and the like, an example of a parallel plate type electrostatic actuator is described as the micromachine 100.

<Structure of Micromachine 100>

Figure 1B:
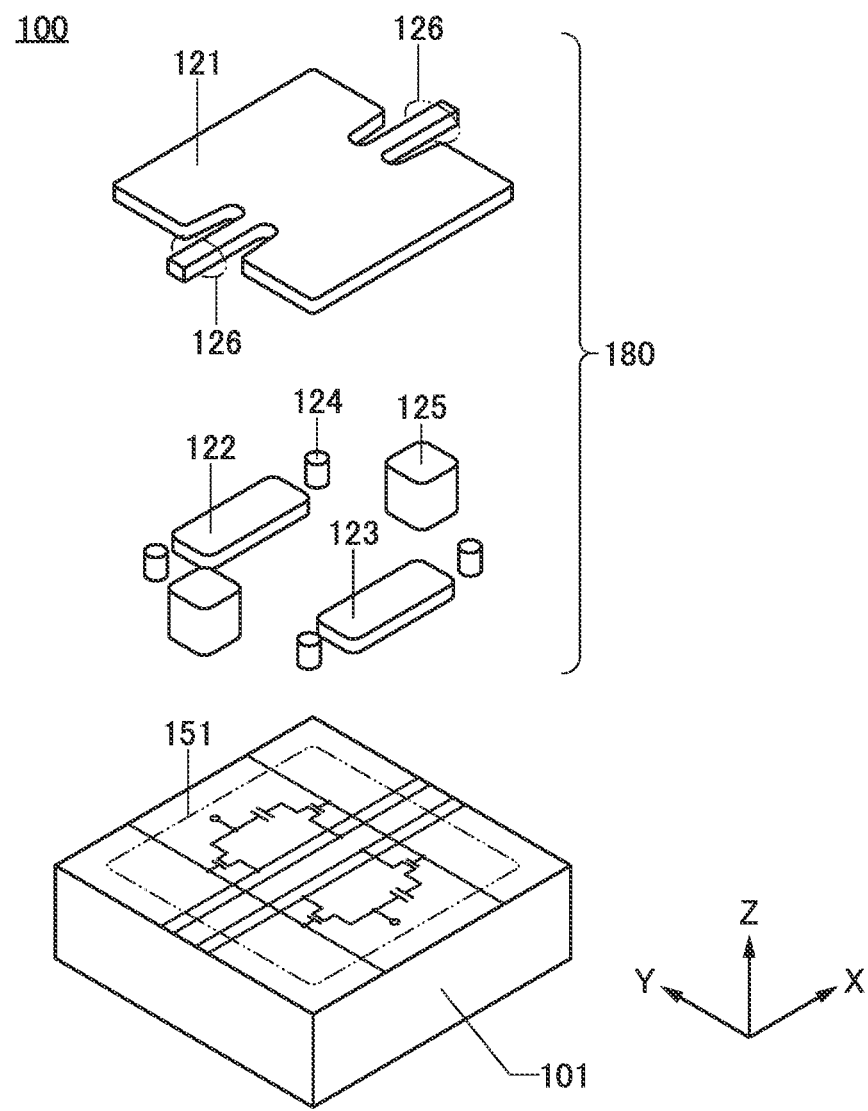
Figure 2A:
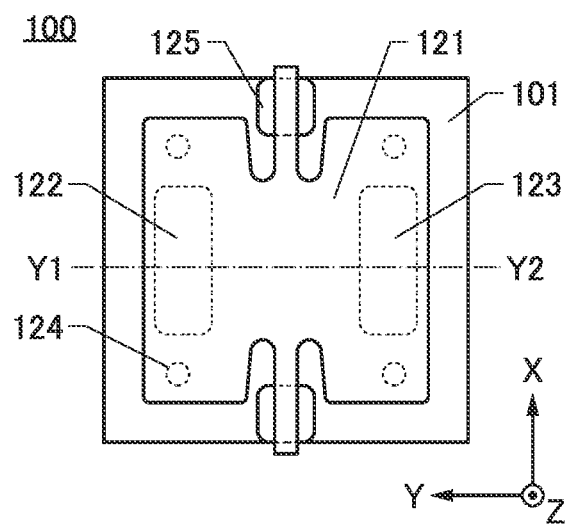
FIG. 2A, FIG. 2B, and FIG. 2C are a top view and side views illustrating one embodiment of a micromachine.
Figure 2C:
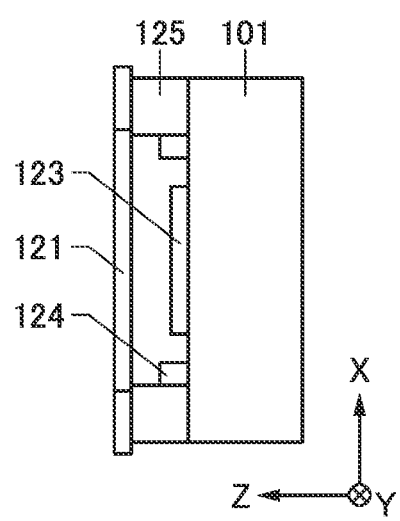
Figure 2B:
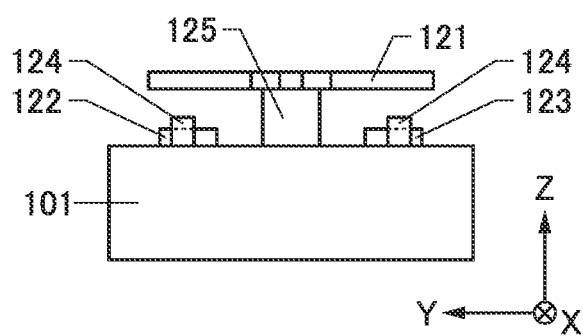

FIG. 1A and FIG. 1B are perspective views for illustrating an example of the micromachine 100. Note that arrows indicating the X-axis direction, the Y-axis direction, and the Z-axis direction are illustrated in FIG. 1A. The X-axis direction, the Y-axis direction, and the Z-axis direction are directions orthogonal to each other. FIG. 2A is a top view of the micromachine 100. FIG. 2B is a side view of the micromachine 100 seen from the X-axis direction. FIG. 2C is a side view of the micromachine 100 seen from the Y-axis direction.

The micromachine 100 described as an example in this embodiment includes a structure body 180 including an electrode 121, an electrode 122, an electrode 123, supports 125, and stoppers 124, and a substrate 101 provided with a circuit 151. The electrode 122, the electrode 123, the supports 125, and the stoppers 124 are provided over the substrate 101. The electrode 121 includes support portions 126 that extend in directions opposite to each other along the X-axis direction around the center in the Y-axis direction. The micromachine 100 described as an example in this embodiment includes two supports 125 over the substrate 101. The two supports 125 are connected to the different support portions 126. The supports 125 each have conductivity and a function of supplying a potential to the electrode 121.

As a conductive material for forming the electrode 121, the electrode 122, the electrode 123, and the supports 125 included in the structure body 180, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing one or more of the above metal elements; or the like can be used. Alternatively, a semiconductor having high electrical conductivity or the like can be used in some cases.

The electrode 121 has a function of reflecting light and can function as a reflective electrode. Thus, the electrode 121 preferably has reflectance of the electrode 121 with respect to a visible light (light having a wavelength of greater than or equal to 400 nm and less than or equal to 800 nm) is preferably higher than or equal to 70% and lower than or equal to 100%, more preferably higher than or equal to 80% and lower than or equal to 100%, further preferably higher than or equal to 90% and lower than or equal to 100%.

The structure body 180 can be manufactured by a method using a sacrificial layer or the like. The sacrificial layer can be formed using an organic resin, such as polyimide or acrylic, or an inorganic insulating film, such as silicon oxide, silicon nitride, silicon oxynitride, or silicon nitride oxide. For example, the sacrificial layer is removed after the electrode 121 is formed over the electrode 122 and the electrode 123, whereby the structure body 180 can be manufactured. An insulating layer containing alumina, silicon oxide, silicon nitride, silicon oxynitride, silicon nitride oxide, DLC (Diamond-Like Carbon), or the like is preferably formed on a surface of the electrode 121, in which case deterioration of the structure body 180 over time can be reduced, <Operation of Micromachine 100>

Next, an operation example of the micromachine 100 and the circuit 151 exemplified in this embodiment will be described with reference to the drawings. An L potential is supplied to the electrode 121 through the supports 125. The electrode 121 has a function of tilting to the electrode 122 side or the electrode 123 side using connection portions between the electrode 121 and the supports 125 as an axis.

Although in this embodiment, the operation example of the micromachine 100 will be described on the assumption that the L potential is supplied to the electrode 121, the potential supplied to the electrode 121 may be an H potential.

The electrode 121 tilts to the electrode 121 or the electrode 122 which has a lager potential difference with the electrode 121. For example, when the electrode 121 and the electrode 123 have the same potential and a potential difference is generated between the electrode 121 and the electrode 122, the electrode 121 is drawn to the electrode 122 by electrostatic force (Coulomb force). A potential difference for making the electrode 121 move is determined mainly by mechanical strength of the electrode 121, In this embodiment, in the case where the potential difference between the electrode 121 and the electrode 122 is larger than a potential difference generated between the H potential and the L potential when the electrode 121 and the electrode 123 have the same potential (L potential), the electrode 121 tilts to the electrode 122 side.

When the L potential is supplied to the electrode 123 and a potential higher than the H potential is supplied to the electrode 122, the electrode 121 is drawn to the electrode 122 by electrostatic force (Coulomb force) and then tilts to the electrode 122 side. FIG. 3A1 illustrates a perspective view of the micromachine 100 in a state where the electrode 121 tilts to the electrode 122 side. FIG. 3131 illustrates a view of the micromachine 100 seen from the X-axis direction in a state where the electrode 121 tilts to the electrode 122 side.

The electrode 121 drawn and tilts to the electrode 122 until the electrode 121 contacts to the stoppers 124. The stoppers 124 can prevent a phenomenon (pull-in effect) in which the electrode 122 and the electrode 121 are in contact with each other and do not separate from each other.

When the L potential is supplied to the electrode 122 and a potential higher than the H potential is supplied to the electrode 123, the electrode 121 is drawn to the electrode 123 by electrostatic force (Coulomb force) and then tilts to the electrode 123 side. FIG. 3A2 illustrates a perspective view of the micromachine 100 in a state where the electrode 121 tilts to the electrode 123 side. FIG. 3B2 illustrates a view of the micromachine 100 seen from the X-axis direction in a state where the electrode 121 tilts to the electrode 123 side.

The electrode 121 drawn and tilts to the electrode 123 until the electrode 121 contacts to the stoppers 124. The stoppers 124 can prevent a phenomenon in which the electrode 123 and the electrode 121 are in contact with each other and do not separate from each other.

In this manner, the electrode 121 functions as a movable electrode. The electrode 122 and the electrode 123 each function as a fixed electrode.

[Structure of Circuit 151]

Figure 4:
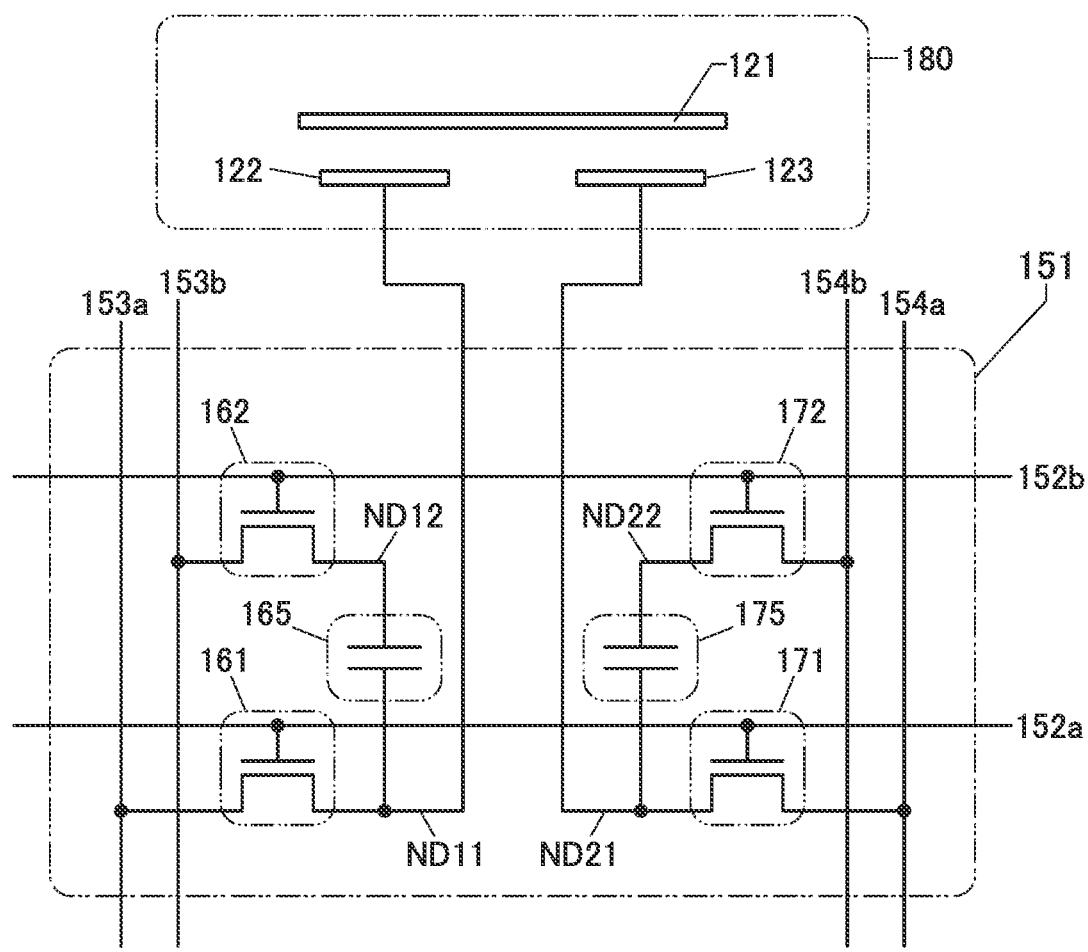
FIG. 4 is a circuit diagram of a micromachine.

FIG. 4 illustrates a circuit diagram of the micromachine 100 including the circuit 151. Note that in FIG. 4, the electrode 121, the electrode 122, and the electrode 123 included in the structure body 180 are denoted. The circuit 151 includes a transistor 161, a transistor 162, a capacitor 165, a transistor 171, a transistor 172, and a capacitor 175.

One of a source and a drain of the transistor 161 is electrically connected to a wiring 153a, and the other is electrically connected to one electrode of the capacitor 165 and the electrode 122. A node to which the other of the source and the drain of the transistor 161, the one electrode of the capacitor 165, and the electrode 122 are electrically connected is called a node ND11. One of a source and a drain of the transistor 162 is electrically connected to a wiring 153b, and the other is electrically connected to the other electrode of the capacitor 165. A node to which the other of the source and the drain of the transistor 162 and the other electrode of the capacitor 165 are electrically connected is called a node ND12.

One of a source and a drain of the transistor 171 is electrically connected to a wiring 154a, and the other is electrically connected to one electrode of the capacitor 175 and the electrode 123. Anode to which the other of the source and the drain of the transistor 171, the one electrode of the capacitor 175, and the electrode 123 are electrically connected is called a node ND21. One of a source and a drain of the transistor 172 is electrically connected to a wiring 154b, and the other is electrically connected to the other electrode of the capacitor 175. A node to which the other of the source and the drain of the transistor 172 and the other electrode of the capacitor 175 are electrically connected is called a node ND22.

A gate of the transistor 161 and a gate of the transistor 171 are electrically connected to a wiring 152a, and a gate of the transistor 162 and a gate of the transistor 172 are electrically connected to a wiring 152b.

It is preferable to use OS transistors as the transistor 161, the transistor 162, the transistor 171, and the transistor 172. An OS transistor can have an extremely low off-state current. Specifically, the off-state current per micrometer of channel width at room temperature can be lower than $1\times10^{-21}$ A, preferably lower than $1\times10^{-22}$ A, more preferably lower than $1\times10^{-24}$ A.

When OS transistors are used as the transistor 161, the transistor 162, the transistor 171, and the transistor 172, the capacitor 165 and the capacitor 175 can be small. Alternatively, parasitic capacitance of the transistor or the like can be used as substitutes for the capacitor 165 and the capacitor 175 without providing the capacitor 165 and the capacitor 175. As a result, the area occupied by the micromachine 100 can be reduced. For example, high resolution of a display element using the micromachine 100 can be easily achieved, so that the display quality of the display device using the display element can be favorable.

The off-state current of an OS transistor is less likely to increase in a high-temperature environment (e.g., in an environment of higher than or equal to 50° C. and lower than or equal to 150° C.). Thus, even in a high-temperature environment, the potential (charge) supplied to the node ND11, the node ND12, the node ND21, and the node ND22 can be retained for a long period. An OS transistor has high withstand voltage between its source and drain. With the use of an OS transistor, a micromachine or the like with high reliability can be provided. A semiconductor device or the like with high reliability can be provided.

Figure 5:
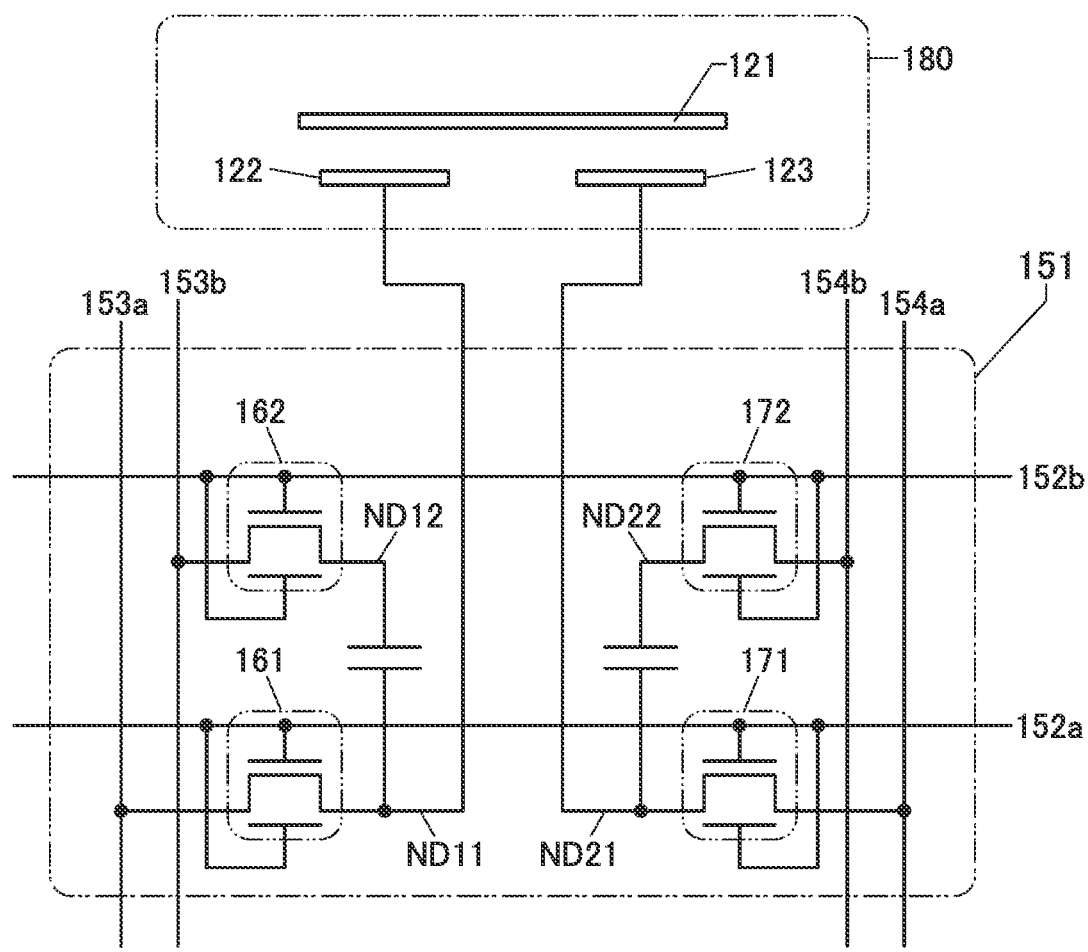
FIG. 5 is a circuit diagram of a micromachine.

As illustrated in FIG. 5, the transistor 161, the transistor 162, the transistor 171, and the transistor 172 may be transistors each including a back gate. In FIG. 5, the back gates of the transistor 161 and the transistor 171 are electrically connected to the wiring 152a. The back gates of the transistor 162 and the transistor 172 are electrically connected to the wiring 152b.

Note that in FIG. 5, although the potential of the back gate becomes equal to the potential of the gate, the potential of the back gate may be different from that of the gate. The potential of the back gate may be a ground potential (GND potential) or a given potential.

The back gate is placed such that a channel formation region of a semiconductor layer is sandwiched between the gate and the back gate. A back gate electrode is formed using a conductive layer and can function in a manner similar to that of the gate electrode. By changing the potential of the back gate, the threshold voltage of the transistor can be changed.

In addition, the gate and the back gate are formed using conductive layers and thus each have a function of preventing an electric field generated outside the transistor from influencing the semiconductor layer in which a channel is formed (particularly, a function of preventing static electricity). That is, the variation in the electrical characteristics of the transistor due to the influence of an external electric field such as static electricity can be prevented.

[Operation of Circuit 151]

Figure 6:
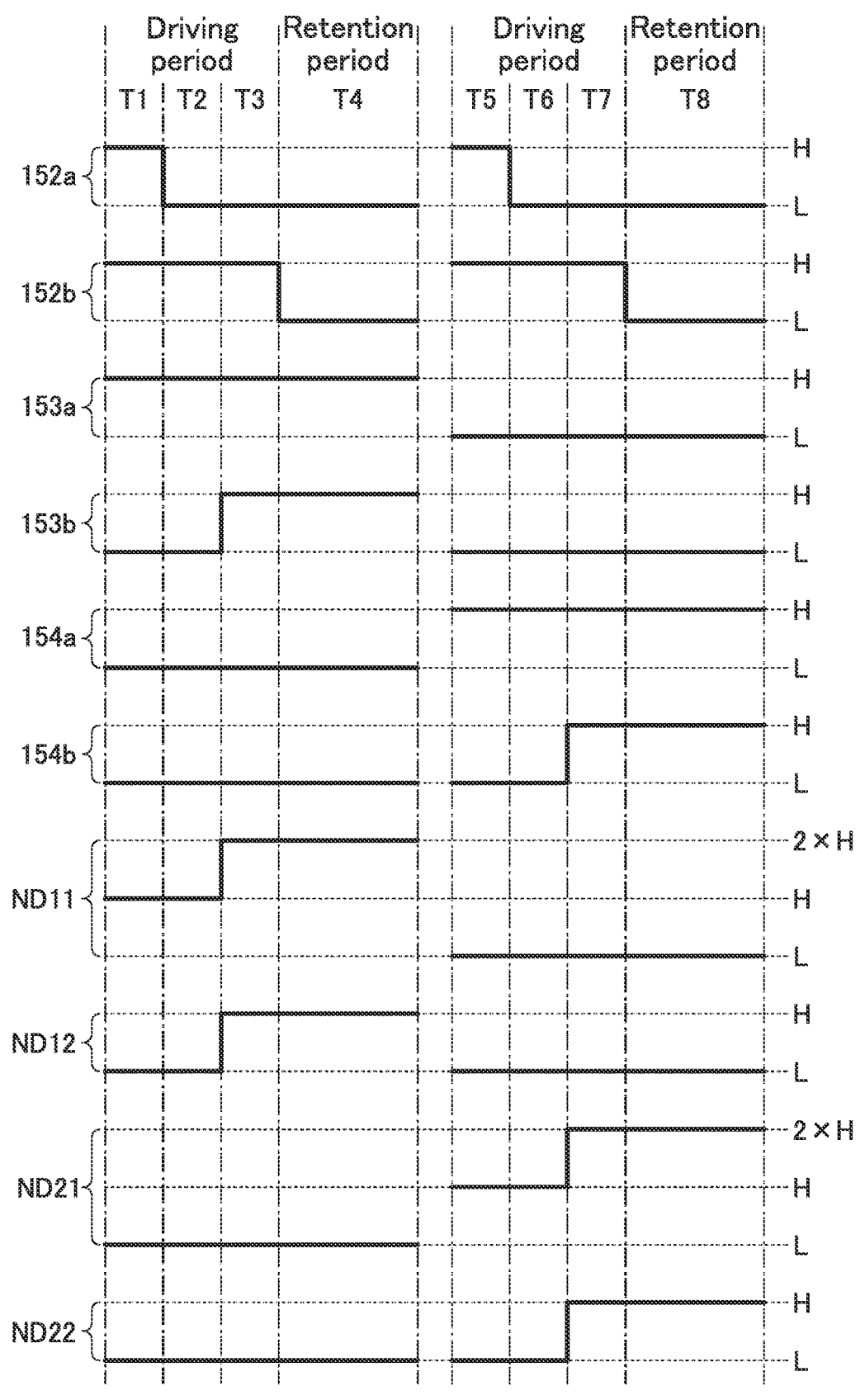

Operation of the micromachine 100 including the circuit 151 will be described with reference to FIG. 6 to FIG. 10. FIG. 6 is a timing chart showing the operation of the micromachine 100 including the circuit 151. FIG. 7 to FIG. 10 are views illustrating states of the micromachine 100 including the circuit 151 in particular operation periods.

In the drawings and the like, for easy understanding of the potentials of a wiring and an electrode, "H" indicating an H potential or "L" indicating an L potential is sometimes written near the wiring and the electrode. In addition, a wiring and an electrode whose potentials change are written by enclosed "H" or "L" in some cases. Moreover, a symbol "x" is sometimes written on a transistor in an off state.

First, the L potential is supplied to the electrode 121, the wiring 153b, the wiring 154a, and the wiring 154b, and the H potential is supplied to the wiring 153a.

[Period T1]

Figure 7A:
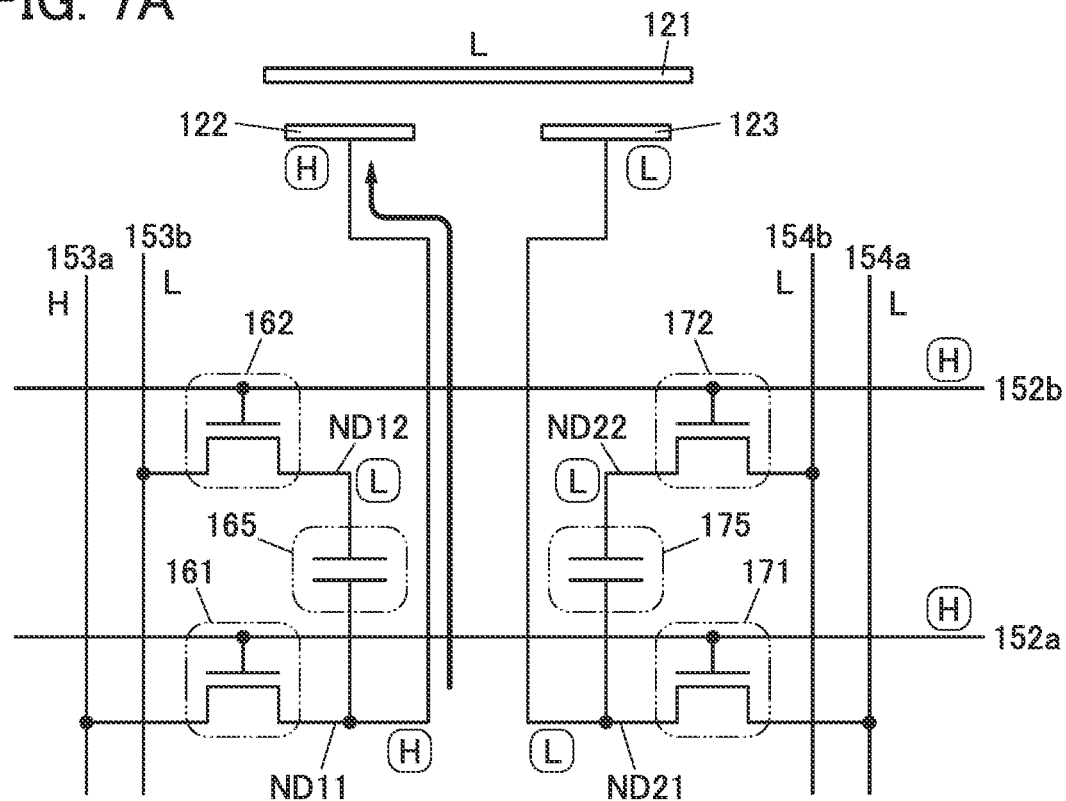

In a period T1, the H potential is supplied to the wiring 152a and the wiring 152b (see FIG. 7A). Then, the transistor 161 is turned on, and the H potential is supplied to the node ND11 through the wiring 153a. The transistor 171 is turned on, and the L potential is supplied to the node ND21 through the wiring 154a. The transistor 162 is turned on, and the L potential is supplied to the node ND12 through the wiring 153b. The transistor 172 is turned on, and the L potential is supplied to the node ND22 through the wiring 154b.

[Period T2]

Figure 7B:
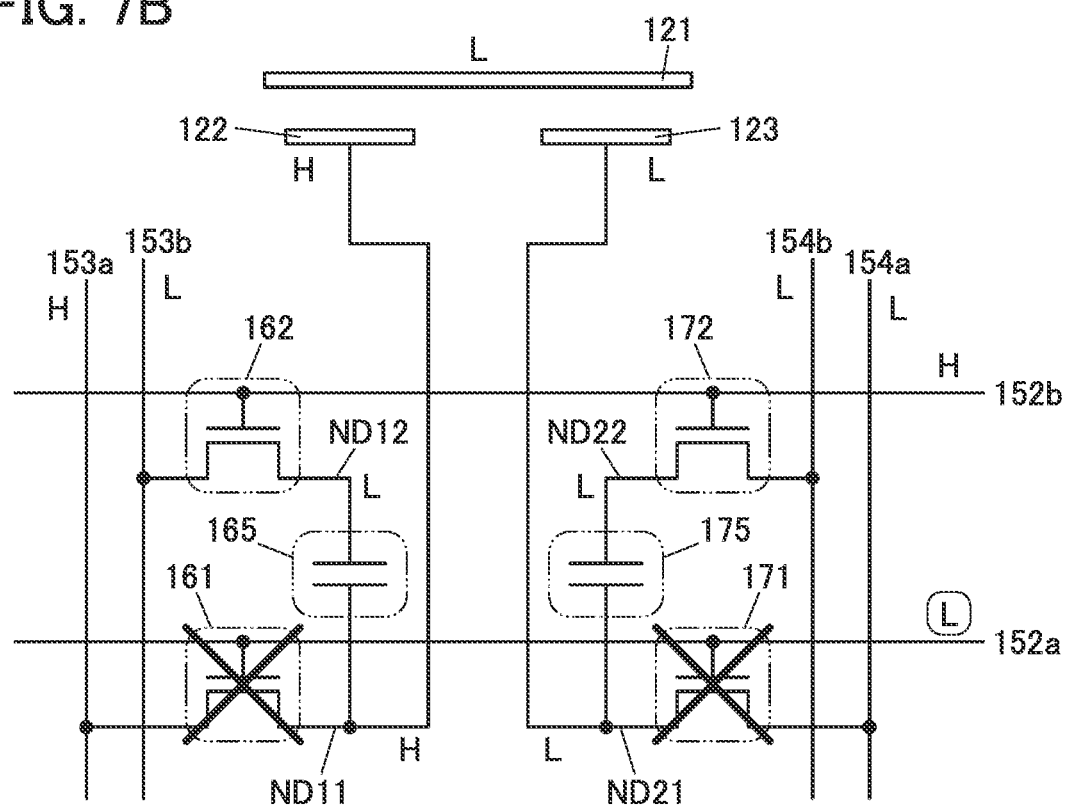

In a period T2, the L potential is supplied to the wiring 152a (see FIG. 7B). Then, the transistor 161 is turned off, and the charge supplied to the node ND11 is retained. More accurately, the amount of the charge that makes the potential of the node ND11 be the H potential is retained in the node ND11. Similarly, the transistor 171 is turned off, and the potential of the node ND21 is retained. More accurately, the amount of the charge that makes the potential of the node ND21 be the L potential is retained in the node ND21. When the transistor 161 and the transistor 171 are brought into an off state, the node ND11 and the node ND21 are brought into an electrically floating state (floating state).

The use of an OS transistor as the transistor 161 enables the charge of the node ND11 to be retained for a long period. The use of an OS transistor as the transistor 171 enables the charge of the node ND21 to be retained for a long period. Thus, the power consumption of the micromachine 100 can be reduced. Furthermore, the operation of the micromachine 100 can be stabilized, leading to an increase in the reliability of the micromachine 100.

[Period T3]

Figure 8A:
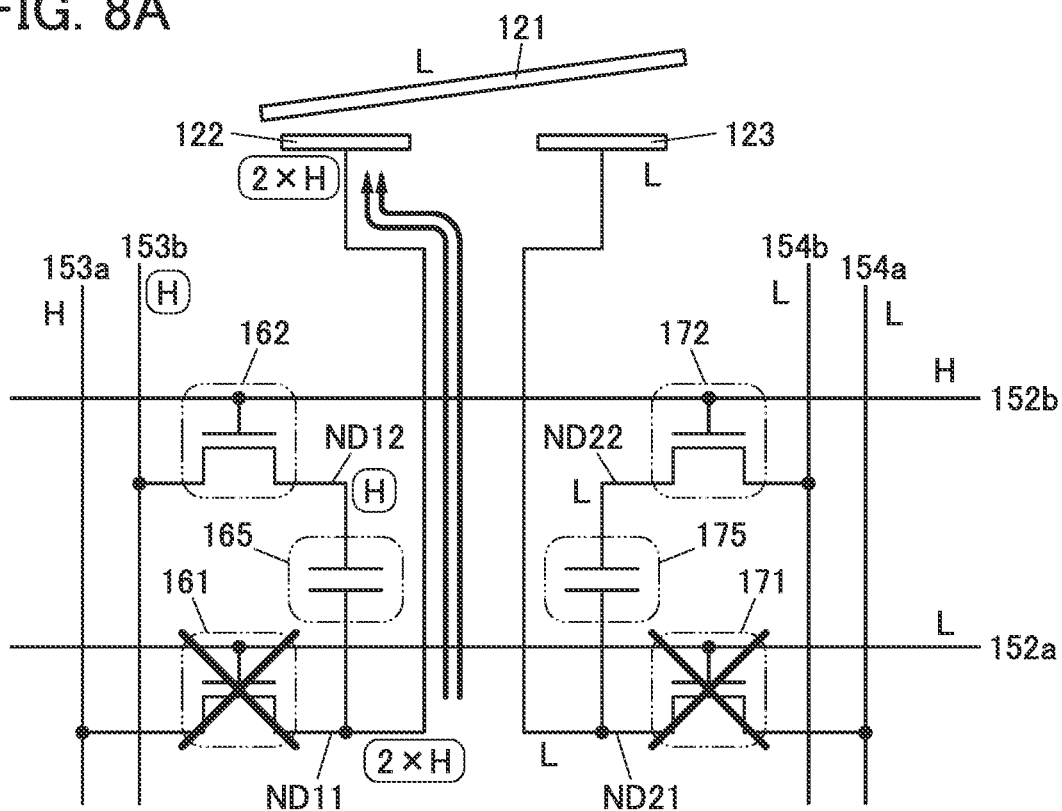
FIG. 8A and FIG. 8B are views illustrating operation states of a micromachine.

In a period T3, the H potential is supplied to the wiring 153b (see FIG. 8A). Since the transistor 162 is in an on state, the potential of the node ND12 increases from the L potential to the H potential. The node ND11 is in a floating state, and the node ND11 is capacitively coupled to the node ND12 by the capacitor 165. Accordingly, when the potential of the node ND12 increases from the L potential to the H potential, the potential of the node ND11 also increases in proportion to the potential change of the node ND12. That is, the potential of the node ND11 becomes a potential that is twice as high as the H potential (2× H potential). As a result, the potential of the electrode 122 also becomes twice as high as the H potential.

The 2× H potential is supplied to the electrode 122, whereby the electrode 121 is drawn to the electrode 122 by Coulomb force and then tilts to the electrode 122 side. The period T1 to the period T3 can be referred to as a driving period of the micromachine 100.

[Period T4]

Figure 8B:
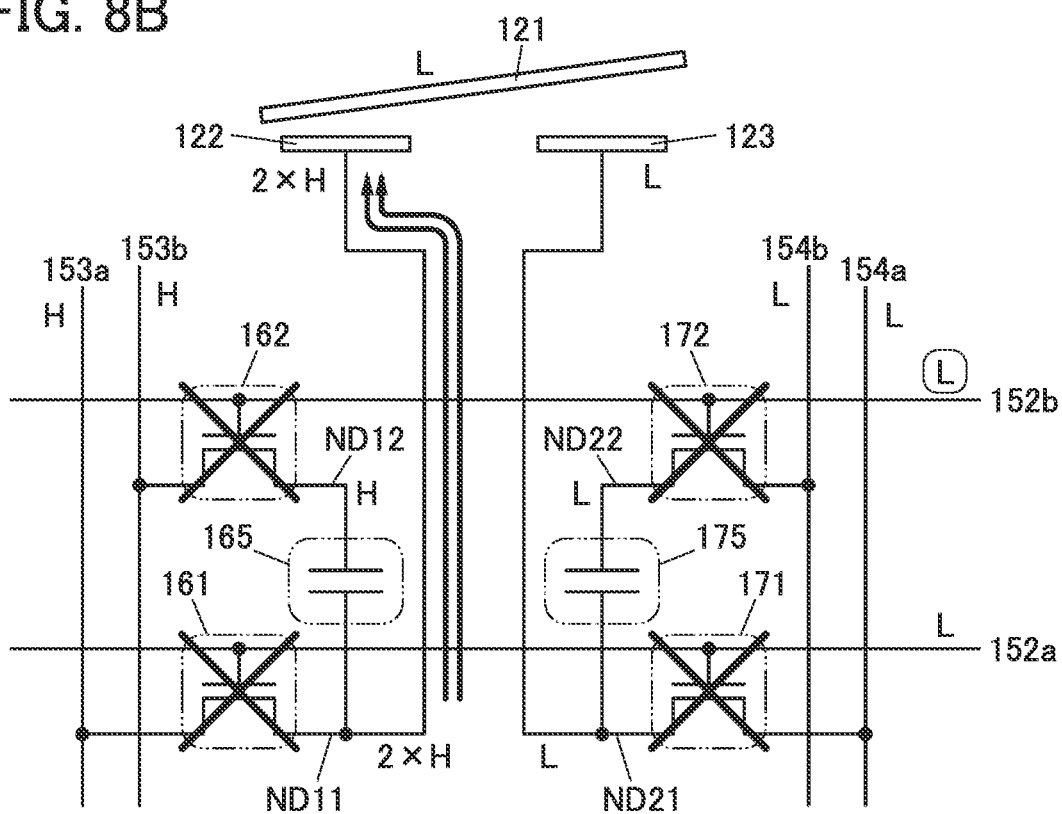

In a period T4, the L potential is supplied to the wiring 152b (see FIG. 8B). Then, the transistor 162 is turned off, and the charge of the node ND12 is retained. Similarly, the transistor 172 is turned off, and the charge of the node ND22 is retained. The period T4 can be referred to as a retention period of the micromachine 100.

[Period T5]

Figure 9A:
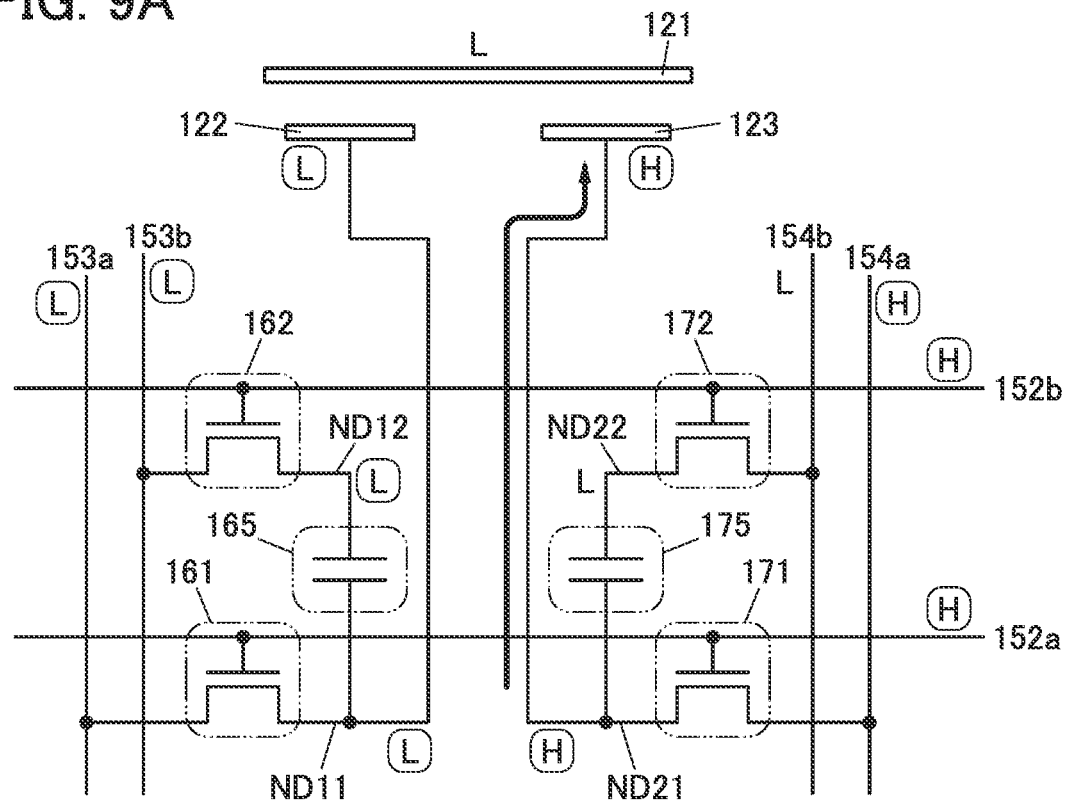
FIG. 9A and FIG. 9B are views illustrating operation states of a micromachine.
Figure 9B:
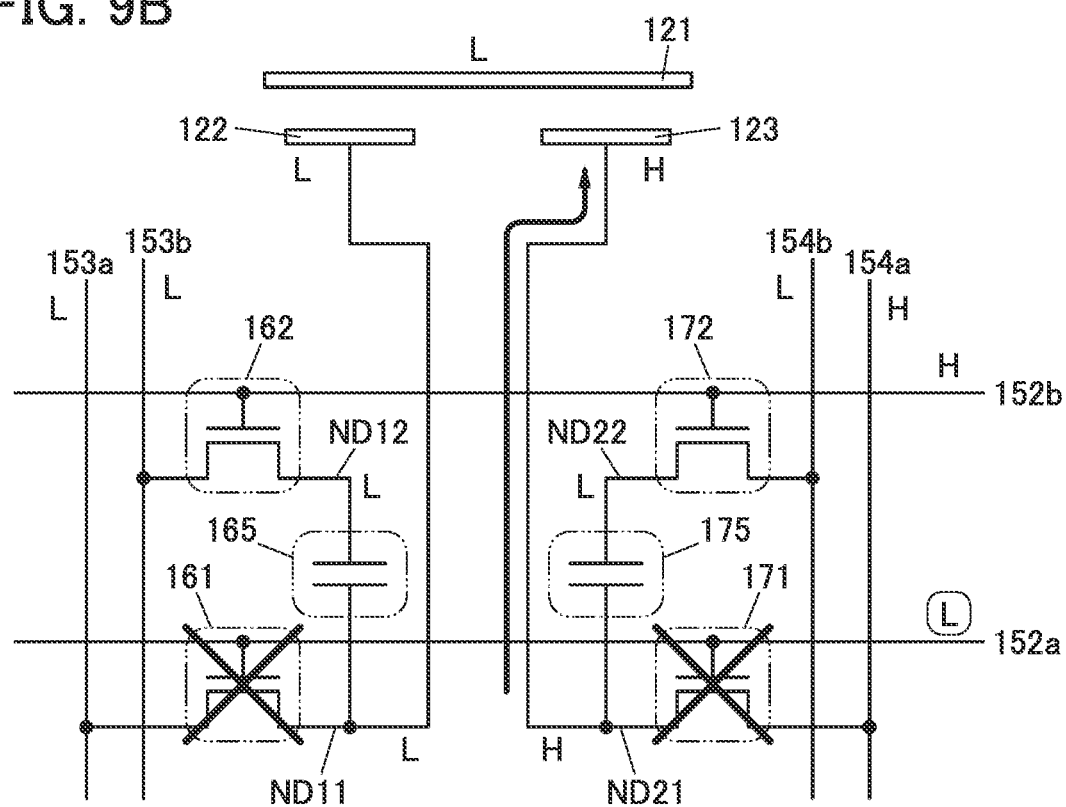

In a period T5, the L potential is supplied to the wiring 153a and the wiring 153b, and the H potential is supplied to the wiring 154a, the wiring 152a, and the wiring 152b (see FIG. 9A). Then, the transistor 161 is turned on, and the L potential is supplied to the node ND11 through the wiring 153a. Thus, the potential of the electrode 122 becomes the L potential.

The transistor 171 is turned on, and the H potential is supplied to the node ND21 through the wiring 154a. The transistor 162 is turned on, and the L potential is supplied to the node ND12 through the wiring 153b. The transistor 172 is turned on, and the L potential is supplied to the node ND22 through the wiring 154b.

[Period T6]

In a period T6, the L potential is supplied to the wiring 152a (see FIG. 91B). Then, the transistor 161 is turned off, and the charge supplied to the node ND11 is retained. More accurately, the amount of the charge that makes the potential of the node ND11 be the L potential is retained in the node ND11. Similarly, the transistor 171 is turned off, and the potential of the node ND21 is retained. More accurately, the amount of the charge that makes the potential of the node ND21 be the H potential is retained in the node ND21. When the transistor 161 and the transistor 171 are brought into an off state, the node ND11 and the node ND21 are brought into a floating state.

[Period T7]

Figure 10A:
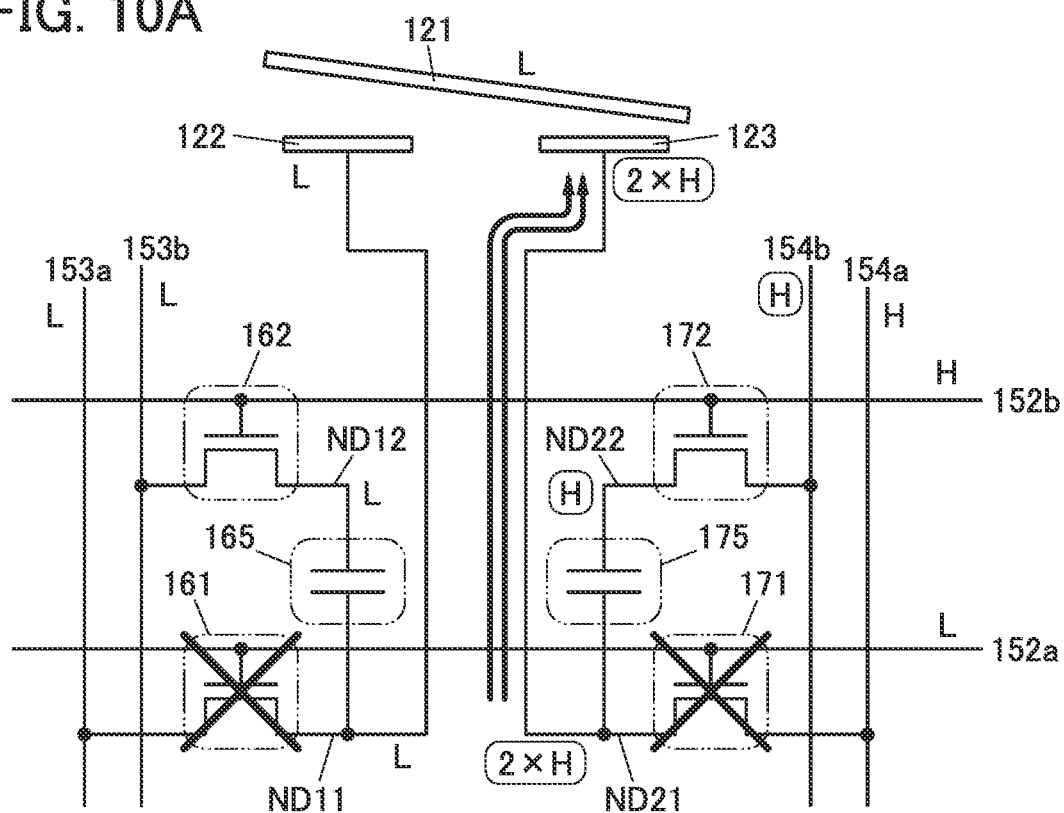
FIG. 10A and FIG. 10B are views illustrating operation states of a micromachine.

In a period T7, the H potential is supplied to the wiring 154b (see FIG. 10A). Since the transistor 172 is in an on state, the potential of the node ND22 increases from the L potential to the H potential. The node ND21 is in a floating state, and the node ND21 is capacitively coupled to the node ND22 by the capacitor 175. Accordingly, when the potential of the node ND22 increases from the L potential to the H potential, the potential of the node ND21 also increases in proportion to the potential change of the node ND22. That is, the potential of the node ND21 becomes a potential that is twice as high as the H potential (2×H potential). Thus, the potential of the electrode 123 also becomes twice as high as the H potential.

The 2×H potential is supplied to the electrode 123, whereby the electrode 121 is drawn to the electrode 123 by Coulomb force and then tilts to the electrode 123 side. The period T5 to the period T7 can be referred to as a driving period of the micromachine 100.

[Period T8]

Figure 10B:
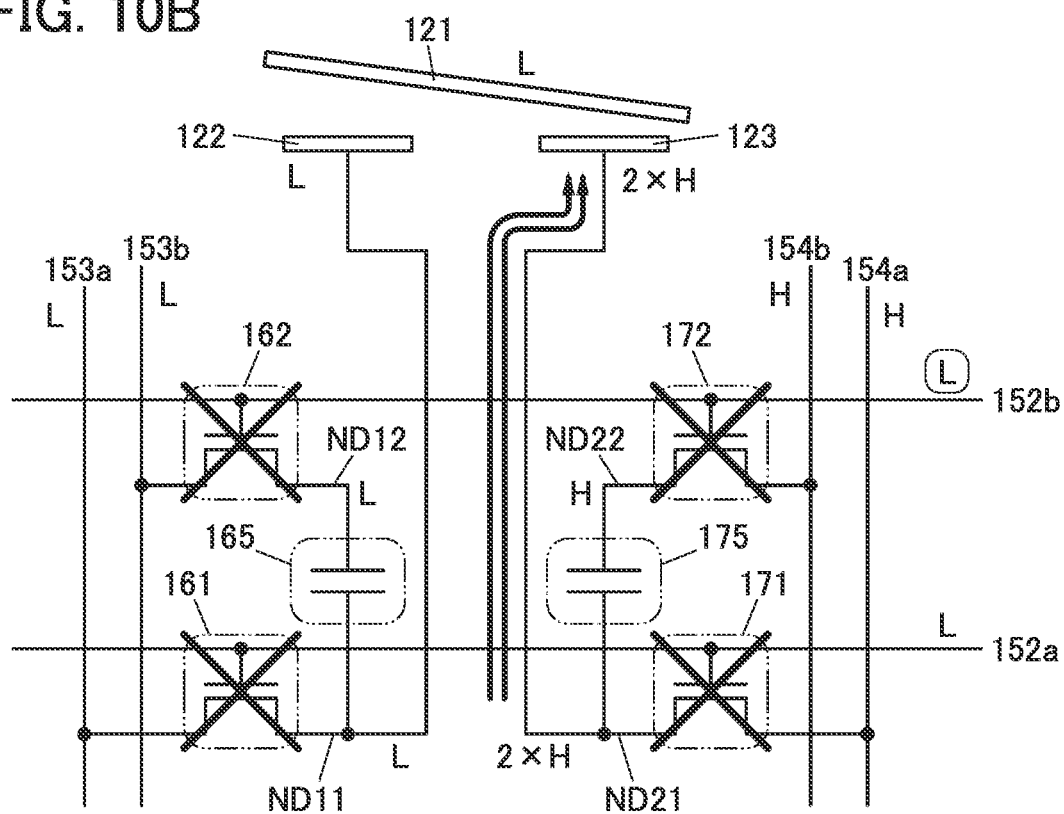

In a period T8, the L potential is supplied to the wiring 152b (see FIG. 10B). Then, the transistor 162 is turned off, and the charge of the node ND12 is retained. Similarly, the transistor 172 is turned off, and the charge of the node ND22 is retained. The period T8 can be referred to as a retention period of the micromachine 100.

In this manner, the circuit 151 can supply a potential that is twice as high as the H potential (2×H potential) to the electrode 122 or the electrode 123 without additional a power supply device.

According to one embodiment of the present invention, a semiconductor device including a plurality of micromachines 100 can operate the electrode 121 by boosting the potential of the electrode 122 or the potential of the electrode 123 in each of the micromachines 100. According to one embodiment of the present invention, a potential needed only for the micromachine 100 that needs operation can be boosted and generated using a power source for an electric circuit whose output voltage is low. Thus, as compared with the case where boosting power sources are provided with respect to all the micromachines 100, usage efficiency of electric power can be higher, and power consumption can be reduced. In addition, the area occupied by the whole semiconductor device can be reduced.

Modification Example 1

[Structure of Circuit 151A]

Figure 11:
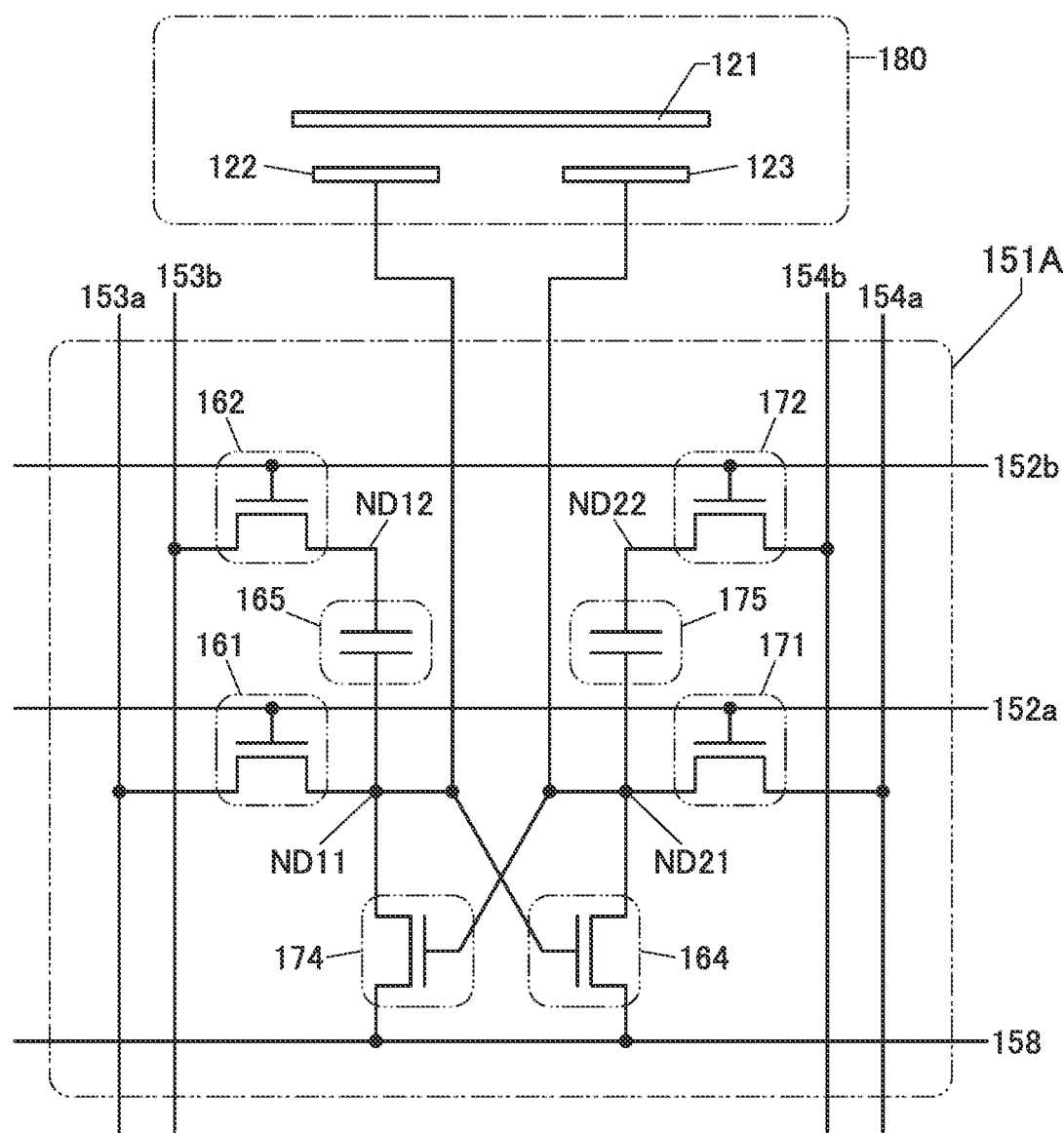
FIG. 11 is a circuit diagram of a micromachine.

FIG. 11 illustrates a circuit diagram of the micromachine 100 including a circuit 151A. Note that in FIG. 11, the electrode 121, the electrode 122, and the electrode 123 included in the structure body 180 are denoted. The circuit 151A is a modification example of the circuit 151. Differences of the circuit 151A from the circuit 151 will be mainly described to reduce repeated description. The circuit 151A has a structure in which a transistor 164 and a transistor 174 are added to the circuit 151, One of a source and a drain of the transistor 164 is electrically connected to a wiring 158, and the other is electrically connected to the node ND21. A gate of the transistor 164 is electrically connected to the node ND11. One of a source and a drain of the transistor 174 is electrically connected to the wiring 158, and the other is electrically connected to the node ND11. A gate of the transistor 174 is electrically connected to the node ND21.

In the circuit 151 of one embodiment of the present invention, when the electrode 121 tilts to the electrode 122 side, the node ND11 is brought into a floating state to make the potential of the electrode 122 exceed the H potential, and the node ND21 is also in a floating state. In the case where the node ND21 is in a floating state and parasitic capacitance between the node ND11 and the node ND21 is large, the potential of the node ND21 might increase when the potential of the node ND11 is boosted to the 2×H potential.

With the transistor 164, the node ND21 in the period T4 (retention period) can be fixed to the L potential without being in a floating state. With the transistor 174, the node ND11 in the period T8 can be fixed to the L potential without being in a floating state. Thus, the state of the micromachine 100 can be stabilized in the retention period. With the transistor 164 and the transistor 174, the operation of the micromachine 100 can be stabilized, leading to an increase in the reliability of the micromachine 100.

[Operation of Circuit 151A]

Figure 12:
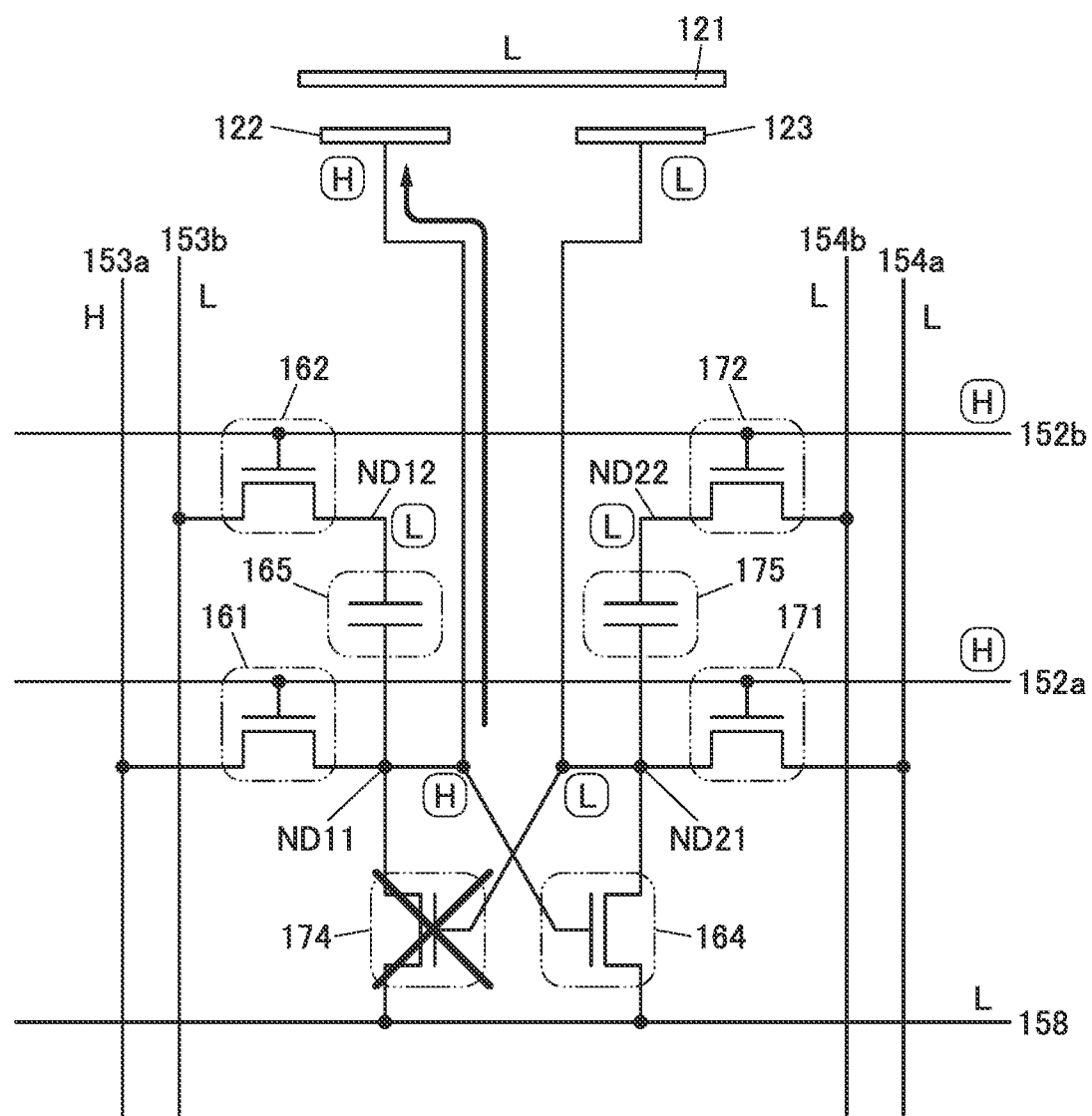
FIG. 12 is a view illustrating an operation state of a micromachine.
Figure 13:
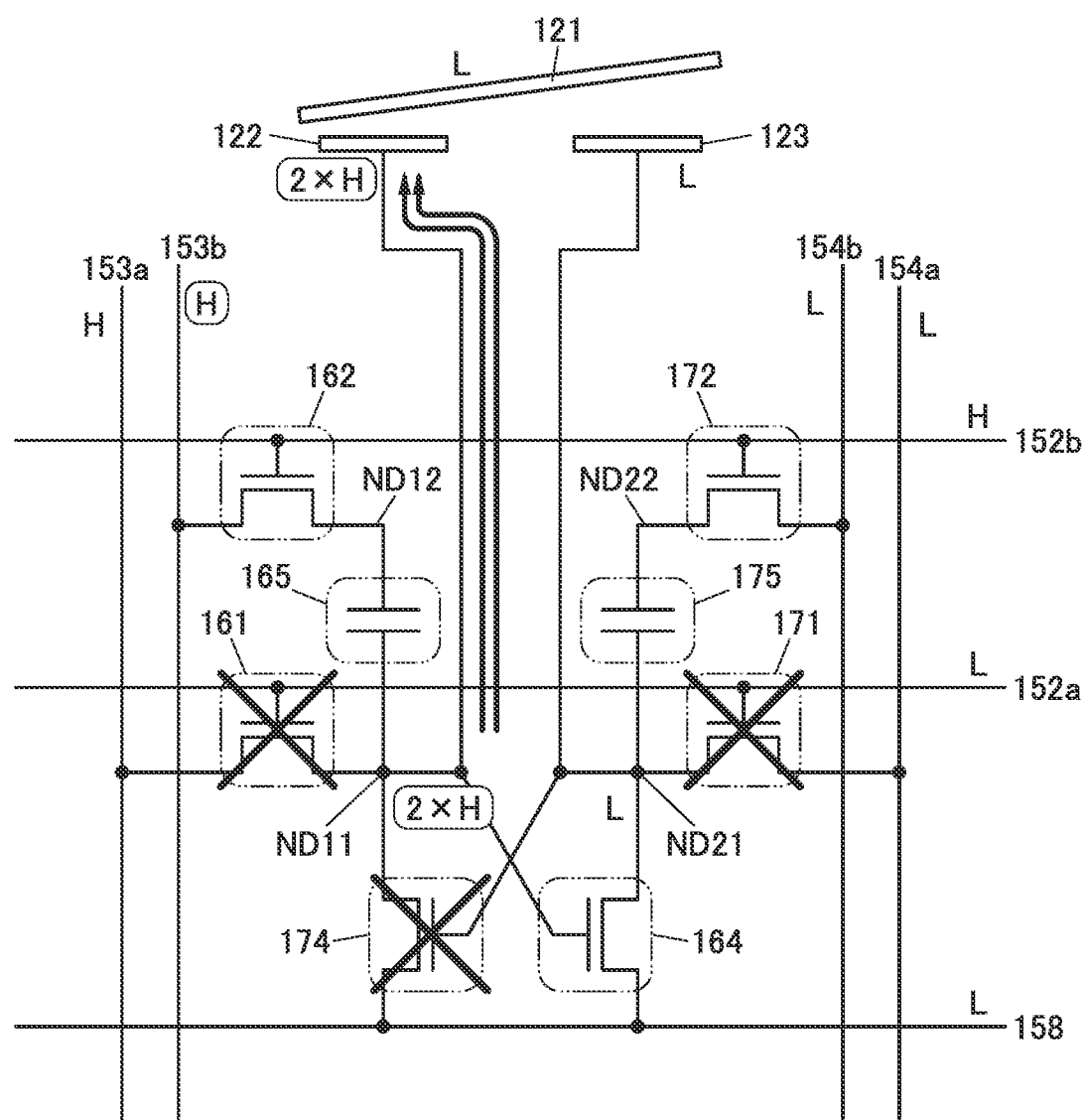
FIG. 13 is a view illustrating an operation state of a micromachine.

Next, operation of the micromachine 100 including the circuit 151A will be described. In this embodiment, operation in the case where the electrode 121 tilts to the electrode 122 side using the circuit 151A will be described. FIG. 12 illustrates an operation state of the micromachine 100 including the circuit 151A in the period T1. FIG. 13 illustrates an operation state of the micromachine 100 including the circuit 151A in the period T3.

[Period T1]

In the period T1, since the potential of the node ND11 is the H potential, a gate potential of the transistor 164 also becomes the H potential. Thus, the transistor 164 is turned on, and the L potential is supplied to the node ND21 through the wiring 158.

The gate of the transistor 174 is electrically connected to the node ND21, so that a gate potential of the transistor 174 also becomes the L potential. Accordingly, the transistor 174 is brought into an off state.

[Period T3]

In the period T3, the transistor 161 and the transistor 171 are turned off, and the potential of the node ND11 becomes the 2×H potential. Since the gate potential of the transistor 164 becomes the 2×H potential, the transistor 164 is kept on. In the circuit 151A, the node ND21 is still not in a floating state in the period T4, and the potential of the node ND21 is fixed to the L potential. Furthermore, the transistor 174 remains off.

Thus, in the circuit 151A, the state of the micromachine 100 can be stabilized in the retention period. With the transistor 164 and the transistor 174, the operation of the micromachine 100 can be stabilized, leading to an increase in the reliability of the micromachine 100. In addition, the use of an OS transistor as the transistor 174 enables the charge of the node ND11 to be retained for a long period. The use of an OS transistor as the transistor 164 enables the charge of the node ND21 to be retained for a long period. Thus, the reliability of the micromachine 100 can be further increased.

Modification Example 2

[Structure of Circuit 151B]

Figure 14:
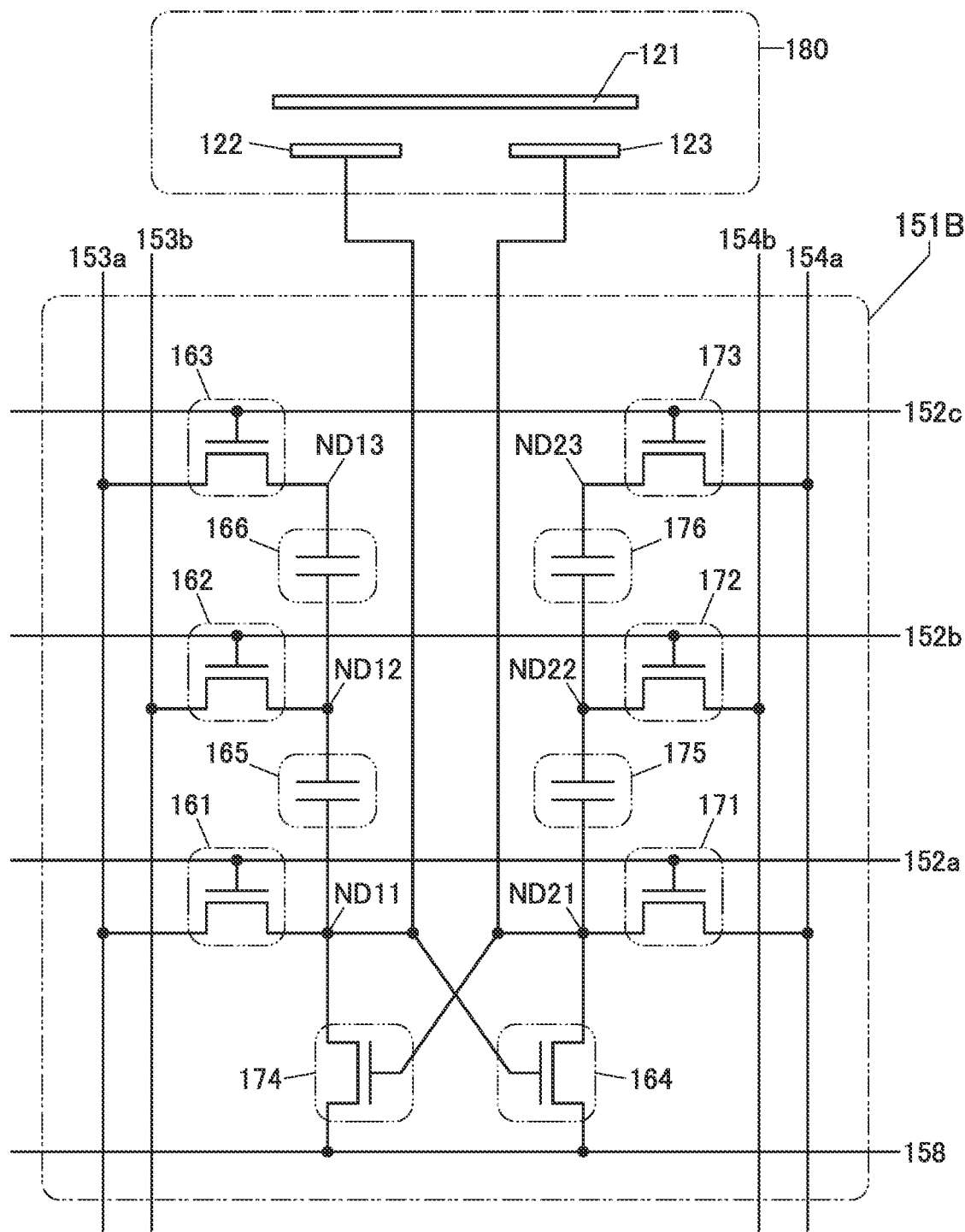
FIG. 14 is a circuit diagram of a micromachine.

FIG. 14 illustrates a circuit diagram of the micromachine 100 including a circuit 151B. Note that in FIG. 14, the electrode 121, the electrode 122, and the electrode 123 included in the structure body 180 are denoted. The circuit 151B is a modification example of the circuit 151A. Differences of the circuit 151B from the circuit 151A will be mainly described to reduce repeated description. The circuit 151B has a structure in which a transistor 163, a transistor 173, a capacitor 166, and a capacitor 176 are added to the circuit 151A.

One of a source and a drain of the transistor 163 is electrically connected to the wiring 153b, and one electrode of the capacitor 166 is electrically connected to the node ND12. The other of the source and the drain of the transistor 163 is electrically connected to the other electrode of the capacitor 166. A node to which the other of the source and the drain of the transistor 163 and the other electrode of the capacitor 166 are electrically connected is called a node ND13.

One of a source and a drain of the transistor 173 is electrically connected to the wiring 154b, and one electrode of the capacitor 176 is electrically connected to the ND12. The other of the source and the drain of the transistor 163 is electrically connected to the other electrode of the capacitor 176. A node to which the other of the source and the drain of the transistor 163 and the other electrode of the capacitor 176 are electrically connected is called a node ND23.

A gate of the transistor 163 and a gate of the transistor 173 are electrically connected to a wiring 152c.

The circuit 151B has a function of setting the potential of the electrode 122 and the potential of the electrode 123 to potentials that are three times as high as the H potential (3×H potential). In the circuit 151B, Coulomb force generated between the electrode 122 and the electrode 121 and Coulomb force generated between the electrode 122 and the electrode 121 can be larger than those in the circuit 151 and the circuit 151A. Accordingly, the micromachine 100 can be operated more surely. Furthermore, the operating speed of the micromachine 100 can be increased. Furthermore, when Coulomb force increases, resistance to noise in the retention period is improved and the operation of the micromachine 100 can be retained more surely in the retention period.

[Operation of Circuit 151B]

Figure 15:
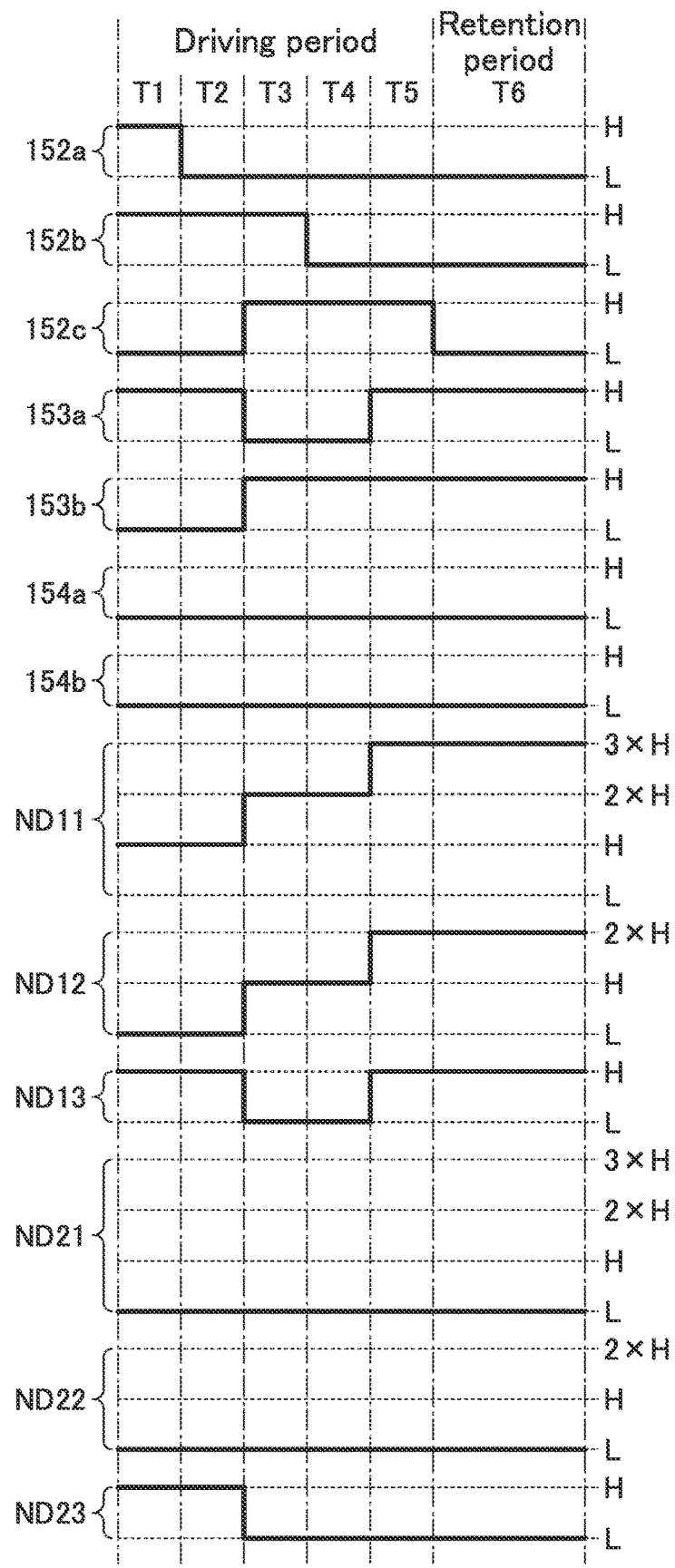
FIG. 15 is a timing chart showing operation of a micromachine.

Next, operation of the micromachine 100 including the circuit 151B will be described. In this embodiment, operation in the case where the electrode 121 tilts to the electrode 122 side using the circuit 151B will be described. FIG. 15 is a timing chart showing the operation of the micromachine 100 including the circuit 151B. FIG. 16 to FIG. 20 are views illustrating states of the micromachine 100 including the circuit 151B in particular operation periods.

First, the L potential is supplied to the electrode 121, the wiring 153b, the wiring 154a, the wiring 154b, the wiring 152c, and the wiring 158, and the H potential is supplied to the wiring 153a. The potentials of the node ND13 and the node ND23 are the H potentials.

[Period T1]

Figure 16:
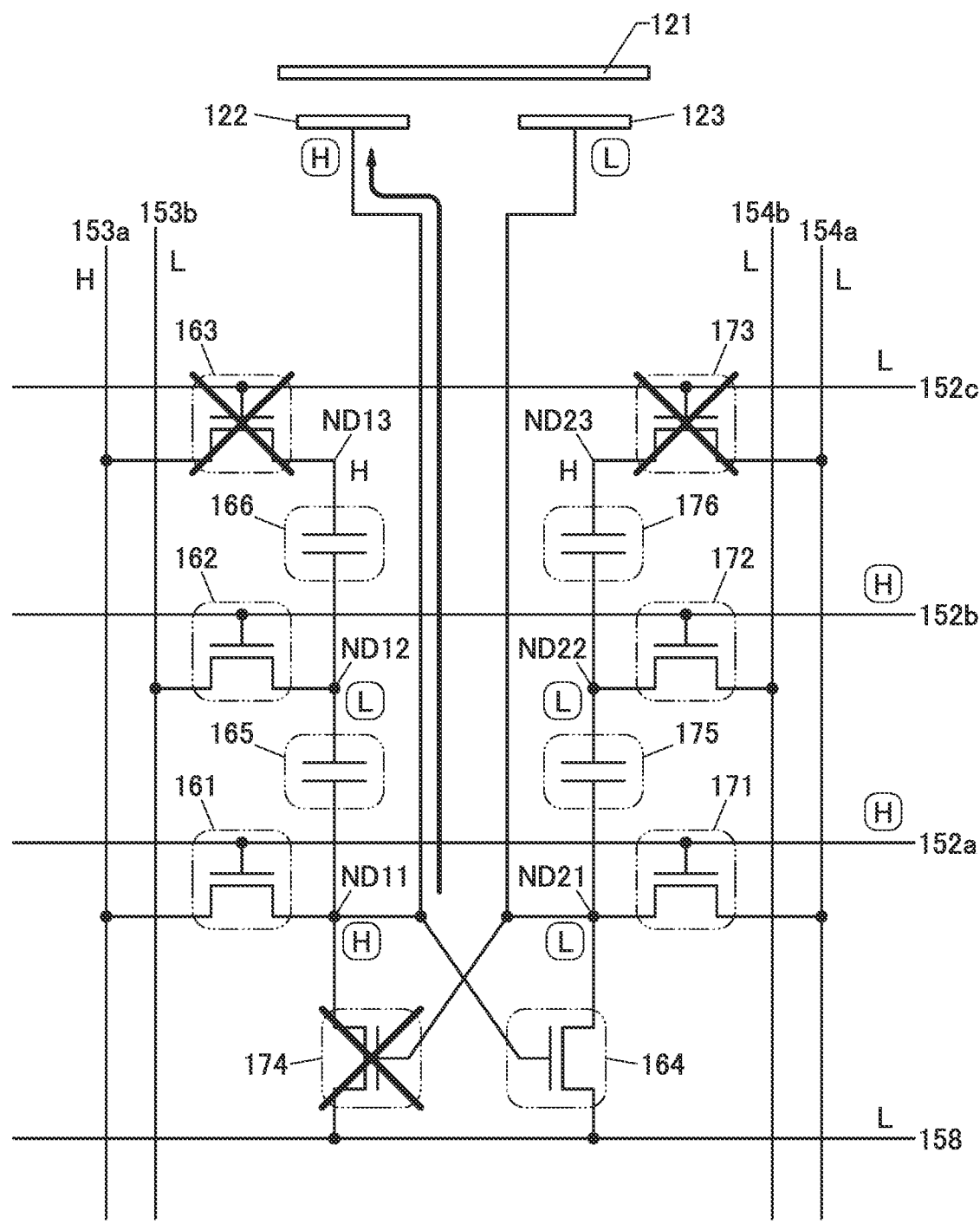
FIG. 16 is a view illustrating an operation state of a micromachine.

In the period T1, the H potential is supplied to the wiring 152a and the wiring 152b (see FIG. 16). Then, the transistor 161 is turned on, and the H potential is supplied to the node ND11 through the wiring 153a. The transistor 171 is turned on, and the L potential is supplied to the node ND21 through the wiring 154a. When the potential of the node ND11 becomes the H potential, the transistor 164 is turned on, and the L potential is supplied to the node ND21 through the wiring 158. The transistor 162 is turned on, and the L potential is supplied to the node ND12 through the wiring 153b. The transistor 172 is turned on, and the L potential is supplied to the node ND22 through the wiring 154b.

Since the L potential is supplied to the wiring 152c, the transistor 163 and the transistor 173 are in an off state.

[Period T2]

Figure 17:
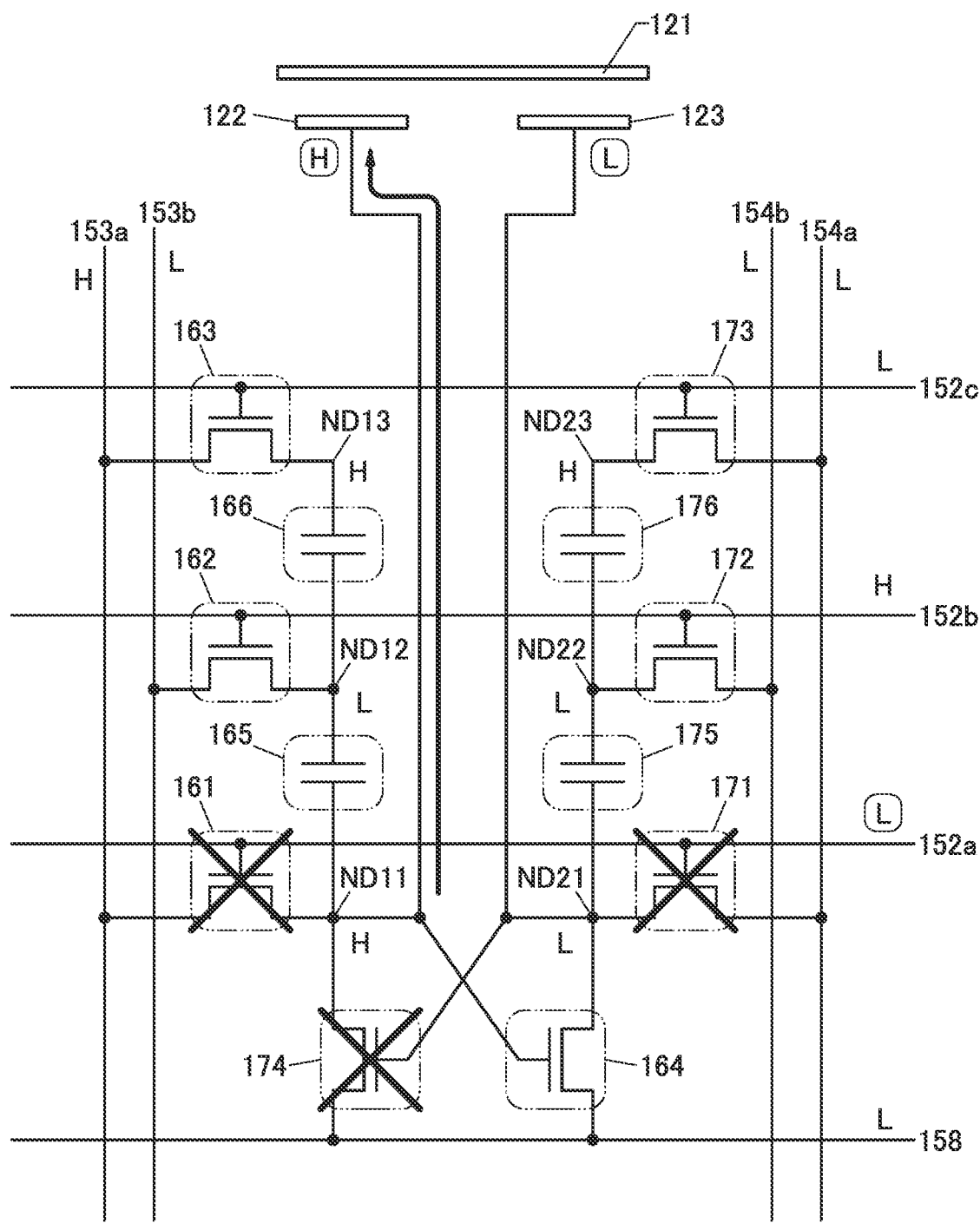
FIG. 17 is a view illustrating an operation state of a micromachine.

In the period T2, the L potential is supplied to the wiring 152a (see FIG. 17). Then, the transistor 161 is turned off, and the charge supplied to the node ND11 is retained. More accurately, the number of charge that makes the potential of the node ND11 be the H potential is retained in the node ND11. In addition, the transistor 171 is also turned off.

When the transistor 161 is brought into an off state, the node ND11 is brought into a floating state. The L potential is supplied to the node ND21 through the wiring 158 via the transistor 164.

[Period T3]

Figure 18:
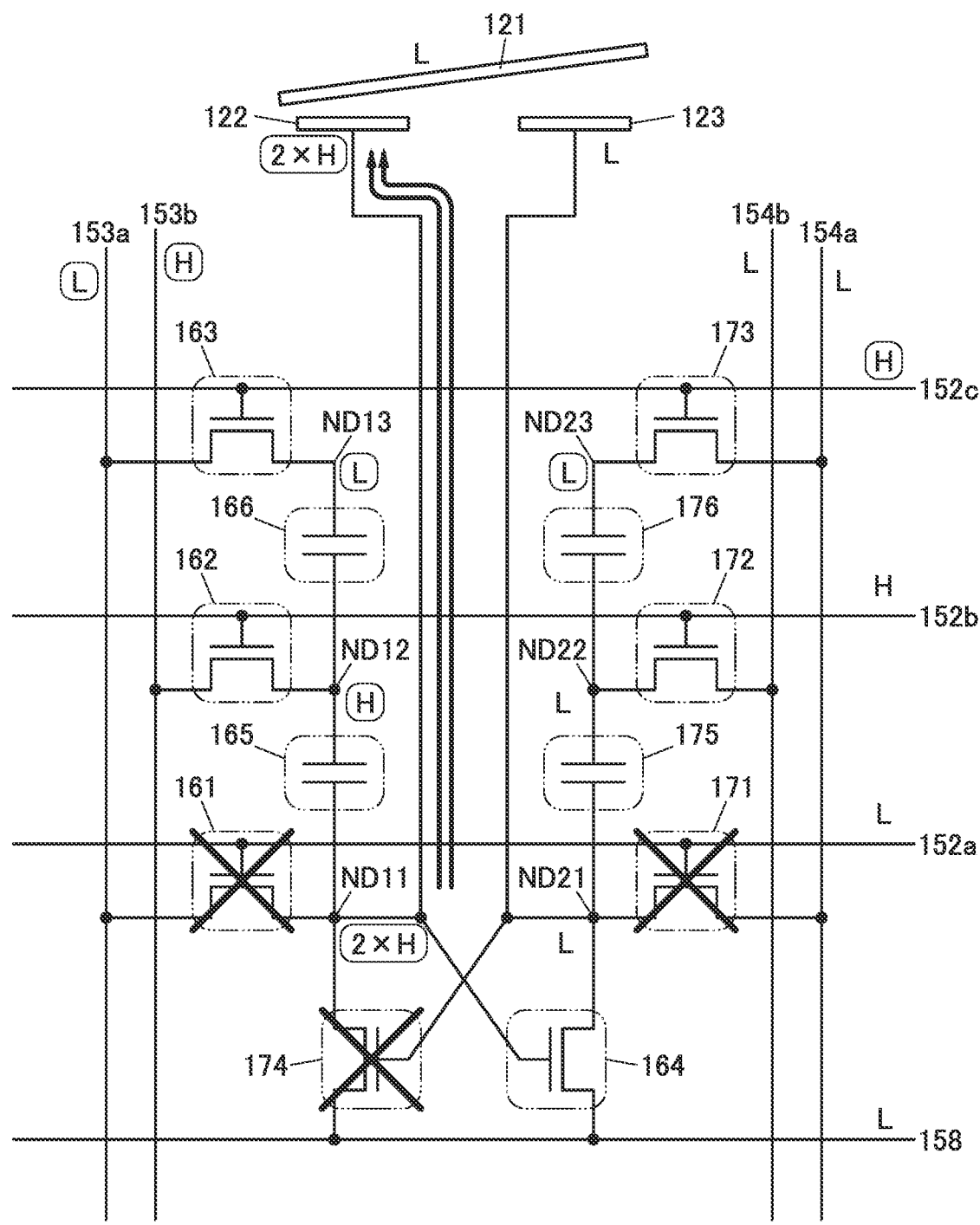
FIG. 18 is a view illustrating an operation state of a micromachine.

In the period T3, the H potential is supplied to the wiring 153b (see FIG. 18). Since the transistor 162 is in an on state, the potential of the node ND12 increases from the L potential to the H potential. The node ND11 is in a floating state, and the node ND11 is capacitively coupled to the node ND12 by the capacitor 165. Accordingly, when the potential of the node ND12 increases from the L potential to the H potential, the potential of the node ND11 also increases in proportion to the potential change of the node ND12. That is, the potential of the node ND11 becomes a potential that is twice as high as the H potential (2×H potential). As a result, the potential of the electrode 122 also becomes twice as high as the H potential.

The 2×H potential is supplied to the electrode 122, whereby the electrode 121 is drawn to the electrode 122 by Coulomb force and then tilts to the electrode 122 side.

In the period T3, the L potential is supplied to the wiring 153a and the H potential is supplied to the wiring 152c. Then, the transistor 163 is turned on, and the L potential is supplied to the node ND13. The transistor 173 is turned on, and the L potential is supplied to the node ND23.

[Period T4]

Figure 19:
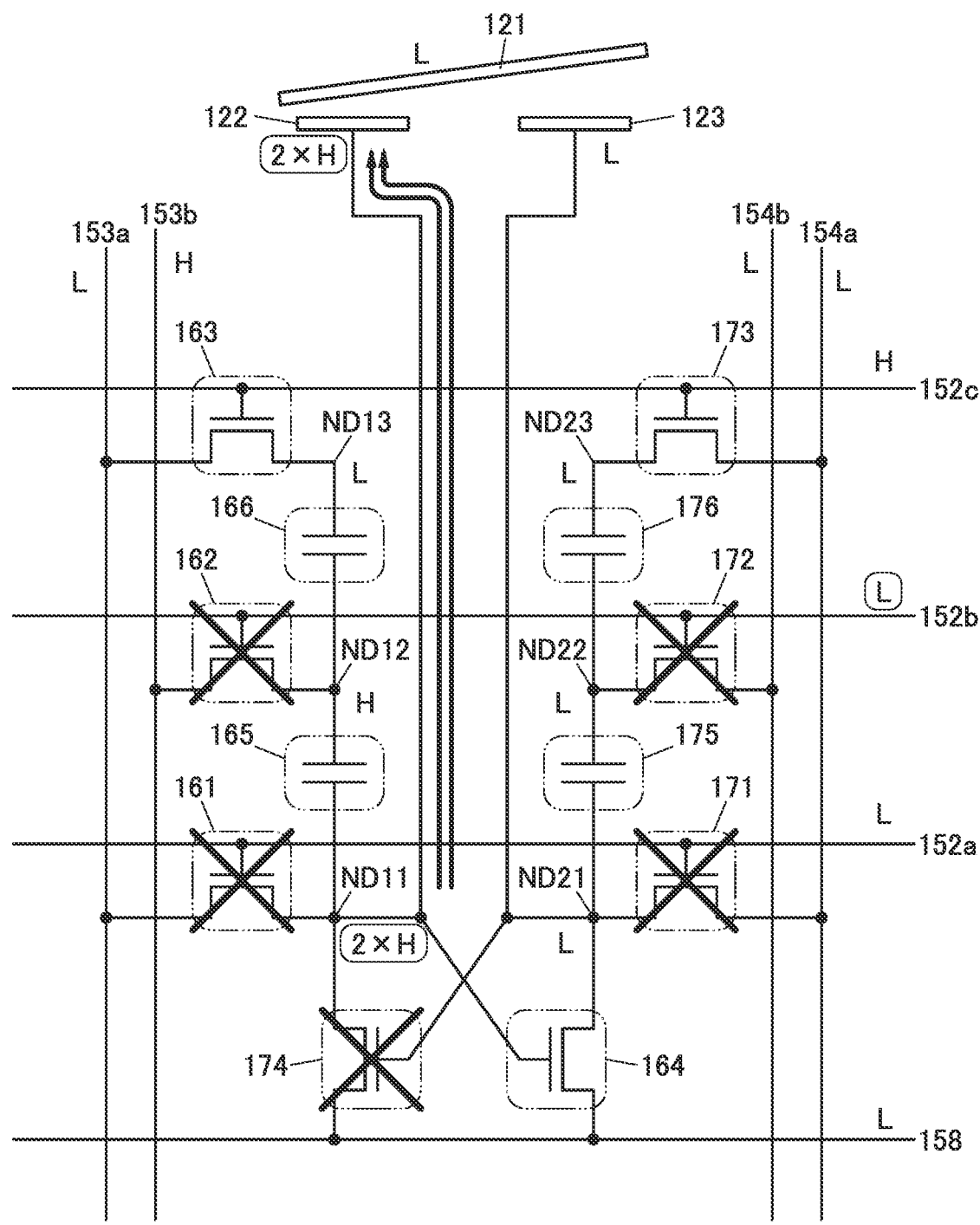
FIG. 19 is a view illustrating an operation state of a micromachine.

In the period T4, the L potential is supplied to the wiring 152b (see FIG. 19). Then, the transistor 162 is turned off, and the charge supplied to the node ND12 is retained. More accurately, the amount of the charge that makes the potential of the node ND12 be the H potential is retained in the node ND12. In addition, the transistor 172 is also turned off.

When the transistor 162 is brought into an off state, the node ND12 is brought into a floating state.

[Period T5]

Figure 20:
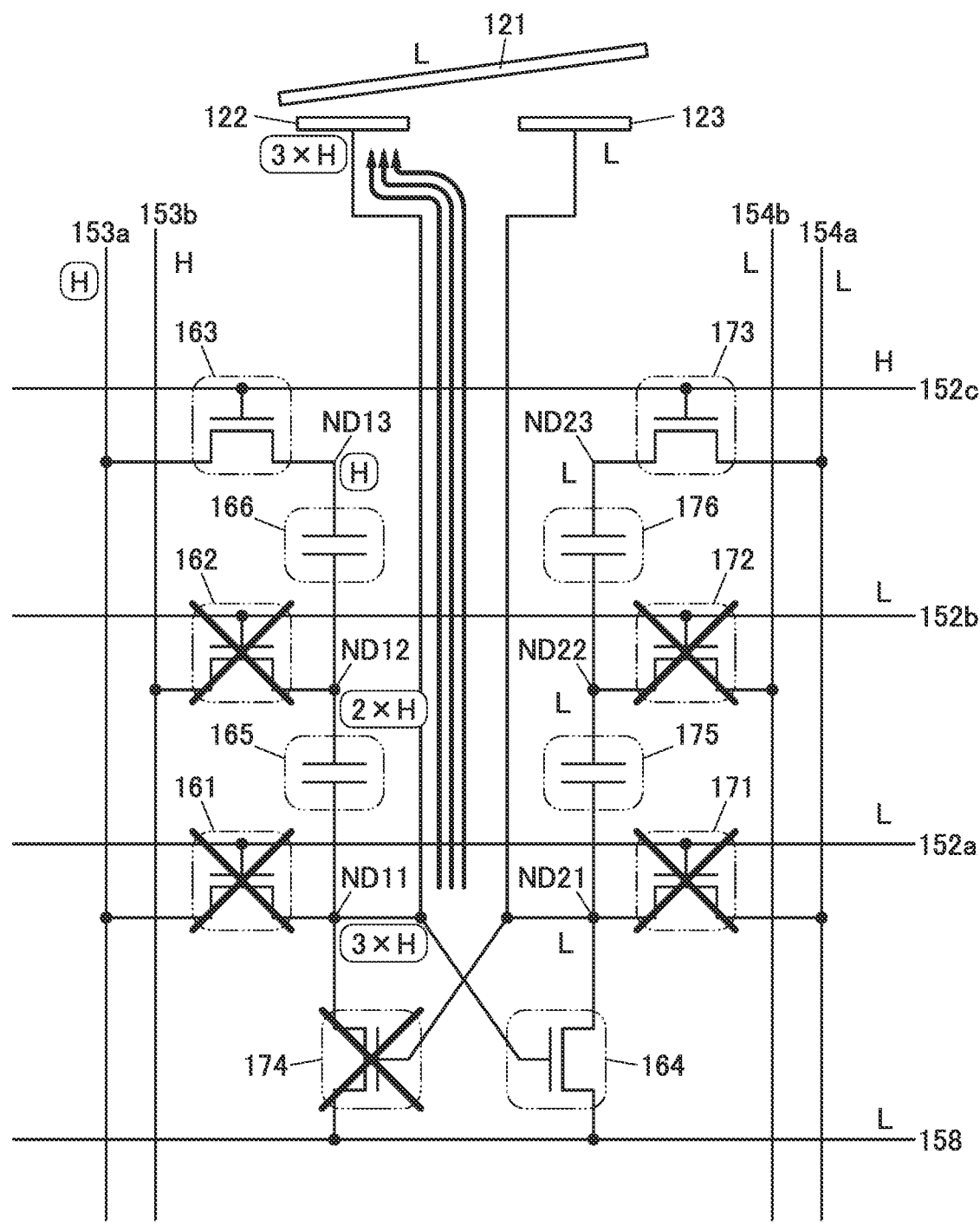
FIG. 20 is a view illustrating an operation state of a micromachine.

In the period T5, the H potential is supplied to the wiring 153a (see FIG. 20). Since the transistor 163 is in an on state, the potential of the node ND13 increases from the L potential to the H potential. The node ND12 and the node ND11 are in a floating state, the node ND12 is capacitively coupled to the node ND13 by the capacitor 166, and the node ND11 is capacitively coupled to the node ND12 by the capacitor 165. Accordingly, when the potential of the node ND13 increases from the L potential to the H potential, the potentials of the node ND12 and the node ND11 also increase in proportion to the potential change of the node ND13. That is, the potential of the node ND12 becomes a potential that is twice as high as the H potential (2×H potential), and the potential of the node ND11 becomes a potential that is three times as high as the H potential (3×H potential). As a result, the potential of the electrode 122 also becomes three times as high as the H potential.

The 3×H potential is supplied to the electrode 122, whereby the electrode 121 is more strongly drawn to the electrode 122.

[Period T6]

In the period T6, the L potential is supplied to the wiring 152c. Then, the transistor 163 is turned off, and the charge of the node ND13 is retained. Similarly, the transistor 173 is turned off, and the charge of the node ND23 is retained. In the circuit 151B, the period T6 can be referred to as a retention period of the micromachine 100.

In this manner, the circuit 151B enables the potential of the electrode 122 and the potential of the electrode 123 to be potentials that are three times as high as the H potential (3×H potential) without changing a power supply voltage or adding a power supply device. Thus, in the circuit 151B, Coulomb force generated between the electrode 122 and the electrode 121 and Coulomb force generated between the electrode 122 and the electrode 121 can be large. Thus, the operation of the micromachine 100 can be stabilized, and the reliability of the micromachine 100 can be further increased.

Modification Example 3

[Structure of Circuit 151C]

Figure 21:
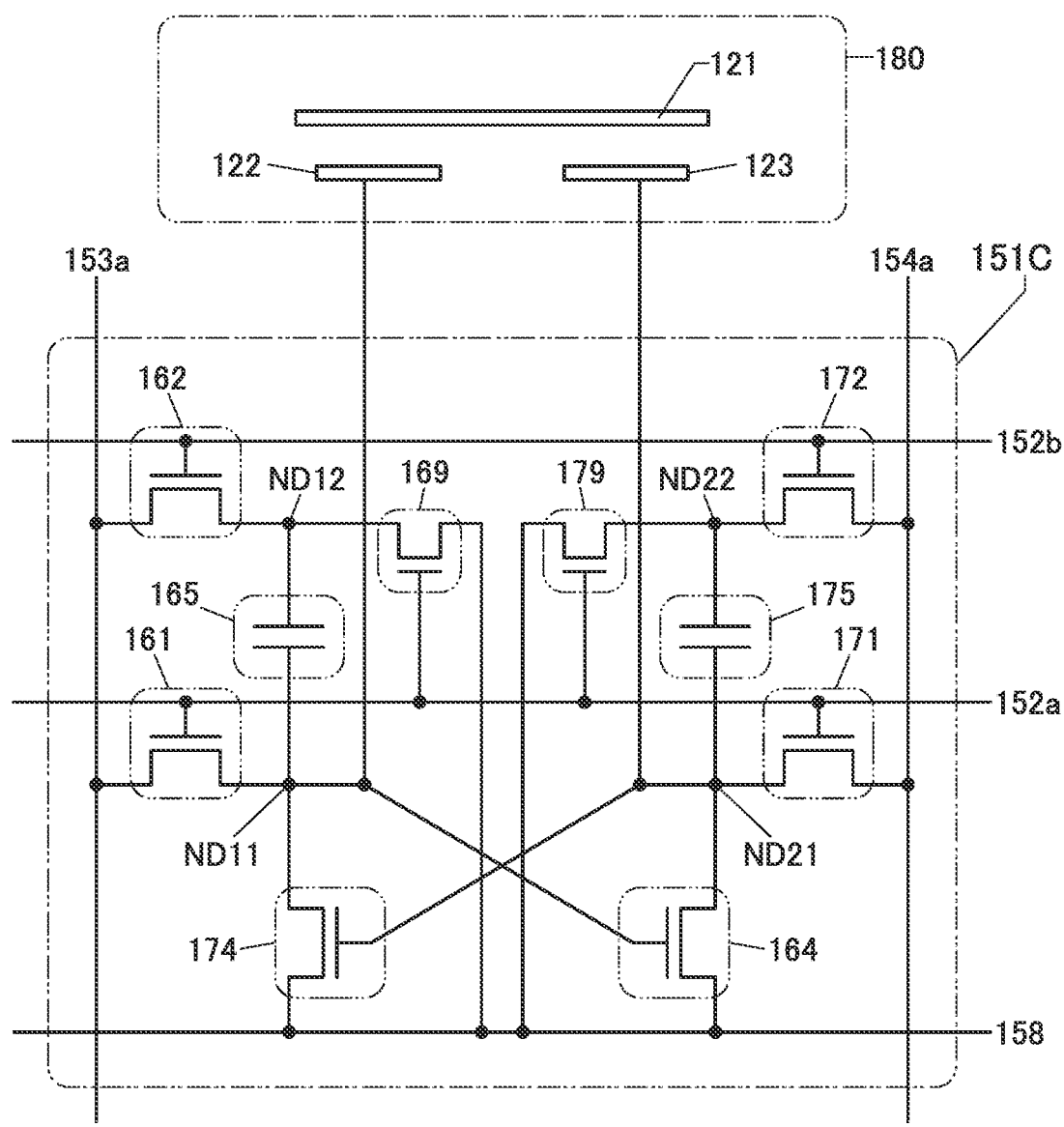
FIG. 21 is a circuit diagram of a micromachine.

FIG. 21 illustrates a circuit diagram of the micromachine 100 including a circuit 151C. Note that in FIG. 21, the electrode 121, the electrode 122, and the electrode 123 included in the structure body 180 are denoted. The circuit 151C is a modification example of the circuit 151A. Differences of the circuit 151C from the circuit 151A will be mainly described to reduce repeated description. The circuit 151C has a structure in which a transistor 169 and a transistor 179 are added to the circuit 151A.

One of a source and a drain of the transistor 169 is electrically connected to the wiring 158, and the other is electrically connected to the node ND12. A gate of the transistor 169 is electrically connected to the wiring 152a. One of a source and a drain of the transistor 179 is electrically connected to the wiring 158, and the other is electrically connected to the node ND22. A gate of the transistor 179 is electrically connected to the wiring 152a.

With the transistor 169 and the transistor 179, the number of wirings connected to the micromachine 100 can be reduced. For example, one of the wiring 153a and the wiring 153b and one of the wiring 154a and the wiring 154b can be omitted. The reduction of the number of wirings can reduce parasitic capacitance, whereby the power consumption of the micromachine 100 in operation can be reduced.

In the circuit 151C illustrated in FIG. 21 and the like, the wiring 153b is omitted, and one of the source and the drain of the transistor 162 is electrically connected to the wiring 153a. In the circuit 151C illustrated in FIG. 21 and the like, the wiring 154b is omitted, and one of the source and the drain of the transistor 172 is electrically connected to the wiring 154a.

Figure 22:
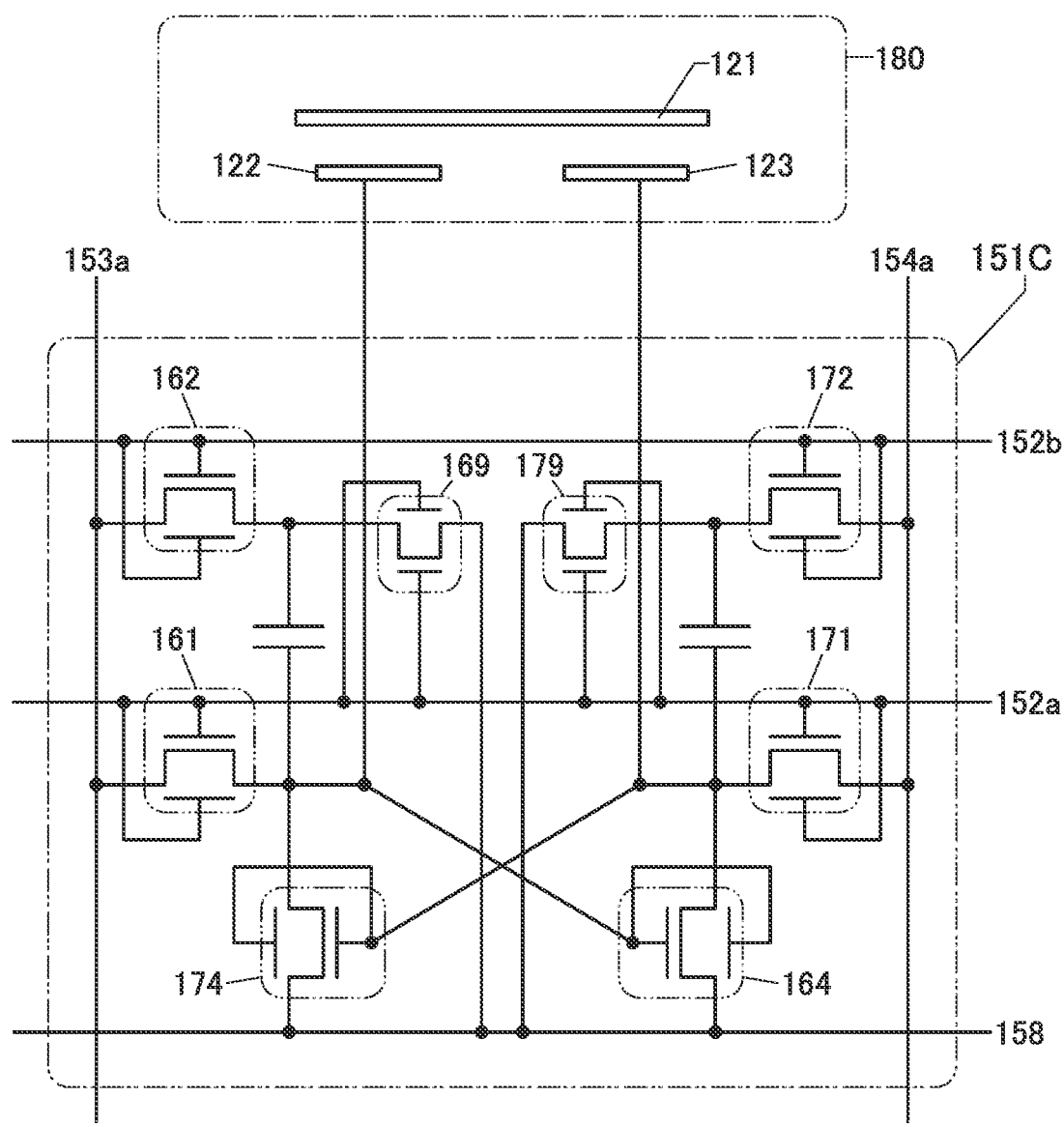
FIG. 22 is a circuit diagram of a micromachine.

As illustrated in FIG. 22, the transistor 161, the transistor 162, the transistor 164, the transistor 169, the transistor 171, the transistor 172, and the transistor 174 may be transistors each including a back gate. In FIG. 22, the back gates of the transistor 161, the transistor 171, the transistor 169, and the transistor 179 are electrically connected to the wiring 152a. The back gates of the transistor 162 and the transistor 172 are electrically connected to the wiring 152b. The back gate of the transistor 164 is electrically connected to the gate of the transistor 164. The back gate of the transistor 174 is electrically connected to the gate of the transistor 174.

Note that in FIG. 22, although the potential of the back gate becomes equal to the potential of the gate, the potential of the back gate may be different from that of the gate. The potential of the back gate may be a ground potential (GND potential) or a given potential.

[Operation of Circuit 151C]

Figure 23:
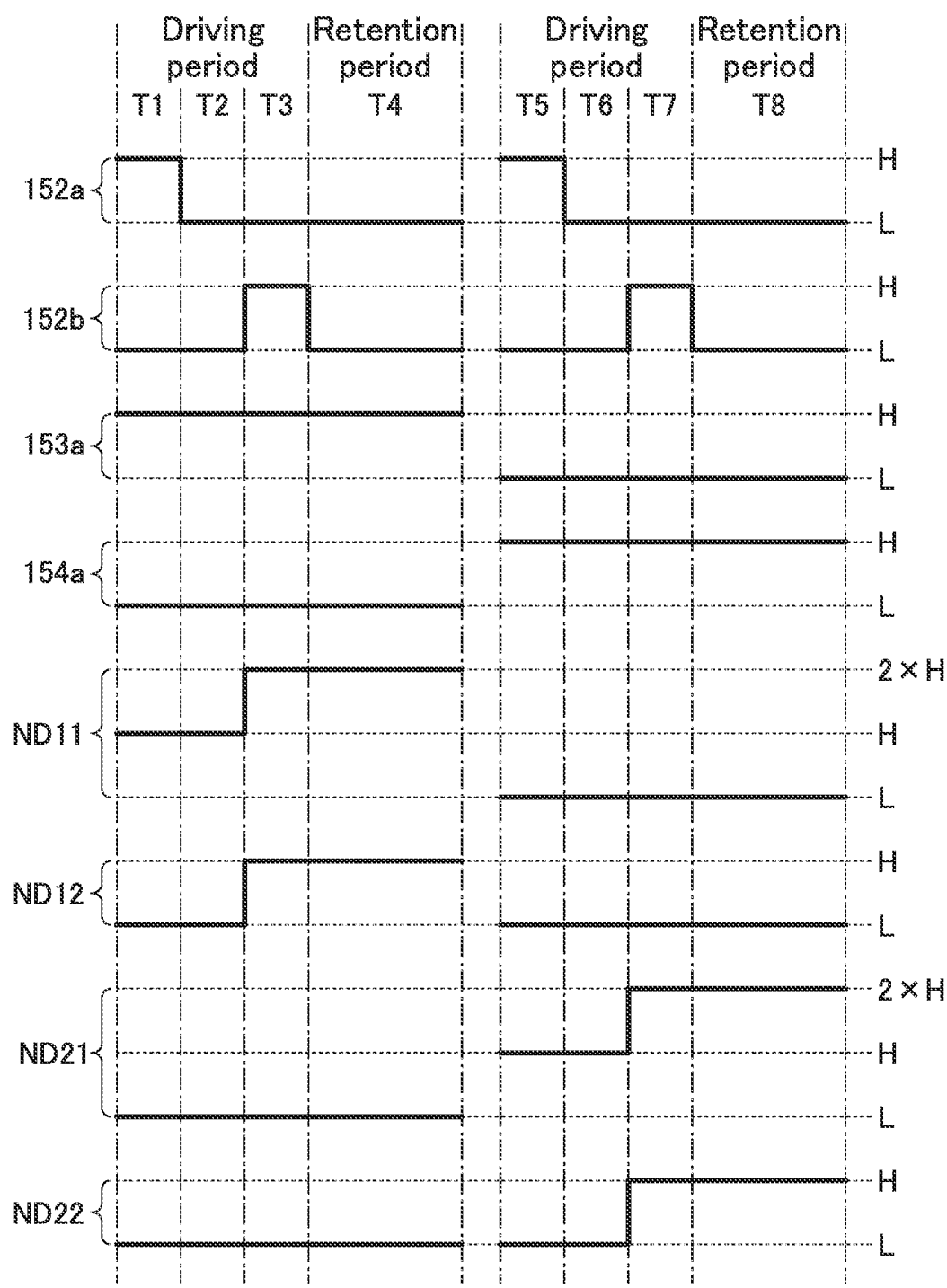
FIG. 23 is a timing chart showing operation of a micromachine.

Next, operation of the micromachine 100 including the circuit 151C will be described. FIG. 23 is a timing chart showing the operation of the micromachine 100 including the circuit 151C. FIG. 24 to FIG. 31 are views illustrating states of the micromachine 100 including the circuit 151C in particular operation periods.

First, the L potential is supplied to the electrode 121, the wiring 154a, and the wiring 158.

[Period T1]

Figure 24:
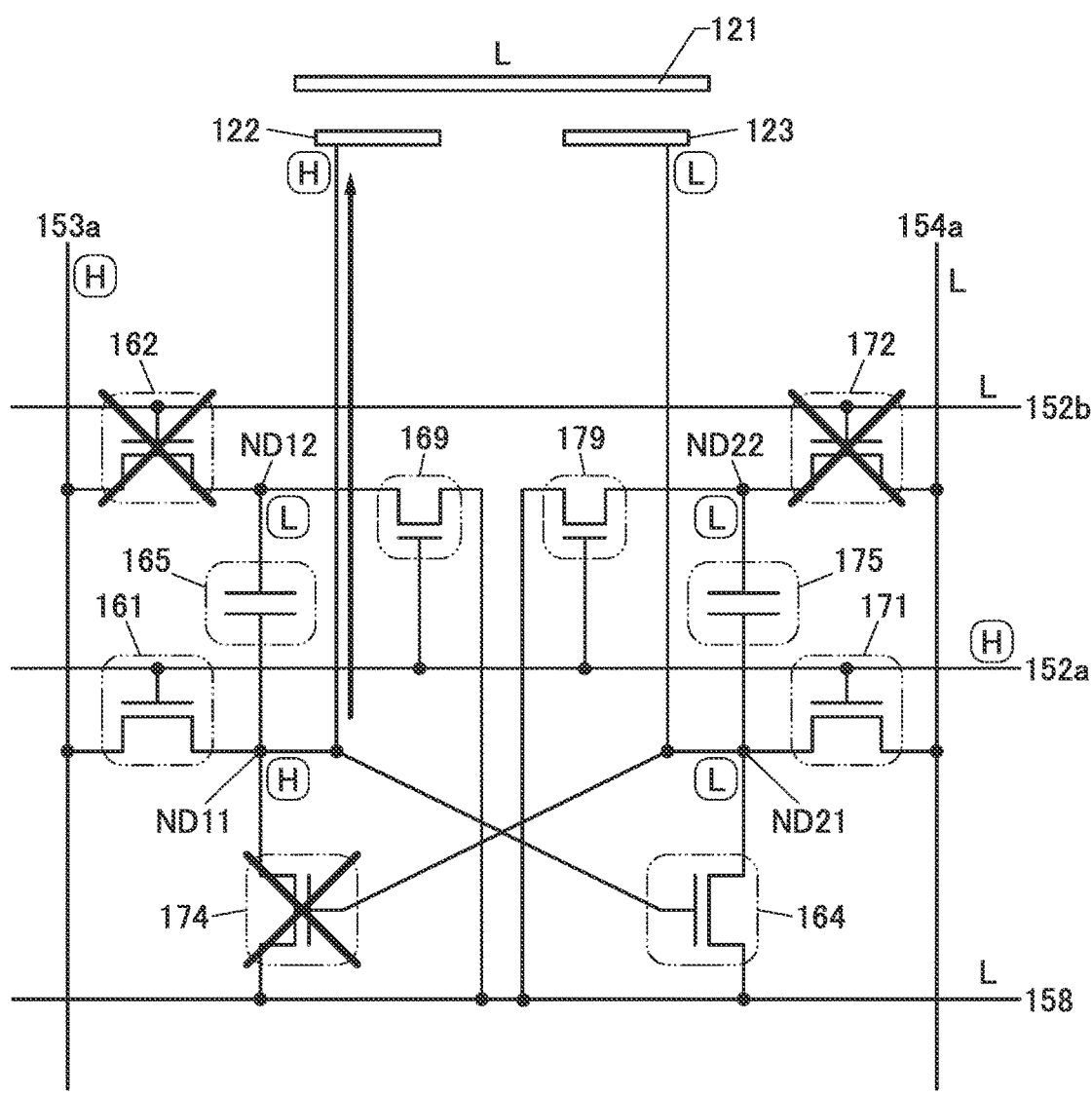
FIG. 24 is a view illustrating an operation state of a micromachine.

In the period T1, the H potential is supplied to the wiring 152a and the wiring 153a (see FIG. 24). Then, the transistor 161 is turned on, and the H potential is supplied to the node ND11 through the wiring 153a. The transistor 171 is turned on, and the L potential is supplied to the node ND21 through the wiring 154a. When the node ND11 has the H potential, the transistor 164 is turned on. When the node ND21 has the L potential, the transistor 174 is turned off. When the transistor 164 is turned on, the L potential is supplied to the node ND21 through the wiring 158.

The transistor 169 is turned on, and the L potential is supplied to the node ND12 through the wiring 158. The transistor 179 is turned on, and the L potential is supplied to the node ND22 through the wiring 158.

[Period T2]

Figure 25:
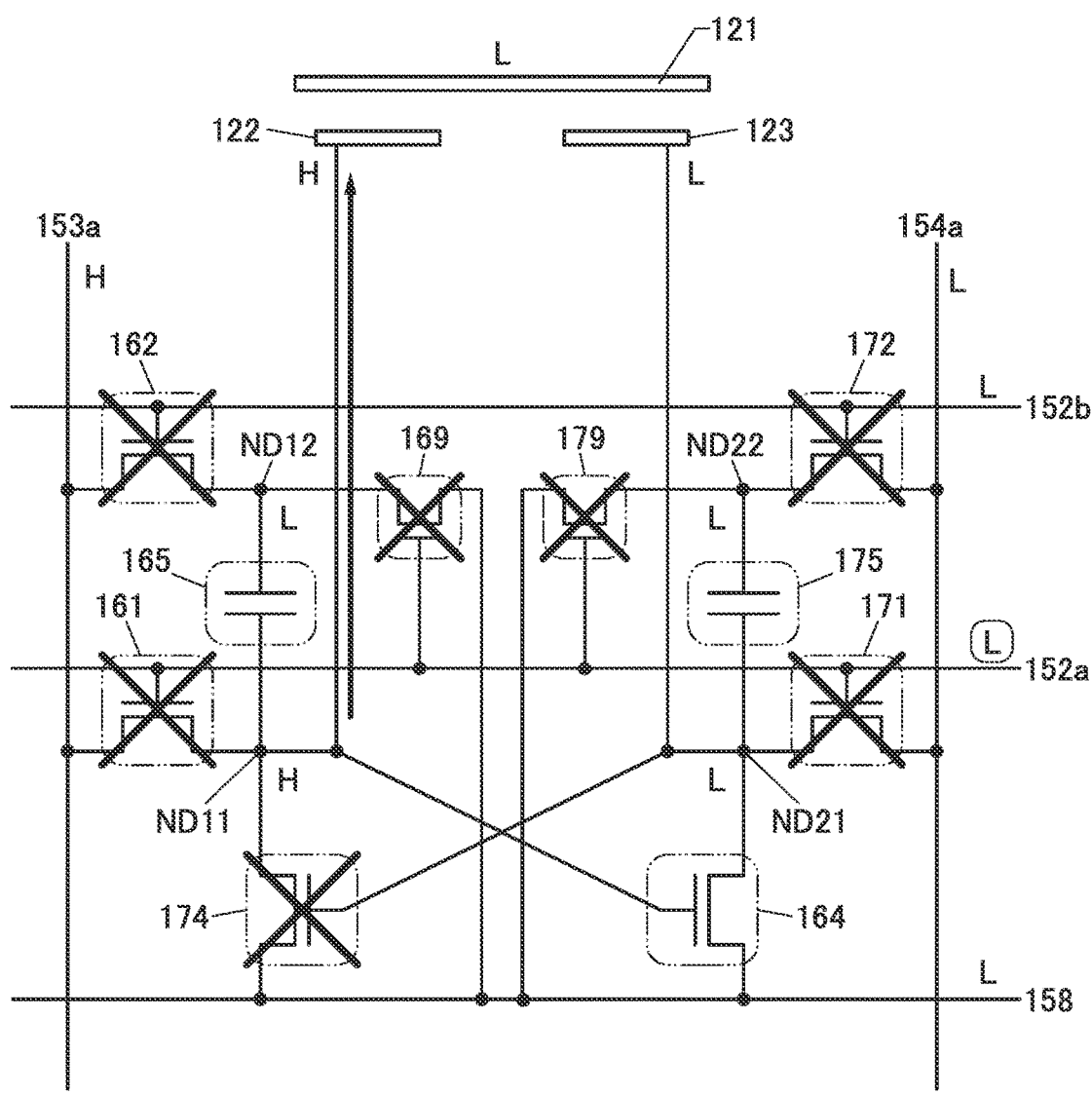
FIG. 25 is a view illustrating an operation state of a micromachine.

In the period T2, the L potential is supplied to the wiring 152a (see FIG. 25). Then, the transistor 161 is turned off, and the charge supplied to the node ND11 is retained. More accurately, the amount of the charge that makes the potential of the node ND11 be the H potential is retained in the node ND11. Similarly, the transistor 171 is turned off, and the potential of the node ND21 is retained. More accurately, the amount of the charge that makes the potential of the node ND21 be the L potential is retained in the node ND21.

Similarly, the transistor 162 and the transistor 169 are turned off, and the potential of the node ND12 is retained. The transistor 172 and the transistor 179 are turned off, and the potential of the node ND22 is retained. Like the transistor 162, an OS transistor is preferably used as the transistor 169. When OS transistors are used as the transistor 162 and the transistor 169, the charge of the node ND12 can be retained for a long period. Like the transistor 172, an OS transistor is preferably used as the transistor 179. When OS transistors are used as the transistor 172 and the transistor 179, the charge of the node ND22 can be retained for a long period.

When the transistor 161, the transistor 171, the transistor 162, the transistor 172, the transistor 169, and the transistor 179 are brought into an off state, the node ND11, the node ND21, the node ND12, and the node ND22 are brought into a floating state.

[Period T3]

Figure 26:
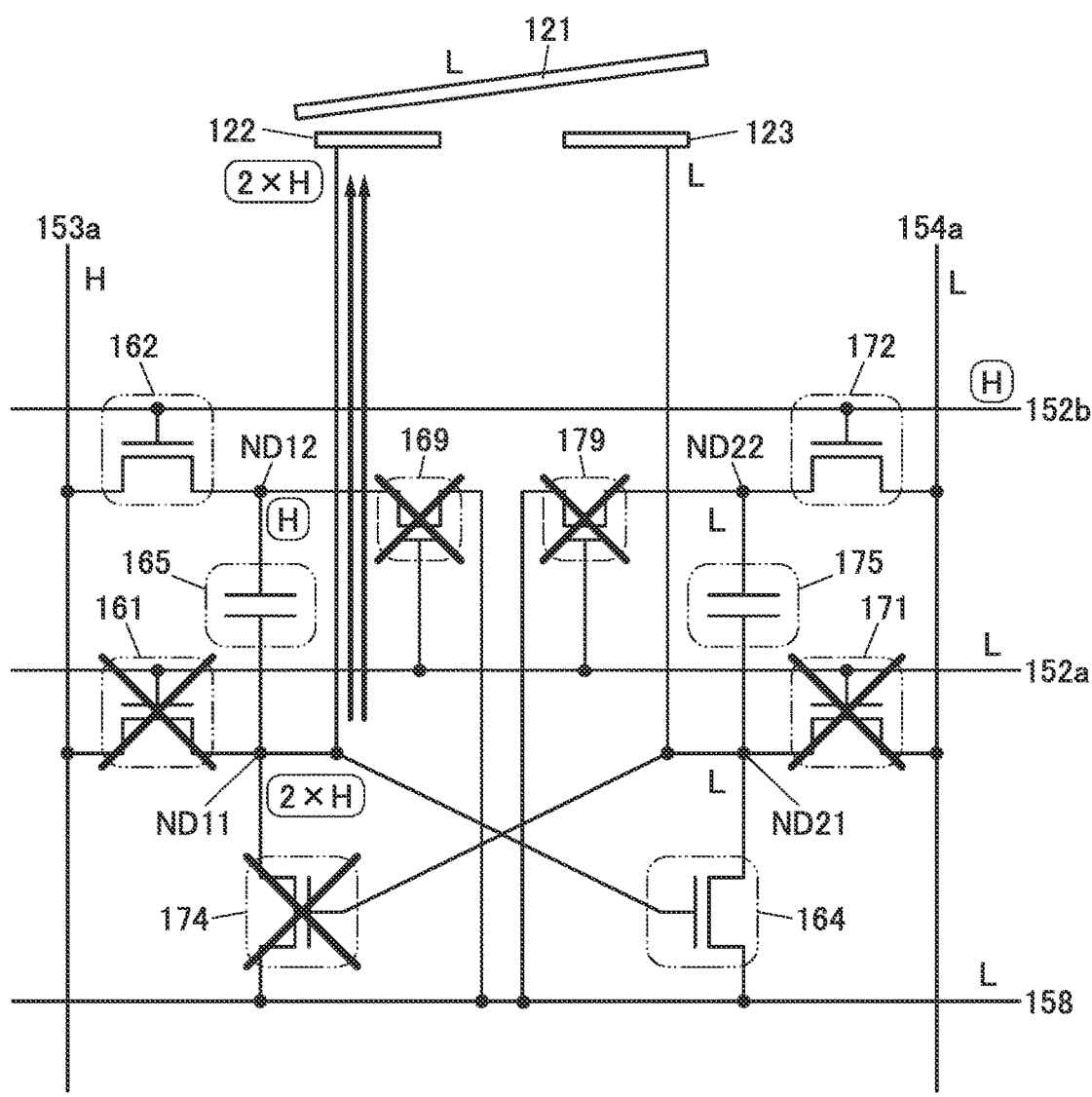
FIG. 26 is a view illustrating an operation state of a micromachine.

In the period T3, the H potential is supplied to the wiring 152b (see FIG. 26). Then, the transistor 162 and the transistor 172 are turned on. When the transistor 162 is turned on, the potential of the node ND12 increases from the L potential to the H potential. The node ND11 is in a floating state, and the node ND11 is capacitively coupled to the node ND12 by the capacitor 165. Accordingly, when the potential of the node ND12 increases from the L potential to the H potential, the potential of the node ND11 also increases in proportion to the potential change of the node ND12. That is, the potential of the node ND11 becomes a potential that is twice as high as the H potential (2×H potential). As a result, the potential of the electrode 122 also becomes twice as high as the H potential.

The 2×H potential is supplied to the electrode 122, whereby the electrode 121 is drawn to the electrode 122 by Coulomb force and then tilts to the electrode 122 side.

[Period T4]

Figure 27:
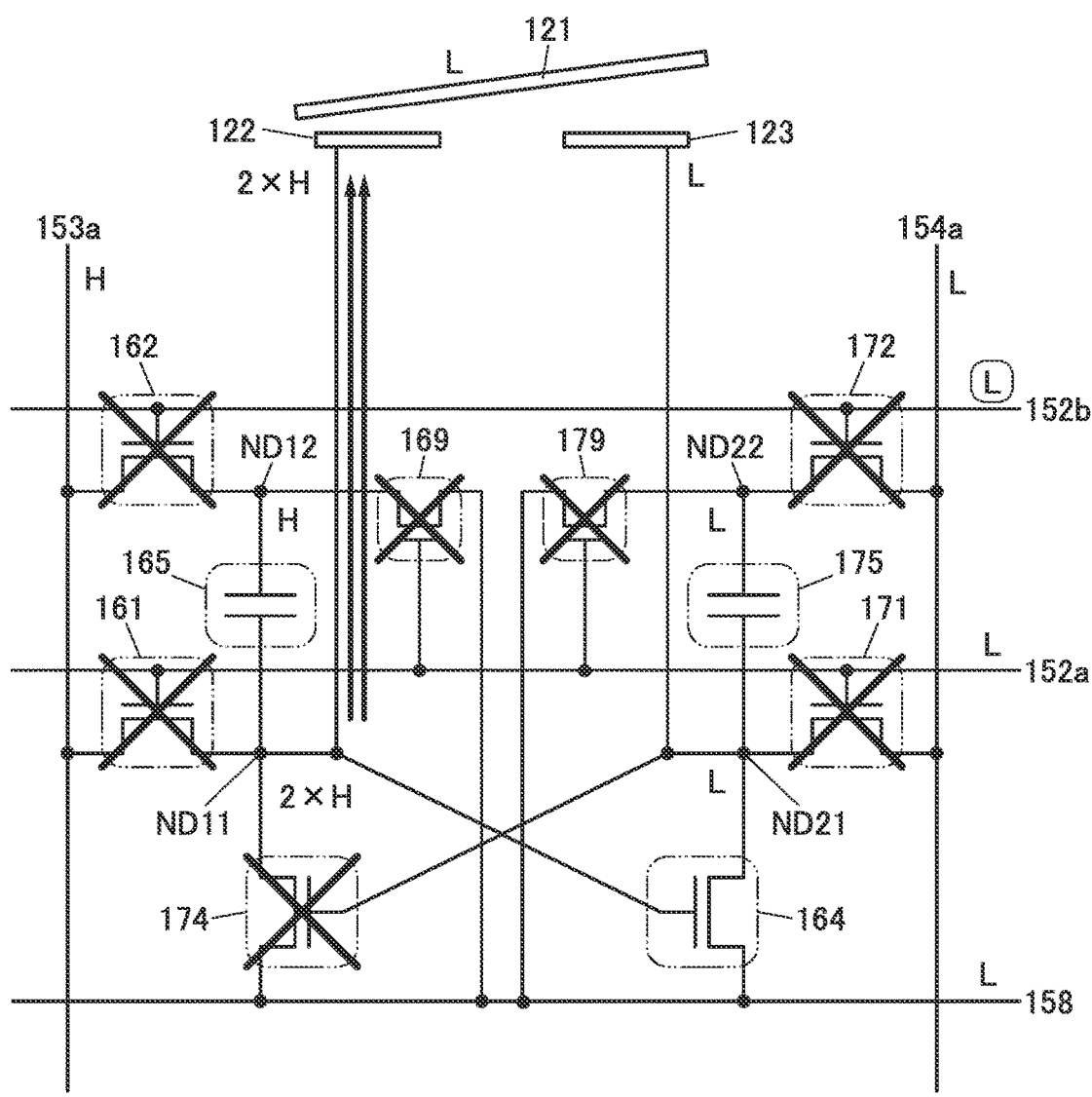
FIG. 27 is a view illustrating an operation state of a micromachine.

In the period T4, the L potential is supplied to the wiring 152b (see FIG. 27). Then, the transistor 162 and the transistor 172 are turned off. When the transistor 162 is turned off, the charge of the node ND12 is retained. Similarly, when the transistor 172 is turned off, the charge of the node ND22 is retained.

[Period T5]

Figure 28:
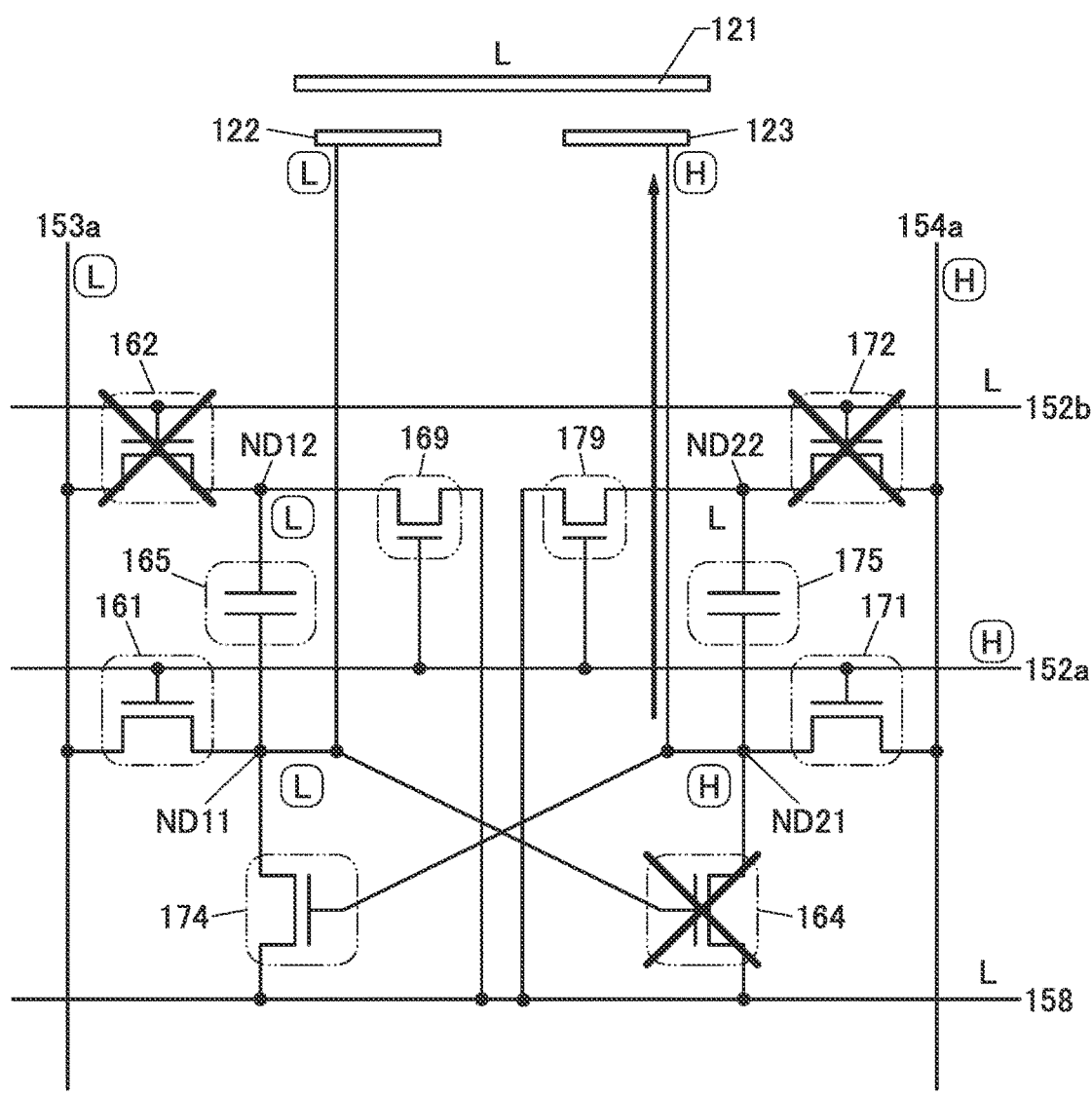
FIG. 28 is a view illustrating an operation state of a micromachine.

In the period T5, the L potential is supplied to the wiring 153a, and the H potential is supplied to the wiring 152a and the wiring 154a (see FIG. 28). Then, the transistor 161 is turned on, and the L potential is supplied to the node ND11 through the wiring 153a. Thus, the potential of the electrode 122 becomes the L potential.

The transistor 171 is turned on, and the H potential is supplied to the node ND21 through the wiring 154a. When the node ND11 has the L potential, the transistor 164 is turned off. When the node ND21 has the H potential, the transistor 174 is turned on. When the transistor 174 is turned on, the L potential is supplied to the node ND11 through the wiring 158.

The transistor 169 is turned on, and the L potential is supplied to the node ND12 through the wiring 158. The transistor 179 is turned on, and the L potential is supplied to the node ND22 through the wiring 158.

[Period T6]

Figure 29:
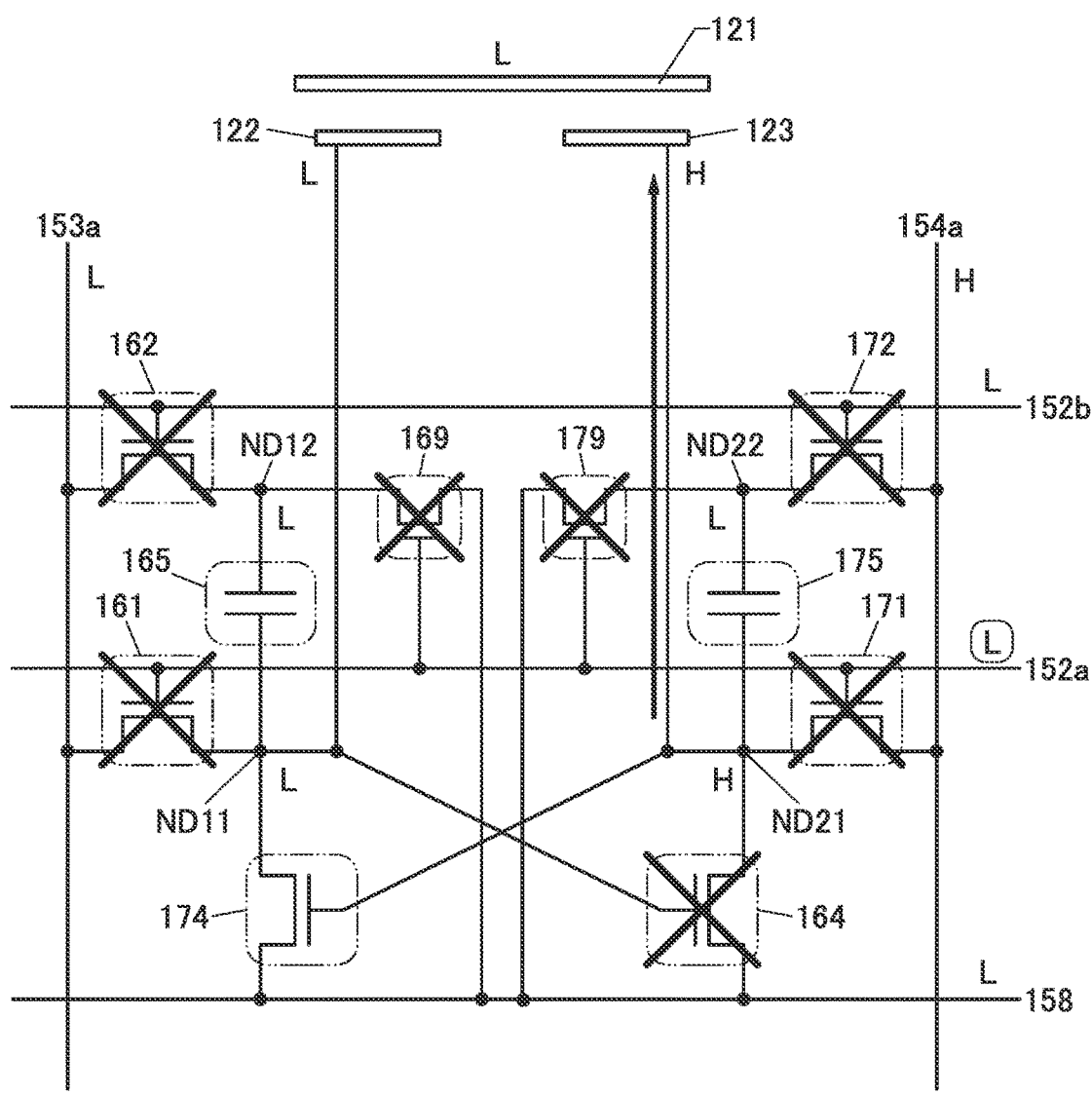
FIG. 29 is a view illustrating an operation state of a micromachine.

In the period T6, the L potential is supplied to the wiring 152a (see FIG. 29). Then, the transistor 161, the transistor 171, the transistor 162, the transistor 172, the transistor 169, and the transistor 179 are turned off, and the charges of the node ND11, the node ND21, the node ND12, and the node ND22 are retained.

When the transistor 161, the transistor 171, the transistor 162, the transistor 172, the transistor 169, and the transistor 179 are brought into an off state, the node ND11, the node ND21, the node ND12, and the node ND22 are brought into a floating state.

[Period T7]

Figure 30:
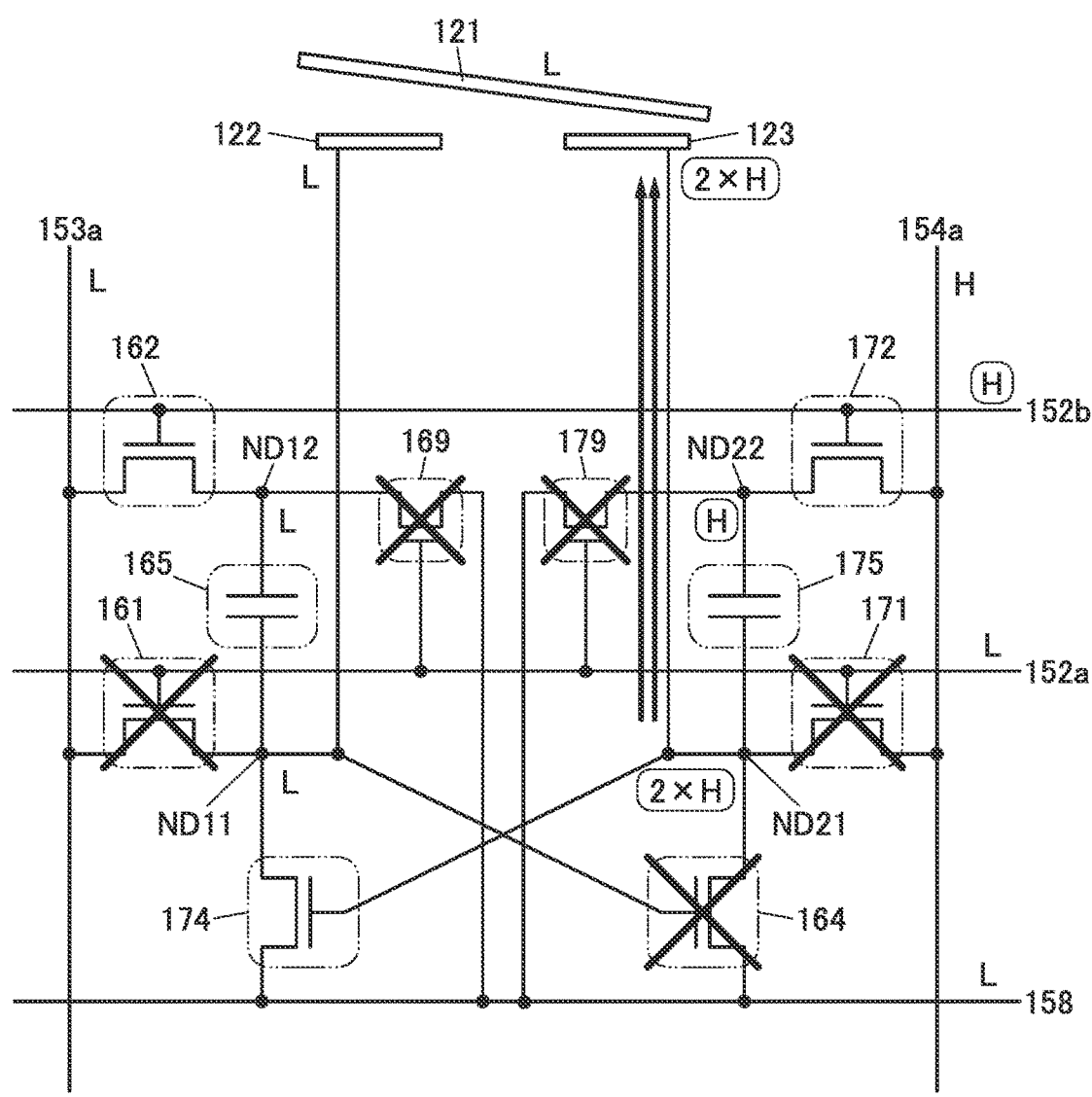
FIG. 30 is a view illustrating an operation state of a micromachine.

In the period T7, the H potential is supplied to the wiring 152b (see FIG. 30). Then, the transistor 162 and the transistor 172 are turned on. When the transistor 172 is turned on, the potential of the node ND22 increases from the L potential to the H potential. The node ND21 is in a floating state, and the node ND21 is capacitively coupled to the node ND22 by the capacitor 175. Accordingly, when the potential of the node ND22 increases from the L potential to the H potential, the potential of the node ND21 also increases in proportion to the potential change of the node ND22. That is, the potential of the node ND21 becomes a potential that is twice as high as the H potential (2×H potential). As a result, the potential of the electrode 123 also becomes twice as high as the H potential.

The 2×H potential is supplied to the electrode 123, whereby the electrode 121 is drawn to the electrode 123 by Coulomb force and then tilts to the electrode 123 side.

[Period T8]

Figure 31:
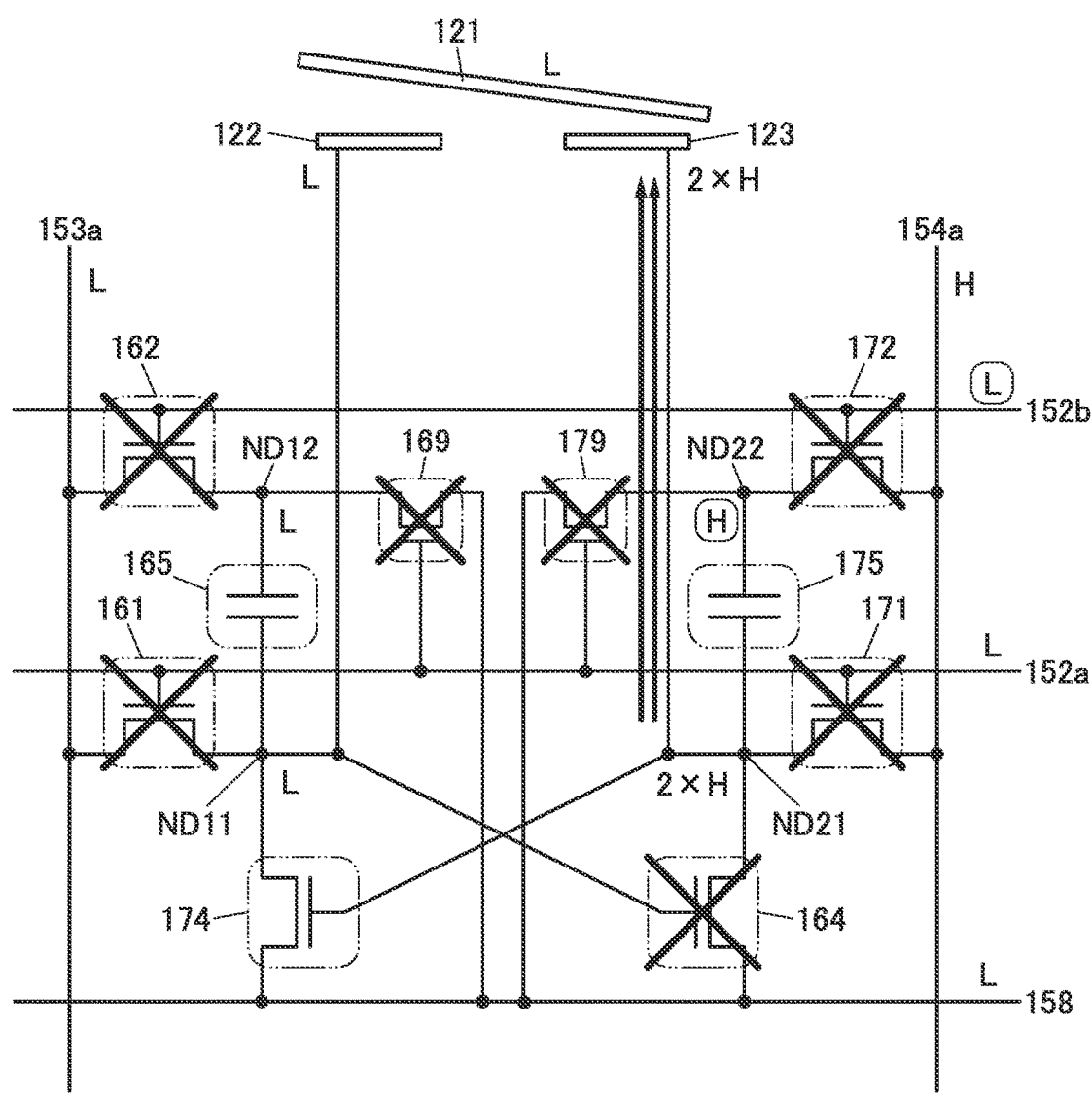
FIG. 31 is a view illustrating an operation state of a micromachine.

In the period T8, the L potential is supplied to the wiring 152b (see FIG. 31). Then, the transistor 162 and the transistor 172 are turned of. When the transistor 162 is turned off, the charge of the node ND12 is retained. Similarly, when the transistor 172 is turned off, the charge of the node ND22 is retained.

<Example of Display Element>

Figure 32:
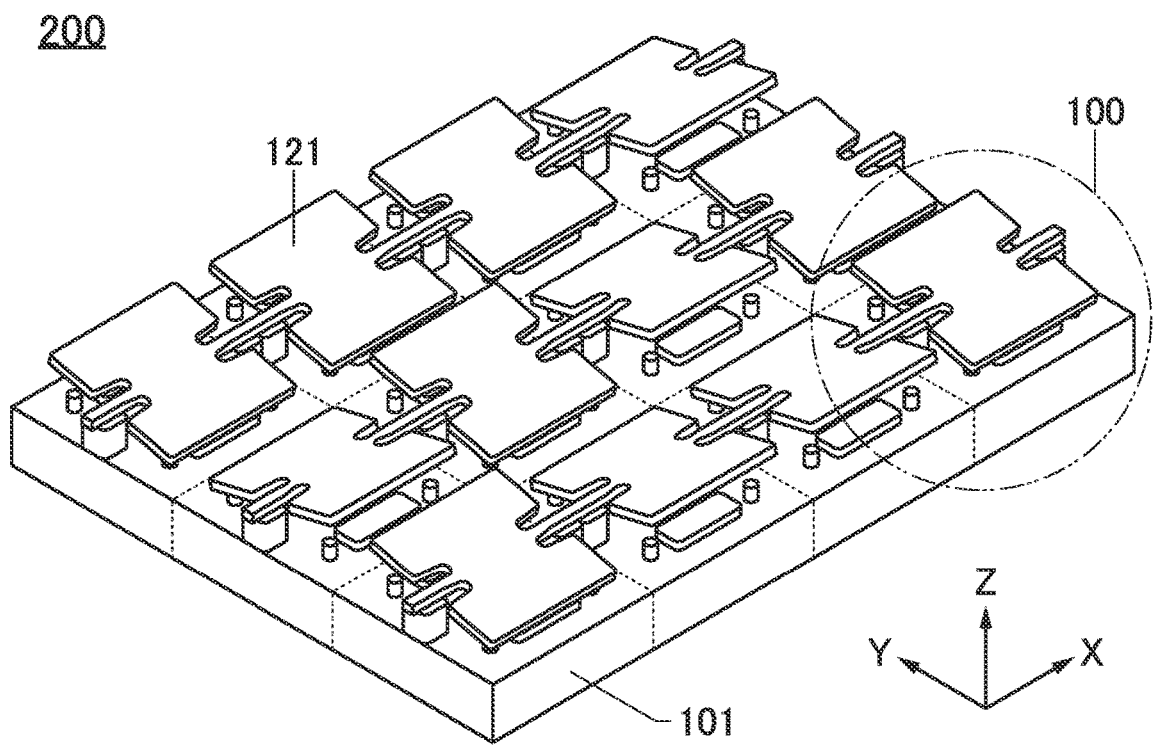
FIG. 32 is a perspective view of a display element.

A plurality of micromachines 100 can be arranged in a matrix to have a function as display elements displaying letters and an image. As an example, FIG. 32 illustrates a perspective view of a display element 200. The display element 200 illustrated as an example in FIG. 32 includes twelve micromachines 100 arranged in a matrix of 4×3. In other words, the display element 200 includes an electrostatic actuator group arranged in a matrix of 4×3.

For example, using the micromachines 100 arranged in a matrix of 1920×1080, the display element 200 that can achieve an image with what is called full high definition (also referred to as "2K resolution", "2K1K", "2K", or the like) can be obtained. In addition, for example, using the micromachines 100 arranged in a matrix of 4096×2160, the display element 200 that can achieve an image with what is called ultra high definition (also referred to as "4K resolution", "4K2K", "4K", or the like) can be obtained. Moreover, for example, using the micromachines 100 arranged in a matrix of 8192×4320, the display element 200 that can achieve an image with what is called super high definition (also referred to as "8K resolution", "8K4K", "8K", or the like) can be obtained. By increasing the number of display elements, the display element 200 that can achieve an image with 16K or 32K resolution can be obtained.

<Example of Display Device>

Structure examples of a display device 300 using the display element 200 and operations thereof will be described with reference to FIG. 33A and FIG. 33B. The display device 300 includes a light source 301, the display element 200, and a lens 302. Note that in FIG. 33A and FIG. 331B, one of the micromachines 100 included in the display element 200 is illustrated as the display element 200.

Figure 33:
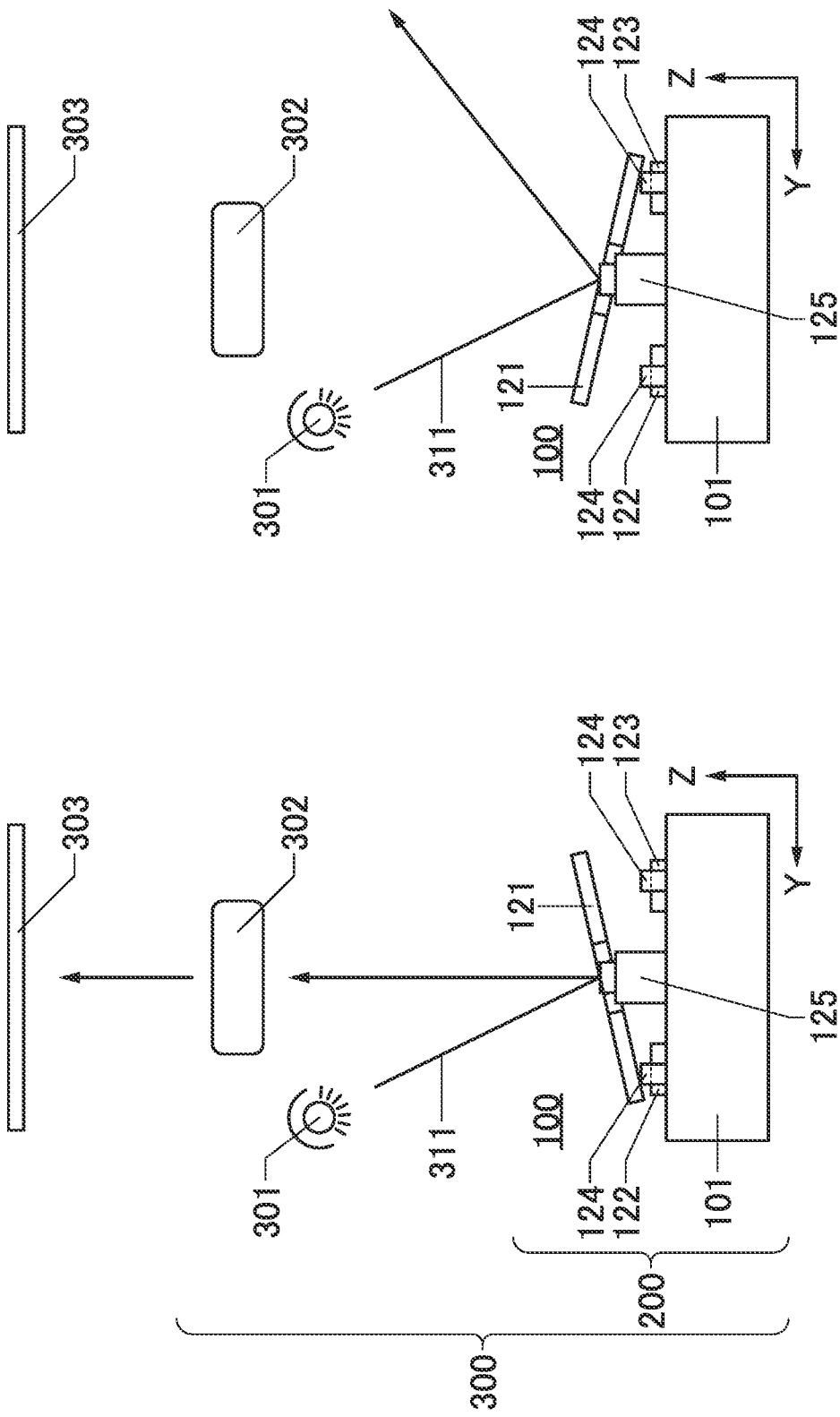
FIG. 33A and FIG. 33B are views illustrating operation examples of a display device.

When the electrode 121 tilts to the electrode 122 side, a light 311 emitted from the light source 301 is reflected by the electrode 121, enters the lens 302, and is projected on a screen 303 (see FIG. 33A). The state of the micromachine 100 at this time is referred to as an on state.

When the electrode 121 tilts to the electrode 123 side, the light 311 emitted from the light source 301 is reflected by the electrode 121 but does not enter to the lens 302 (see FIG. 33B). Thus, the light 311 emitted from the light source 301 is not projected on the screen 303. The state of the micromachine 100 at this time is referred to as an off state. When a frequency of switching an on state and an off state of the micromachine 100 is adjusted, grayscale display (time grayscale) utilizing an afterimage phenomenon of eyes can be achieved.

When a color filter in which RGB is changed sequentially is provided between the light source 301 and the micromachine 100 or between the micromachine 100 and the screen 303, color display can be achieved.

One embodiment of the present invention can be used for another MEMS element other than DMD. For example, one embodiment of the present invention can be used for a DMS (Digital Micro Shutter) shutter, a GLV (Grating Light Valve), an RF MEMS, or the like. Alternatively, one embodiment of the present invention can be used for MIRASOL (registered trademark), an IMOD (interferometric modulation) element, a shutter type MEMS display element, an optical-interference-type MEMS display element, or the like.

In this specification and the like, a micromachine, a display element, and a display device that is a device including a display element can be combined with a variety of elements. Examples of such an element include an EL (electroluminescence) element (an EL element containing organic and inorganic materials, an organic EL element, or an inorganic EL element), an LED (e.g., a white LED, a red LED, a green LED, or a blue LED), a transistor that emits light depending on a current, an electron emitter, a liquid crystal element, electronic ink, an electrophoretic element, an electrowetting element, a piezoelectric ceramic, and a carbon nanotabe.

Examples of display devices using EL elements include an EL display. Examples of display devices using electron emitters include a field emission display (FED), an SED-type flat panel display (SED: Surface-conduction Electron-emitter Display), and the like. Examples of display devices using liquid crystal elements include a liquid crystal display (a transmissive liquid crystal display, a transflective liquid crystal display, a reflective liquid crystal display, a direct-view liquid crystal display, or a projection liquid crystal display) and the like. Examples of display devices using electronic ink, electronic liquid powder (registered trademark), or an electrophoretic element include electronic paper and the like.

Note that in the case where an LED is used in combination, graphene or graphite may be provided under an electrode or a nitride semiconductor of the LED. Graphene or graphite may be a multilayer film in which a plurality of layers are stacked. Providing graphene or graphite as described above facilitates deposition of a nitride semiconductor, such as an n-type GaN semiconductor layer containing crystals, thereover. Furthermore, a p-type GaN semiconductor layer containing crystals or the like can be provided thereover to form the LED. Note that an AlN layer may be provided between graphene or graphite and the n-type GaN semiconductor layer containing crystals. The GaN semiconductor layer included in the LED may be deposited by MOCVD. Note that when graphene is provided, the GaN semiconductor layer included in the LED can be deposited by a sputtering method.

Figure 34:
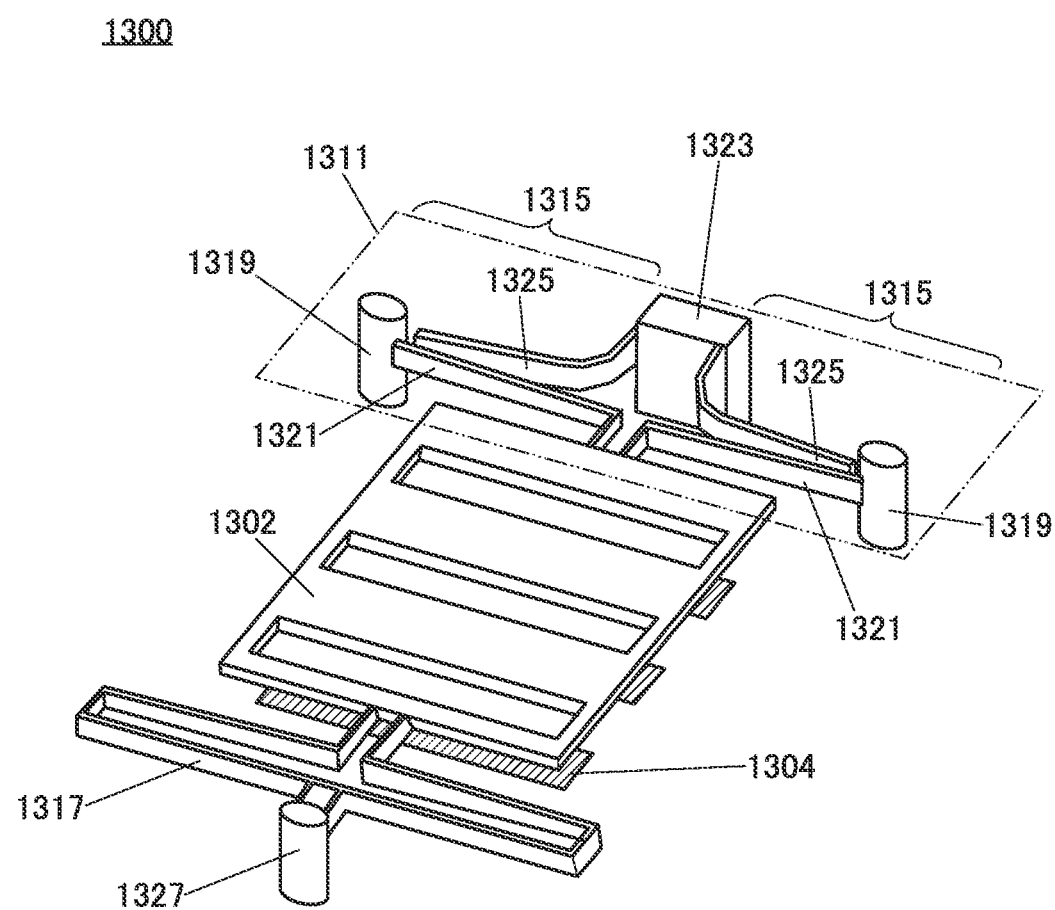
FIG. 34 is a view illustrating an example of a micromachine.

As another example of the micromachine, FIG. 34 illustrates a structure example of a MEMS shutter as a shutter 1300. The shutter 1300 illustrated in FIG. 34 is a kind of electrostatic actuator. The shutter 1300 illustrated in FIG. 34 includes a movable light-blocking layer 1302 bonded to an actuator 1311. The actuator 1311 is provided over a light-blocking layer (not illustrated to avoid complexity) having an opening portion 1304 and includes two actuators 1315 having flexibility. One side of the movable light-blocking layer 1302 is electrically connected to the actuators 1315. The actuators 1315 have a function of moving the movable light-blocking layer 1302 in a lateral direction parallel to the surface of the light-blocking layer having the opening portion 1304.

The actuators 1315 each include a movable electrode 1321 electrically connected to the movable light-blocking layer 1302 and a structure body 1319, and a movable electrode 1325 electrically connected to a structure body 1323. The movable electrode 1325 is adjacent to the movable electrode 1321, and one end of the movable electrode 1325 is electrically connected to the structure body 1323 and the other end thereof can be freely moved. The other end of the movable electrode 1325 that can be moved freely is curved so as to be closest to a connection portion of the movable electrode 1321 and the structure body 1319.

The other side of the movable light-blocking layer 1302 is connected to a spring 1317 having restoring force to resist force applied by the actuator 1311. The spring 1317 is connected to a structure body 1327.

The structure bodies 1319, the structure body 1323, and the structure body 1327 function as mechanical supports that make the movable light-blocking layer 1302, the actuators 1315, and the spring 1317 float in the vicinity of the surface of the light-blocking layer having the opening portion 1304.

Under the movable light-blocking layer 1302, the opening portions 1304 surrounded by the light-blocking layer are provided. Note that the shapes of the movable light-blocking layer 1302 and the opening portion 1304 are not limited thereto.

The structure body 1323 included in the shutter 1300 is electrically connected to a transistor (not illustrated). The transistor is a transistor for driving the movable light-blocking layer 1302. Thus, a given voltage can be applied through the transistor to the movable electrode 1325 connected to the structure body 1323. The structure bodies 1319 and the structure body 1327 are each connected to a ground electrode. Accordingly, the movable electrode 1321 connected to the structure body 1319 and the spring 1317 connected to the structure body 1327 each have a ground potential. Note that the structure bodies 1319 and the structure body 1327 may also be electrically connected to a common electrode which can apply a given voltage. The structure body 1319 and the structure body 1327 may be replaced with another actuator 1311 so that the shutter includes the two actuators 1311.

When a voltage is applied to the movable electrode 1325, the movable electrode 1321 and the movable electrode 1325 are electrically attracted to each other by a potential difference between the movable electrode 1325 and the movable electrode 1321. As a result, the movable light-blocking layer 1302 connected to the movable electrode 1321 is drawn to the structure body 1323 and moves to the structure body 1323 in the lateral direction. Since the movable electrode 1321 serves as a spring, when the potential difference between the movable electrode 1321 and the movable electrode 1325 is removed, the movable electrode 1321 releases the stress stored in the movable electrode 1321 and pushes the movable light-blocking layer 1302 back to the original position. In a state where the movable electrode 1321 is drawn to the movable electrode 1325, the movable light-blocking layer 1302 may be set to cover the opening portion 1304 or the movable light-blocking layer 1302 may be set to be positioned so as not to overlap with the opening portion 1304.

This embodiment can be implemented in combination with any of the structures described in the other embodiments and the like, as appropriate.

Embodiment 2

In this embodiment, a stacked-layer structure example of the micromachine 100 will be described with reference to drawings. Structure examples of transistors that can be used as the transistor 161 to the transistor 164, the transistor 171 to the transistor 174, the transistor 169, and the transistor 179 will be described with reference to drawings.

<Stacked-Layer Structure Example 1 of Micromachine 100>

Figure 35:
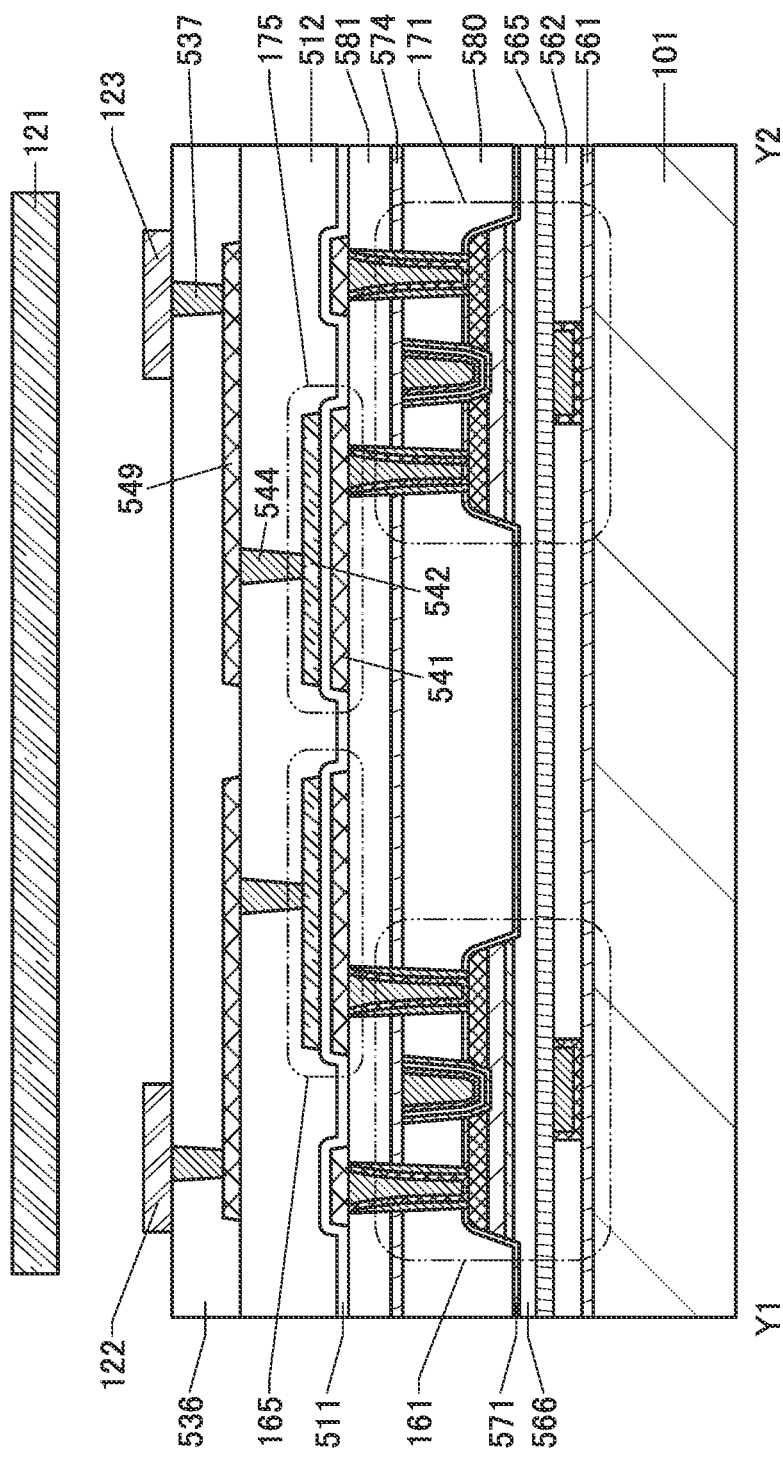
FIG. 35 is a view illustrating an example of a stacked-layer structure of a micromachine.

FIG. 35 illustrates a stacked-layer structure example of the micromachine 100. FIG. 35 is a cross-sectional view corresponding to a portion indicated by a dashed-dotted line Y1-Y2 shown in FIG. 2A. FIG. 35 illustrates the transistor 161, the transistor 171, the capacitor 165, the capacitor 175, and the like included in the micromachine 100.

In FIG. 35, the micromachine 100 includes the substrate 101, an insulating layer 561, an insulating layer 562, an insulating layer 565, an insulating layer 566, an insulating layer 571, an insulating layer 580, an insulating layer 574, an insulating layer 581, an insulating layer 511, an insulating layer 512, and an insulating layer 536. In addition, the micronmachine 100 includes a conductive layer 541, a conductive layer 542, a conductive layer 544, a conductive layer 549, and a conductive layer 537. Moreover, the micromachine 100 includes the electrode 121 over the electrode 122 and the electrode 123 with a space therebetween.

The conductive layer 541 is provided over the insulating layer 581. The insulating layer 511 is provided over the conductive layer 541, and the conductive layer 542 is provided over the insulating layer 511. The conductive layer 541 and the conductive layer 542 have a region where they overlap each other with the insulating layer 511 provided therebetween, and the region functions as the capacitor 175. The capacitor 165 has a structure similar to that of the capacitor 175.

In FIG. 35, one of the source and the drain of the transistor 171 is electrically connected to the conductive layer 541. The conductive layer 542 is electrically connected to the conductive layer 549 provided over the insulating layer 512 through the conductive layer 544 embedded in the insulating layer 512. The conductive layer 549 is electrically connected to the electrode 123 provided over the insulating layer 536 through the conductive layer 537 embedded in the insulating layer 536.

Like the conductive layer 544 and the conductive layer 537, a conductive layer that is provided so as to be embedded in an insulating layer and connects a conductive layer of an upper layer and a conductive layer of a lower layer is referred to as a "contact plug" in some cases.

Note that the connection of the transistor 161, the capacitor 165, and the electrode 122 can be understood by replacement with the connection of the transistor 171, the capacitor 175, and the electrode 123; thus, a detailed description thereof is omitted.

<Stacked-Layer Structure Example 2 of Micromachine 100>

Figure 36:
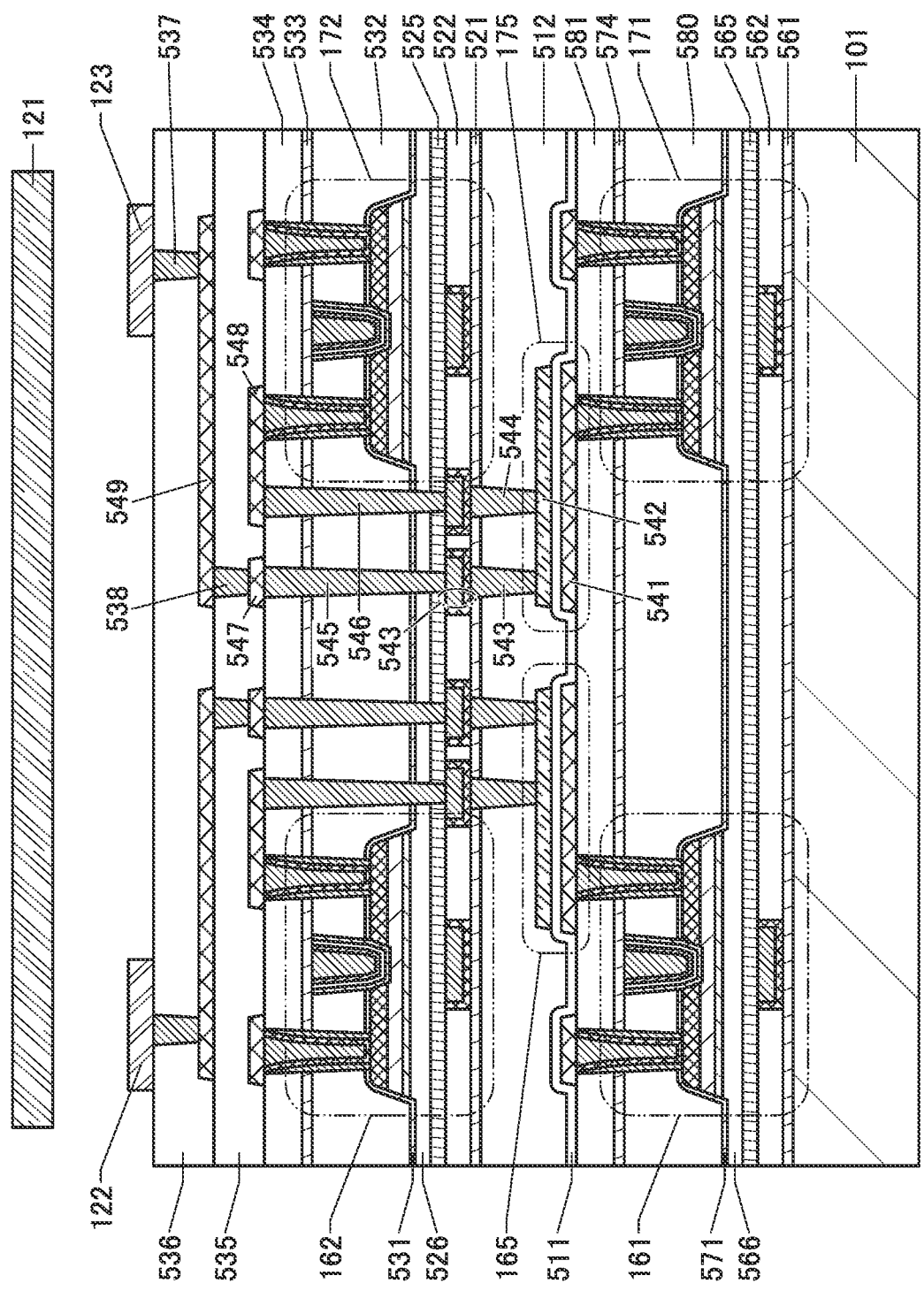
FIG. 36 is a view illustrating an example of a stacked-layer structure of a micromachine.

FIG. 36 illustrates a modification example of the micromachine 100 described with reference to FIG. 35. In the micromachine 100, another transistor may be provided over the transistor. FIG. 36 illustrates an example in which the transistor 162 and the transistor 172 are stacked over the transistor 161 and the transistor 171.

The micromachine 100 illustrated in FIG. 36 includes an insulating layer 521, an insulating layer 522, an insulating layer 525, an insulating layer 526, an insulating layer 531, an insulating layer 532, an insulating layer 533, an insulating layer 534, and an insulating layer 535 in addition to the components illustrated in FIG. 35. Moreover, the micromachine 100 illustrated in FIG. 36 includes a conductive layer 543, a conductive layer 545, a conductive layer 546, a conductive layer 547, a conductive layer 548, and a conductive layer 538.

In FIG. 36, one of the source and the drain of the transistor 172 is electrically connected to the conductive layer 548 provided over the insulating layer 534. The conductive layer 548 is electrically connected to the conductive layer 542 through the conductive layer 546 embedded in the insulating layer 534, the insulating layer 533, the insulating layer 532, the insulating layer 531, the insulating layer 526, and the insulating layer 525, a conductive layer embedded in the insulating layer 522, and the conductive layer 544 embedded in the insulating layer 521 and the insulating layer 512.

The conductive layer 542 is electrically connected to the conductive layer 547 provided over the conductive layer 534 through the conductive layer 543 embedded in the insulating layer 521 and the insulating layer 512, the conductive layer 543 embedded in the insulating layer 522, and the conductive layer 545 embedded in the insulating layer 534, the insulating layer 533, the insulating layer 532, the insulating layer 531, the insulating layer 526, and the insulating layer 525.

The conductive layer 547 is electrically connected to the electrode 123 provided over the insulating layer 536 through the conductive layer 538 embedded in the insulating layer 535, the conductive layer 549 provided over the insulating layer 535, and the conductive layer 537 embedded in the insulating layer 536.

Note that the connection of the transistor 162, the capacitor 165, and the electrode 122 can be understood by replacement with the connection of the transistor 172, the capacitor 175, and the electrode 123; thus, a detailed description thereof is omitted.

Stacking transistors can reduce the area occupied by the circuit 151, whereby a further miniaturized micromachine can be manufactured.

<Constituent Materials>

Next, materials that can be used for the micromachine 100 will be described.

[Substrate]

Examples of a substrate include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance high enough to withstand the processing temperature in this embodiment may be used. Examples of the glass substrate include barium borosilicate glass, aluminosilicate glass, aluminoborosilicate glass, and soda lime glass. Alternatively, crystallized glass or the like can be used.

Alternatively, a flexible substrate, an attachment film, paper including a fibrous material, a base material film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples are polypropylene, polyester, polyvinyl fluoride, and polyvinyl chloride. Other examples are polyamide, polyimide, aramid, epoxy, an inorganic vapor deposition film, and paper. In particular, the use of a semiconductor substrate, a single crystal substrate, an SOI substrate, or the like enables the manufacture of small-sized transistors with a small variation in characteristics, size, shape, or the like and with high current capability. When a circuit is formed with such transistors, lower power consumption of the circuit or higher integration of the circuit can be achieved.

Alternatively, a flexible substrate may be used as the substrate, a transistor and a micromachine may be directly formed over the flexible substrate. Alternatively, a separation layer may be provided between the substrate and the transistor and the like. After part or the whole of a semiconductor device is completed over the separation layer, the separation layer can be used for separation from the substrate and transfer to another substrate. In that case, the transistor can be transferred to even a substrate having low heat resistance or a flexible substrate. As the separation layer, a stacked-layer structure of inorganic films of a tungsten film and a silicon oxide film, or a structure in which an organic resin film of polyimide or the like is formed over a substrate can be used, for example.

That is, at least one of a transistor and the micromachine is formed using one substrate, and then at least one of a transistor and the micromachine may be transferred to another substrate to provide at least one of the transistor and the micromachine over the another substrate. Examples of the substrate to which at least one of the transistor and the micromachine is transferred include, in addition to the above-described substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupro, rayon, or regenerated polyester), or the like), a leather substrate, and a rubber substrate. When such a substrate is used, forming a transistor with excellent characteristics, forming a transistor with low power consumption, manufacturing a semiconductor device with high durability, providing high heat resistance, reducing weight, or reducing thickness can be achieved.

[Insulating Layer]

Examples of a material that can be used for an insulating layer include an oxide, a nitride, an oxynitride, a nitride oxide, a metal oxide, a metal oxynitride, and a metal nitride oxide, each of which has an insulating property. As scaling down and high integration of the transistor progress, for example, a problem such as leakage current may arise because of a thinner gate insulating layer. When a high-k material is used for an insulating layer functioning as a gate insulating layer, the driving voltage of the transistor can be lowered while the physical thickness of the gate insulating layer is kept. By contrast, when a material with low dielectric constant is used as an insulator functioning as an interlayer insulating film, parasitic capacitance generated between wirings can be reduced. Thus, a material is preferably selected in accordance with the function of an insulating layer.

In addition, examples of insulators with high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of insulators with low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In the case where an OS transistor is used as the transistor, the transistor is surrounded by an insulating layer having a function of inhibiting transmission of oxygen and impurities such as hydrogen, so that the transistor can have stable electrical characteristics. As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide, or silicon nitride; or the like can be used.

In addition, when an OS transistor is used as the transistor, the insulating layer functioning as the gate insulating layer is preferably an insulator including a region containing oxygen released by heating. For example, when a structure in which silicon oxide or silicon oxynitride including a region containing oxygen released by heating is in contact with a semiconductor layer is employed, oxygen vacancies included in the semiconductor layer can be compensated for.

Note that in this specification and the like, a nitride oxide refers to a compound that includes more nitrogen than oxygen. An oxynitride refers to a compound that includes more oxygen than nitrogen. The content of each element can be measured by Rutherford backscattering spectrometry (RIBS), for example.

When an OS transistor is used as the transistor, the hydrogen concentration in the insulating layer is preferably lowered in order to prevent an increase in the hydrogen concentration in the semiconductor layer. Specifically, the hydrogen concentration in the insulating layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$ in secondary ion mass spectrometry (SIMS). It is particularly preferable to lower the hydrogen concentration in the insulating layer in contact with the semiconductor layer.

When an oxide semiconductor, which is one kind of metal oxide, is used for the semiconductor layer, the nitrogen concentration in the insulating layer is preferably lowered in order to prevent an increase in the nitrogen concentration in the semiconductor layer. Specifically, the nitrogen concentration in the insulating layer is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

It is preferred that at least a region of the insulating layer in contact with the semiconductor layer and a region of the insulating layer in contact with at least the semiconductor layer have few defects and typically have as few signals observed by electron spin resonance (ESR) spectroscopy as possible. An example of the signals is an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E center is lower than or equal to $3\times10^{17}$ spins/cm$^3$, preferably lower than or equal to $5\times10^{16}$ spins/cm$^3$ is used.

In addition to the above-described signal, a signal due to nitrogen dioxide (NO$_2$) may be observed. The signal is divided into the following three signals according to the N nuclear spin: a signal observed at a g-factor greater than or equal to 2.037 and less than or equal to 2.039 (referred to as a first signal), a signal observed at a g-factor greater than or equal to 2.001 and less than or equal to 2.003 (referred to as a second signal), and a signal observed at a g-factor greater than or equal to 1.964 and less than or equal to 1.966 (referred to as a third signal).

For example, as the insulating layer, it is suitable to use an insulating layer whose spin density of a signal due to nitrogen dioxide ($NO_2$) is higher than or equal to $1\times10^{17}$ spins/cm$^3$ and lower than $1\times10^{18}$ spins/cm$^3$ Note that nitrogen oxide ($NO_x$) including nitrogen dioxide ($NO_2$) forms a state in the insulating layer. The state is positioned in the energy gap of the oxide semiconductor layer. Thus, when nitrogen oxide ($NO_x$) is diffused into the interface between the insulating layer and the oxide semiconductor layer, an electron may be trapped by the state on the insulating layer side. As a result, the trapped electron remains in the vicinity of the interface between the insulating layer and the oxide semiconductor layer; hence, the threshold voltage of the transistor is shifted in the positive direction. Accordingly, the use of a film with a low nitrogen oxide content as the insulating layer and the insulating layer can reduce a shift in the threshold voltage of the transistor.

As an insulating layer that releases a small amount of nitrogen oxide ($NO_x$), for example, a silicon oxynitride layer can be used. The silicon oxynitride layer is a film that releases more ammonia than nitrogen oxide ($NO_x$) in thermal desorption spectroscopy (TDS); the typical released amount of ammonia is greater than or equal to $1\times10^8$ molecules/cm$^3$ and less than or equal to $5\times10^{19}$ molecules/cm$^3$. Note that the released amount of ammonia is the total amount in the range of the heat treatment temperature in TDS from 50° C. to 650° C. or from 50° C. to 550° C.

Since nitrogen oxide ($NO_x$) reacts with ammonia and oxygen in heat treatment, the use of an insulating layer that releases a large amount of ammonia reduces nitrogen oxide ($NO_x$).

At least one of the insulating layers in contact with the oxide semiconductor layer is preferably formed using an insulating layer that contains more oxygen than oxygen in the stoichiometric composition. Alternatively, at least one of the insulating layers in contact with the oxide semiconductor layer is preferably formed using an insulating layer from which oxygen is released by heating. Specifically, it is preferable to use an insulating layer in which the amount of released oxygen converted into oxygen atoms is $1.0\times10^{18}$ atoms/cm$^3$ or more, $1.0\times10^{19}$ atoms/cm$^3$ or more, or $1.0\times10^{20}$ atoms/cm$^3$ or more in TDS performed with heat treatment where the surface temperature of the insulating layer is higher than or equal to 100° C. and lower than or equal to 700° C., preferably higher than or equal to 100° C. and lower than or equal to 500° C. Note that in this specification and the like, oxygen released by heating is also referred to as "excess oxygen".

Furthermore, an insulating layer containing excess oxygen can also be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used in the treatment for adding oxygen include an oxygen gas such as $^{16}O_2$ or $^{18}O_2$ and a gas containing oxygen, such as a nitrous oxide gas or an ozone gas. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic-based resin, a benzocyclobutene-based resin, polyamide, or an epoxy-based resin can be used. Other than the above organic materials, it is also possible to use a low dielectric constant material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

The surface of the insulating layer may be subjected to chemical mechanical polishing (CMP) treatment (hereinafter also referred to as "CMP treatment"). By the CMP treatment, unevenness of a sample surface can be reduced, and coverage with an insulating layer or a conductive layer to be formed later can be increased.

[Conductive Layer]

For the conductive layer (including an electrode and a wiring), it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing one of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide semiconductor that is a kind of metal oxides is used for a semiconductor layer, a stacked-layer structure in which a material containing the above metal element and a conductive material containing oxygen are combined is preferably used for the conductive layer functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductive layer functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. An indium tin oxide (ITO), an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon is added may be used. An indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

For the conductive material used for a contact plug or the like, a conductive material with high embeddability, such as tungsten or polysilicon, can be used, for example. A conductive material with high embeddability and a barrier layer (a diffusion prevention layer) such as a titanium layer, a titanium nitride layer, or a tantalum nitride layer may be used in combination.

[Semiconductor Layer]

For the semiconductor layer, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, polyparaphenylene vinylene, or the like can be used.

Note that semiconductor layers may be stacked. In the case of stacking semiconductor layers, semiconductors having different crystal states may be used or different semiconductor materials may be used.

The bandgap of an oxide semiconductor, which is one kind of metal oxide, is greater than or equal to 2 eV; thus, the use of the oxide semiconductor for the semiconductor layer can achieve a transistor with an extremely low off-state current. Specifically, the off-state current per micrometer of channel width at room temperature (typically 25° C.) at a voltage between a source and a drain of 3.5 V can be lower than $1\times10^{-20}$ A, lower than $1\times10^{-22}$ A, or lower than $1\times10^{-24}$ A. That is, the on/off ratio can be greater than or equal to 20 digits. In addition, a transistor using an oxide semiconductor for the semiconductor layer (an OS transistor) has high withstand voltage between its source and drain. Thus, a transistor with high reliability can be provided. A transistor with high output voltage and high withstand voltage can be provided. A semiconductor device or the like with high reliability can be provided.

The crystalline Si transistor tends to have relatively high mobility compared with the OS transistor. On the other hand, the crystalline Si transistor has difficulty in achieving an extremely low off-state current such as one in the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. When the oxide semiconductor layer is formed by a sputtering method, a rare gas (typically argon), oxygen, or a mixed gas of a rare gas and oxygen may be used as a sputtering gas. In addition, increasing the purity of a sputtering gas is necessary. For example, as an oxygen gas or a rare gas used as a sputtering gas, a gas that is highly purified to have a dew point of −60° C. or lower, preferably −100° C. or lower is used. When the highly purified sputtering gas is used for the deposition, entry of moisture or the like into the oxide semiconductor layer can be prevented as much as possible.

Furthermore, in the case where the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

[Metal Oxide]

By changing the composition of elements contained in a metal oxide, a conductor, a semiconductor, and an insulator can be formed separately. The metal oxide having conductor properties is referred to as "conductive oxide" in some cases. The metal oxide having semiconductor properties is referred to as "oxide semiconductor" in some cases. The metal oxide having insulator properties is referred to as "insulating oxide" in some cases.

An oxide semiconductor, which is one kind of metal oxide, preferably contains indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In, M, Zn) layer. Furthermore, when indium in the In layer is replaced with the element M, the layer can be referred to as an (In,M) layer.

The CAAC-OS is a metal oxide with high crystallinity. On the other hand, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that an in-Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used in a channel formation region of a transistor will be described.

Note that when the above metal oxide is used in a channel formation region of a transistor, a transistor having high field-effect mobility can be achieved. In addition, the transistor having high reliability can be achieved.

Furthermore, a metal oxide with a low carrier density is preferably used as the transistor. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. For example, a metal oxide has a carrier density lower than $8 \times 10^{11}$ cm$^{-3}$, preferably lower than $1 \times 10^{11}$ cm$^{-3}$, further preferably lower than $1 \times 10^{10}$ cm$^{-3}$, and higher than or equal to $1 \times 10^{-9}$ cm$^{-3}$.

The highly purified intrinsic or substantially highly purified intrinsic metal oxide has a low density of defect states and accordingly has a low density of trap states in some cases.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to be water, and thus forms an oxygen vacancy in some cases. When the channel formation region of the metal oxide includes oxygen vacancies, the transistor tends to have normally-on characteristics. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which the impurities are sufficiently reduced is used in a channel formation region of a transistor, stable electrical characteristics can be given.

Next, structure examples of a transistor 500A and a transistor 500B will be described as structure examples of the transistor that can be used as the transistor 161 to the transistor 164, the transistor 171 to the transistor 174, the transistor 169, and the transistor 179.

Transistor Structure Example 1

Figure 37A:
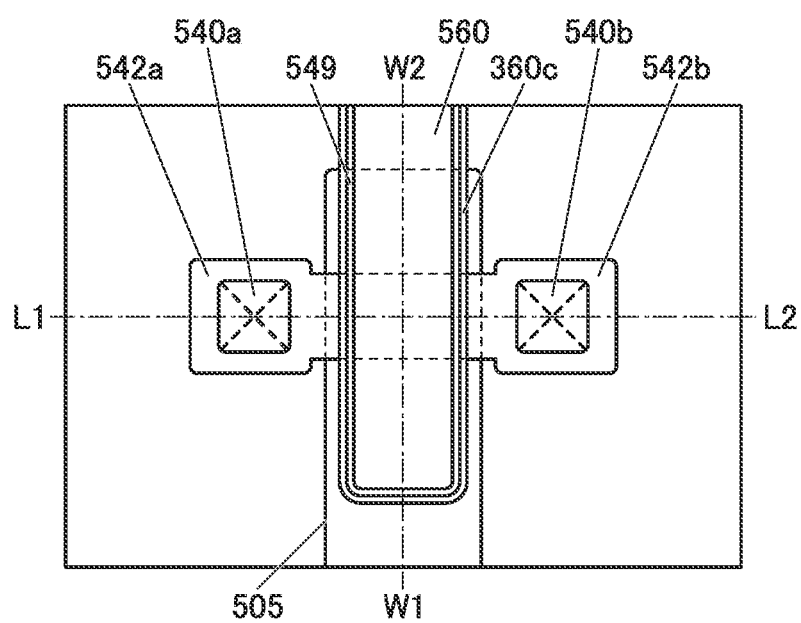
FIG. 37A, FIG. 37B, and FIG. 37C are views illustrating a structure example of a transistor.
Figure 37C:
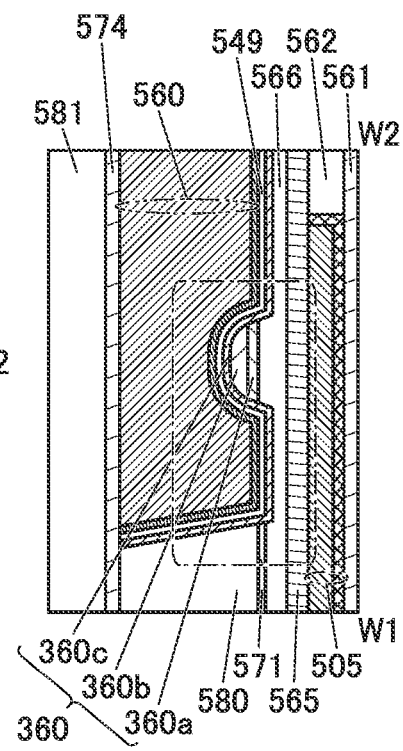
Figure 37B:
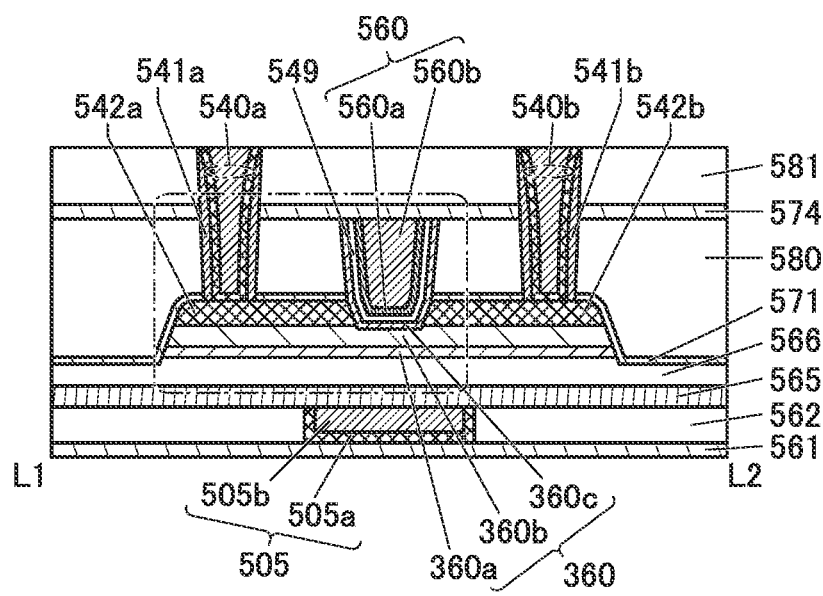

A structure example of the transistor 500A will be described with reference to FIG. 37A, FIG. 37B, and FIG. 37C. FIG. 37A is a top view of the transistor 500A. FIG. 37B is a cross-sectional view of a portion indicated by a dashed-dotted line L1-L2 in FIG. 37A. FIG. 37C is a cross-sectional view of a portion indicated by a dashed-dotted line W1-W2 in FIG. 37A. Note that for simplification of the drawing, some components are not illustrated in the top view in FIG. 37A.

FIG. 37A, FIG. 37B, and FIG. 37C illustrate the transistor 500A, the insulating layer 561 functioning as an interlayer insulating layer, the insulating layer 562, the insulating layer 565, the insulating layer 566, the insulating layer 571, the insulating layer 580, the insulating layer 574, and the insulating layer 581. In addition, a conductive layer 540 (a conductive layer 540a and a conductive layer 540b) that is electrically connected to the transistor 500A and functions as a contact plug is illustrated. Note that an insulating layer 541 (an insulating layer 541a and an insulating layer 541b) is provided in contact with a side surface of the conductive layer 540 functioning as a contact plug.

As the interlayer insulating film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

The transistor 500A includes a conductive layer 560 (a conductive layer 560a and a conductive layer 560b) functioning as a first gate electrode; a conductive layer 505 (a conductive layer 505a and a conductive layer 505b) functioning as a second gate electrode; an insulating layer 549 functioning as a first gate insulating film; the insulating layer 565 and the insulating layer 566 that function as a second gate insulating layer; a semiconductor layer 360 (a semiconductor layer 360a, a semiconductor layer 360b, and a semiconductor layer 360c) including a region where a channel is formed; a conductive layer 542a functioning as one of a source and a drain; a conductive layer 542b functioning as the other of the source and the drain; and the insulating layer 571.

The conductive layer 505 is provided to be embedded in the insulating layer 562, and the insulating layer 565 is provided over the insulating layer 562 and the conductive layer 505. The insulating layer 566 is provided over the insulating layer 565. The semiconductor layer 360 is provided over the insulating layer 566. The insulating layer 549 is provided over the semiconductor layer 360, and the conductive layer 560 (the conductive layer 560a and the conductive layer 560b) is provided over the insulating layer 549.

The conductive layer 542a and the conductive layer 542b are provided in contact with part of the top surface of the semiconductor layer 360b, and the insulating layer 571 is provided in contact with part of the top surface of the insulating layer 566, a side surface of the semiconductor layer 360a, a side surface of the semiconductor layer 360b, a side surface of the conductive layer 542a, the top surface of the conductive layer 542a, a side surface of the conductive layer 542b, and the top surface of the conductive layer 542b.

The insulating layer 541 is provided in contact with the inner wall of an opening formed in the insulating layer 580, the insulating layer 574, and the insulating layer 581. Moreover, a first conductor of the conductive layer 540 is provided in contact with a side surface of the insulating layer 541, and a second conductor of the conductive layer 540 is further provided on the inner side. Here, the height of the top surface of the conductive layer 540 and the height of the top surface of the insulating layer 581 can be substantially level with each other. Note that although the transistor 500A having a structure in which the first conductor of the conductive layer 540 and the second conductor of the conductive layer 540 are stacked is shown, the present invention is not limited thereto. For example, the conductive layer 540 may be provided as a single layer or a stacked-layer structure of three or more layers. In the case where a structure body has a stacked-layer structure, layers may be distinguished by ordinal numbers corresponding to the formation order.

The semiconductor layer 360 preferably includes the semiconductor layer 360a positioned over the insulating layer 566, the semiconductor layer 360b positioned over the semiconductor layer 360a, and the semiconductor layer 360c that is positioned over the semiconductor layer 360b and at least partly in contact with the top surface of the semiconductor layer 360b. When the semiconductor layer 360a is provided below the semiconductor layer 360b, impurities can be inhibited from diffusing into the semiconductor layer 360b from the structures formed below the semiconductor layer 360a. When the semiconductor layer 360c is provided over the semiconductor layer 360b, impurities can be inhibited from diffusing into the semiconductor layer 360b from the structures formed above the semiconductor layer 360c.

In the transistor 500A, an oxide semiconductor that is a kind of metal oxide is preferably used for the semiconductor layer 360. For example, it is preferable to use a metal oxide having a band gap of more than or equal to 2 eV, preferably more than or equal to 2.5 eV as the metal oxide to be the channel formation region of the semiconductor layer 360. With the use of a metal oxide having such a wide bandgap, the off-state current of the transistor can be reduced. A transistor in which the oxide semiconductor is used in a semiconductor layer where the channel is formed exhibits an extremely low leakage current (off-state current) in the off state. Thus, a semiconductor device with reduced power consumption can be achieved. Since the oxide semiconductor can be formed by a sputtering method or the like, a highly integrated semiconductor device can be easily achieved.

For example, for the semiconductor layer 360, a metal oxide such as an In—Al—Zn oxide (the element M is one or more kinds selected from gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, gallium, yttrium, or tin is preferably used as the element MJ. Alternatively, an In-M oxide, an In—Zn oxide, or an M-Zn oxide may be used as the semiconductor layer 360.

Note that when an oxide semiconductor is used for the semiconductor layer 360, the semiconductor layer 360 preferably has a stacked-layer structure of oxides that differ in the atomic ratio of metal atoms. Specifically, the atomic proportion of the element M to the constituent elements in the metal oxide used for the semiconductor layer 360a is preferably greater than that in the metal oxide used for the semiconductor layer 360b. The atomic ratio of the element M to In in the metal oxide used for the semiconductor layer 360a is preferably greater than that in the metal oxide used for the semiconductor layer 360b. The atomic ratio of In to the element M in the metal oxide used for the semiconductor layer 360b is preferably greater than that in the metal oxide used for the semiconductor layer 360a. For the semiconductor layer 360c, a metal oxide that can be used for the semiconductor layer 360a or the semiconductor layer 360b can be used.

The semiconductor layer 360a, the semiconductor layer 360b, and the semiconductor layer 360c preferably have crystallinity, and in particular preferably use a CAAC-OS. An oxide having crystallinity, such as a CAAC-OS, has a dense structure with small amounts of impurities and defects (e.g., oxygen vacancies) and high crystallinity. This can inhibit oxygen extraction from the semiconductor layer 360b by the source electrode or the drain electrode. This can reduce oxygen extraction from the semiconductor layer 360b even when heat treatment is performed; hence, the transistor 500A is stable with respect to high temperatures in the manufacturing process (what is called thermal budget).

Note that one or both of the semiconductor layer 360a and the semiconductor layer 360c may be omitted. The semiconductor layer 360 may be a single layer of the semiconductor layer 360b. In the case where the semiconductor layer 360 is a stack of the semiconductor layer 360a, the semiconductor layer 360b, and the semiconductor layer 360c, the energy of the conduction band minimum of each of the semiconductor layer 360a and the semiconductor layer 360c is preferably higher than the energy of the conduction band minimum of the semiconductor layer 360b. In other words, the electron affinity of each of the semiconductor layer 360a and the semiconductor layer 360c is preferably lower than the electron affinity of the semiconductor layer 360b. In this case, a metal oxide that can be used for the semiconductor layer 360a is preferably used for the semiconductor layer 360c. Specifically, the atomic proportion of the element M to the constituent elements in the metal oxide used for the semiconductor layer 360c is preferably greater than that in the metal oxide used for the semiconductor layer 360b. The atomic ratio of the element M to In in the metal oxide used for the semiconductor layer 360c is preferably greater than that in the metal oxide used for the semiconductor layer 360b. The atomic ratio of In to the element M in the metal oxide used for the semiconductor layer 360b is preferably greater than that in the metal oxide used for the semiconductor layer 360c.

Here, the energy level of the conduction band minimum gradually changes at the junction portions of the semiconductor layer 360a, the semiconductor layer 360b, and the semiconductor layer 360c. In other words, the energy level of the conduction band minimum at the junction portions of the semiconductor layer 360a, the semiconductor layer 360b, and the semiconductor layer 360c continuously changes or is continuously connected. To obtain this, the density of defect states in a mixed layer formed at the interface between the semiconductor layer 360a and the semiconductor layer 360b and the interface between the semiconductor layer 360b and the semiconductor layer 360c is preferably made low.

Specifically, when the semiconductor layer 360a and the semiconductor layer 360b or the semiconductor layer 360b and the semiconductor layer 360c contain the same element (as a main component) in addition to oxygen, a mixed layer with a low density of defect states can be formed. For example, when the semiconductor layer 360b is an In—Ga—Zn oxide, an In—Ga—Zn oxide, a Ga—Zn oxide, gallium oxide, or the like may be used for the semiconductor layer 360a and the semiconductor layer 360c. Furthermore, the semiconductor layer 360c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, a stacked-layer structure of an In—Ga—Zn oxide and an oxide that does not contain In may be employed as the semiconductor layer 360c.

Specifically, for the semiconductor layer 360a, a metal oxide having In:Ga:Zn=1:3:4 [atomic ratio] or 1:1:0.5 [atomic ratio] is used. For the semiconductor layer 360b, a metal oxide having In:Ga:Zn=4:2:3 [atomic ratio] or 3:1:2 [atomic ratio] is used. For the semiconductor layer 360c, a metal oxide having In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of a stacked-layer structure of the semiconductor layer 360c include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the semiconductor layer 360b serves as a main carrier path. When the semiconductor layer 360a and the semiconductor layer 360c have the above structure, the density of defect states at the interface between the semiconductor layer 360a and the semiconductor layer 360b and the interface between the semiconductor layer 360b and the semiconductor layer 360c can be made low. Thus, the influence of interface scattering on carrier conduction is small, and the transistor 500A can have a high on-state current and high frequency characteristics. Note that in the case where the semiconductor layer 360c has a stacked-layer structure, in addition to the effect of reducing the density of defect states at the interface between the semiconductor layer 360b and the semiconductor layer 360c, inhibiting diffusion of the constituent elements of the semiconductor layer 360c to the insulating layer 549 side is expected. More specifically, since the semiconductor layer 360c has a stacked-layer structure in which an oxide that does not contain In is positioned in the upper layer, diffusion of In to the insulating layer 549 side can be inhibited. Since the insulating layer 549 functions as a gate insulator, In diffusion into the insulating layer 549 would cause poor characteristics of the transistor. Thus, when the semiconductor layer 360c has a stacked-layer structure, a highly reliable semiconductor device can be provided.

Here, as the insulating layer 566 in contact with the semiconductor layer 360, an insulator that contains oxygen more than oxygen in the stoichiometric composition is preferably used. That is, an excess-oxygen region is preferably formed in the insulating layer 566. When such an insulator containing excess oxygen is provided in contact with the semiconductor layer 360, oxygen vacancies (Vo) in the semiconductor layer 360 can be reduced and the reliability of the transistor 500A can be improved. When hydrogen enters the oxygen vacancies in the semiconductor layer 360, such defects (hereinafter, referred to as VoH in some cases) function as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of the transistor. In one embodiment of the present invention, VoH in the semiconductor layer 360 is preferably reduced as much as possible so that the semiconductor layer 360 becomes a highly purified intrinsic or substantially highly purified intrinsic oxide. It is effective to remove impurities such as moisture and hydrogen in an oxide semiconductor (sometimes described as dehydration or dehydrogenation treatment) and to compensate for oxygen vacancies by supplying oxygen to the oxide semiconductor (sometimes described as oxygen adding treatment) in order to obtain an oxide semiconductor whose VoH is sufficiently reduced. When an oxide semiconductor with sufficiently reduced impurities such as VoH is used for a channel formation region of a transistor, the transistor can have stable electrical characteristics.

One or more of heat treatment, microwave treatment, and RF treatment may be performed in a state in which the insulator including the excess-oxygen region and the semiconductor layer 360 are in contact with each other. By the treatment, water or hydrogen in the semiconductor layer 360 can be removed. For example, in the semiconductor layer 360, dehydrogenation can be performed when a reaction in which a bond of VoH is cut occurs, i.e., a reaction of "VoH→Vo+H" occurs. Part of hydrogen generated at this time is bonded to oxygen to be $H_2O$, and removed from the semiconductor layer 360 or an insulator near the semiconductor layer 360 in some cases. Some hydrogen may be gettered into the conductive layer 542 in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the semiconductor layer 360 or an insulator in the vicinity of the semiconductor layer 360. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500A, heat treatment is preferably performed with the surface of the semiconductor layer 360 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the semiconductor layer 360 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the semiconductor layer 360 can promote a reaction in which oxygen vacancies in the semiconductor layer 360 are filled with supplied oxygen, i.e., a reaction of "Vo+O→null". Furthermore, hydrogen remaining in the semiconductor layer 360 reacts with supplied oxygen, so that the hydrogen can be removed as $H_2O$ (dehydrogenation). This can inhibit recombination of hydrogen remaining in the semiconductor layer 360 with oxygen vacancies and formation of VoH.

In addition, in the case where the insulating layer 566 includes an excess-oxygen region, it is preferable that the insulating layer 565 have a function of inhibiting diffusion of oxygen (e.g., an oxygen atom, an oxygen molecule, or the like) (through which oxygen is unlikely to pass).

When the insulating layer 565 has a function of inhibiting diffusion of oxygen or impurities, oxygen contained in the semiconductor layer 360 is not diffused into the insulating layer 562 side, which is preferable. That is, a reaction of oxygen contained in the insulating layer 566 or the semiconductor layer 360 with the conductive layer 505 can be prevented.

In the transistor 500A, the conductive layer 560 functioning as the first gate (top gate) electrode is formed in a self-aligned manner to fill an opening formed in the insulating layer 580 and the like. Forming the conductive layer 560 in this manner allows the conductive layer 560 to be surely positioned in a region between the conductive layer 542a and the conductive layer 542b without alignment.

The conductive layer 560 preferably includes the conductive layer 560a and the conductive layer 560b positioned over the conductive layer 560a. For example, the conductive layer 560a is preferably positioned so as to cover the bottom surface and a side surface of the conductive layer 560b. Moreover, as illustrated in FIG. 37B, the top surface of the conductive layer 560 is substantially aligned with the top surface of the insulating layer 549 and the top surface of the oxide 360c.

The conductive layer 505 sometimes functions as a second gate (also referred to as bottom gate) electrode. In that case, by changing the potential applied to the conductive layer 505 not in conjunction with but independently of the potential applied to the conductive layer 560, the threshold voltage (Vth) of the transistor 500A can be controlled. In particular, by applying a negative potential to the conductive layer 505, Vth of the transistor 500A can be higher than 0 V, and its off-state current can be reduced. Thus, a drain current at the time when a potential applied to the conductive layer 560 is 0 V can be lower in the case where a negative potential is applied to the conductive layer 505 than in the case where a negative potential is not applied to the conductive layer 505.

For example, the conductive layer 505 and the conductive layer 560 are provided to overlap with the channel formation region of the semiconductor layer 360 provided therebetween, whereby when a voltage is applied to the conductive layer 505 and the conductive layer 560, an electric field generated from the conductive layer 560 and an electric field generated from the conductive layer 505 are connected and can cover the channel formation region of the semiconductor layer 360.

In other words, the channel formation region can be electrically surrounded by the electric field of the conductive layer 560 having a function of the first gate electrode and the electric field of the conductive layer 505 having a function of the second gate electrode. In this specification and the like, the transistor structure in which the channel formation region is electrically surrounded by the electric fields of the first gate electrode and the second gate electrode is referred to as a surrounded channel (S-channel) structure.

The insulating layer 565 and the insulating layer 571 preferably have a function of inhibiting diffusion of hydrogen (e.g., at least one of a hydrogen atom, a hydrogen molecule, and the like). In addition, the insulating layer 565 and the insulating layer 571 preferably have a function of inhibiting diffusion of oxygen (e.g., at least one of an oxygen atom, an oxygen molecule, and the like). For example, the insulating layer 565 and the insulating layer 571 preferably have a function of inhibiting diffusion of one or both of hydrogen and oxygen than the insulating layer 566. The insulating layer 565 and the insulating layer 571 preferably have a function of inhibiting diffusion of one or both of hydrogen and oxygen than the insulating layer 549. The insulating layer 565 and the insulating layer 571 preferably have a function of inhibiting diffusion of one or both of hydrogen and oxygen than the insulating layer 580.

Note that in this specification and the like, a film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A barrier film having conductivity is sometimes referred to as a conductive barrier film.

As illustrated in FIG. 37B, the insulating layer 571 is preferably in contact with the top surfaces of the conductive layer 542a and the conductive layer 542b, the side surfaces of the conductive layer 542a and the conductive layer 542b except facing side surfaces of the conductive layer 542a and the conductive layer 542b, the side surfaces of the semiconductor layer 360a and the semiconductor layer 360b, and the part of the top surface of the insulating layer 566. Accordingly, the insulating layer 580 is isolated from the insulating layer 566, the semiconductor layer 360a, and the semiconductor layer 360b by the insulating layer 571. This can inhibit entry of impurities such as hydrogen contained in the insulating layer 580 and the like into the insulating layer 566, the semiconductor layer 360a, and the semiconductor layer 360b.

As illustrated in FIG. 37B, the transistor 500A has a structure in which the insulating layer 574 is in contact with the top surfaces of the conductive layer 560, the insulating layer 549, and the semiconductor layer 360c. With such a structure, impurities such as hydrogen contained in the insulating layer 581 and the like can be inhibited from entering the insulating layer 549. Thus, adverse effects on the electric characteristics of the transistor and the reliability of the transistor can be suppressed.

With the above structure, a transistor having a high on-state current can be provided. Alternatively, a transistor with low off-state current can be provided. Alternatively, a semiconductor device that has small variations in electrical characteristics, stable electrical characteristics, and high reliability can be provided.

After the transistor 500A is formed, an opening may be formed to surround the transistor 500A and an insulating layer having a high barrier property against hydrogen or water may be formed to cover the opening. Surrounding the transistor 500A by the insulating layer having a high barrier property can prevent entry of moisture and hydrogen from the outside. Alternatively, a plurality of transistors 500A may be collectively surrounded by the insulating layer having a high barrier property against hydrogen or water. When an opening is formed to surround the transistor 500A, for example, the formation of an opening reaching the insulating layer 561 or the insulating layer 562 and the formation of the insulating layer having a high barrier property in contact with the insulating layer 561 or the insulating layer 562 are suitable because these formation steps can also serve as part of the manufacturing steps of the transistor 500A. The insulating layer having a high barrier property against hydrogen or water is formed using a material similar to that for the insulating layer 565 or the insulating layer 571, for example.

Transistor Structure Example 2

Figure 38A:
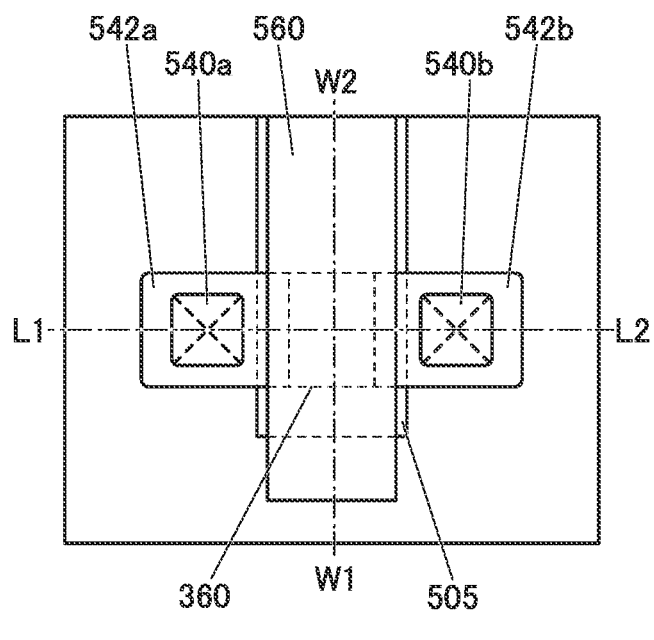
FIG. 38A, FIG. 38B, and FIG. 38C are views illustrating a structure example of a transistor.
Figure 38C:
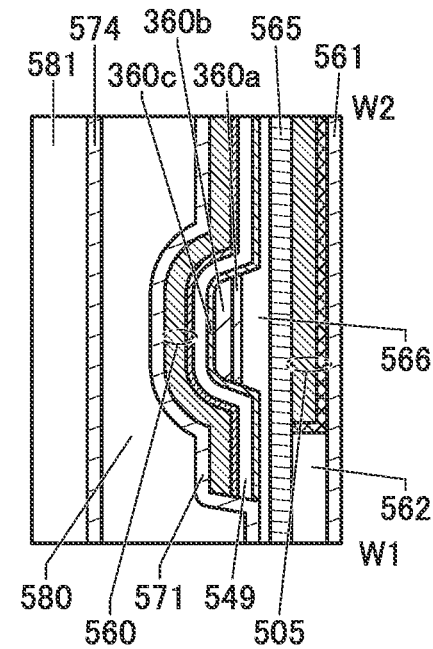
Figure 38B:
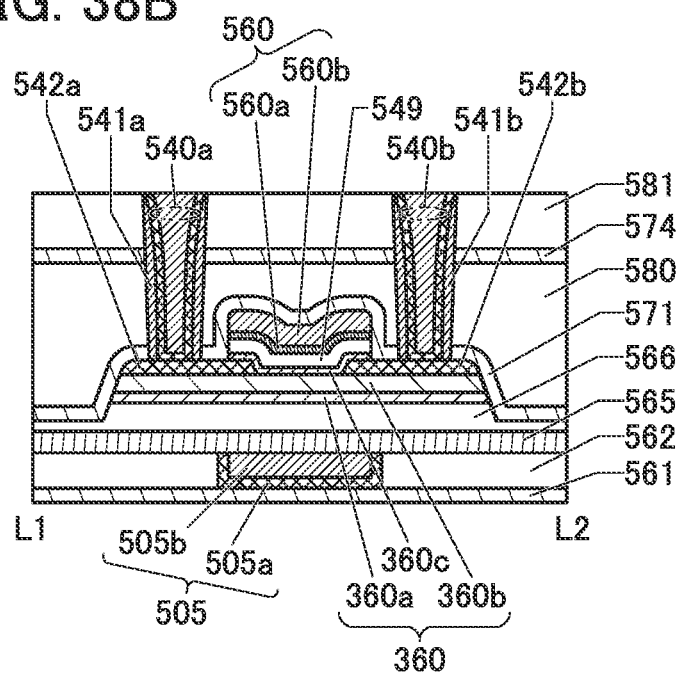

A structure example of the transistor 500B will be described with reference to FIG. 38A, FIG. 38B, and FIG. 38C. FIG. 38A is a top view of the transistor 500B. FIG. 38B is a cross-sectional view of a portion indicated by a dashed-dotted line L1-L2 in FIG. 38A. FIG. 38C is a cross-sectional view of a portion indicated by a dashed-dotted line W1-W2 in FIG. 38A. For clarity of the drawing, some components are not illustrated in the top view of FIG. 38A.

The transistor 500B is a modification example of the transistor 500A. Therefore, differences from the transistor 500A are mainly described to avoid repeated description.

The conductive layer 560 functioning as a first gate electrode includes the conductive layer 560a and the conductive layer 560b over the conductive layer 560a. The conductive layer 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 560*a* has a function of inhibiting oxygen diffusion, the range of choices for the material of the conductive layer 560*b* can be expanded. That is, the conductive layer 560*a* inhibits oxidation of the conductive layer 560*b*, thereby preventing the decrease in conductivity of the conductive layer 560*b*.

The insulating layer 571 is preferably provided to cover the top surface and the side surface of the conductive layer 560, a side surface of the insulating layer 549, and a side surface of the semiconductor layer 360*c*. For the insulating layer 571, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 571 is provided, whereby oxidation of the conductive layer 560 can be inhibited. Moreover, including the insulating layer 571 can inhibit diffusion of impurities such as water and hydrogen contained in the insulating layer 580 into the transistor 500B.

The transistor 500B has the conductive layer 560 overlapping with part of the conductive layer 542*a* and part of the conductive layer 542*b*, and thus tends to have larger parasitic capacitance than the transistor 500A. Thus, the transistor 500B tends to have a lower operation frequency than the transistor 500A. However, the transistor 500B does not require a step of embedding the conductive layer 560, the insulating layer 549, and the like in the opening formed in the insulating layer 580 and the like; thus, the productivity of the transistor 500B is higher than that of the transistor 500A.

This embodiment can be implemented in combination with any of the structures described in the other embodiments and the like, as appropriate.

Embodiment 3

In this embodiment, examples of an electronic device including the micromachine according to one embodiment of the present invention will be described with reference to drawings.

Examples of electronic devices including the micromachine according to one embodiment of the present invention include display devices of televisions, monitors, and the like, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, cellular phones, car phones, portable game machines, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Furthermore, industrial equipment such as guide lights, traffic lights, belt conveyors, elevators, escalators, industrial robots, power storage systems, and power storage devices for leveling the amount of power supply and smart grid can be given. In addition, electric motors using power from power storage units, moving objects driven by fuel engines, and the like may also be included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircraft, rockets, artificial satellites, space probes, planetary probes, and spacecraft.

In particular, examples of electronic devices to which the display device according to one embodiment of the present invention is applied are television devices (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, and large game machines such as pachinko machines, and the like.

Figure 39A:
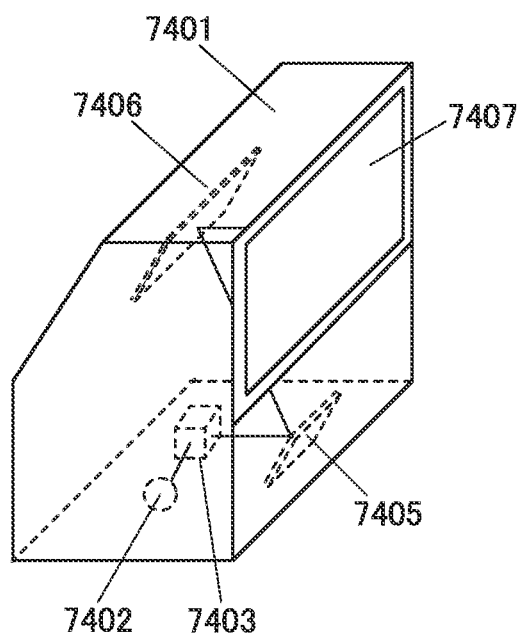
FIG. 39A and FIG. 39B are views illustrating an example of an electronic device.

FIG. 39A illustrates a rear projector (projection TV) including a main body 7401, a light source 7402, a display device 7403, a reflector 7405, a reflector 7406, and a screen 7407. The micromachine according to one embodiment of the present invention can be used for the display device 7403, for example.

Figure 39B:
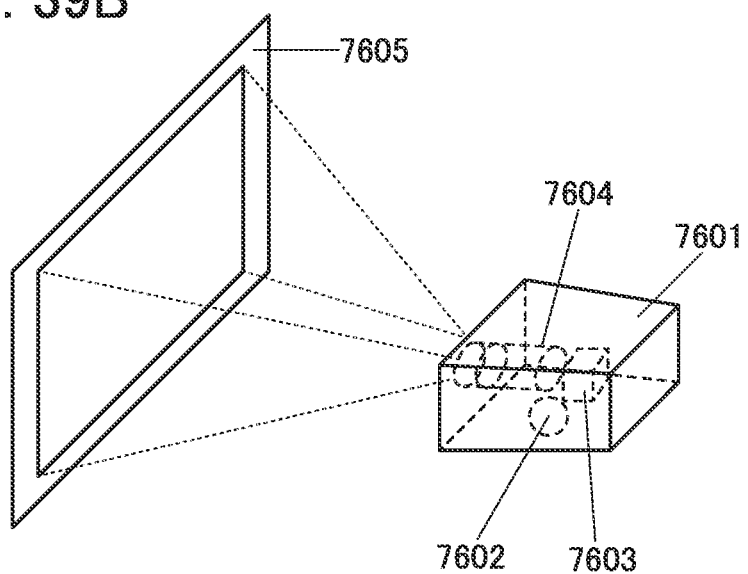

FIG. 39B illustrates a front projector including a main body 7601, a light source 7602, a display device 7603, an optical element 7604, and a screen 7605. The micromachine according to one embodiment of the present invention can be used for the display device 7603, for example.

According to one embodiment of the present invention, power consumption of an electronic device can be reduced. Alternatively, according to one embodiment of the present invention, an electronic device with stable operation and high reliability even in a high-temperature environment can be provided. Alternatively, according to one embodiment of the present invention, the display quality of a display device can be favorable.

This embodiment can be implemented in combination with any of the structures described in the other embodiments and the like, as appropriate.

REFERENCE NUMERALS

100: micromachine, 101: substrate, 121: electrode, 122: electrode, 123: electrode, 124: stopper, 125: support, 126: support portion, 151: circuit, 158: wiring, 161: transistor, 162: transistor, 163: transistor, 164: transistor, 165: capacitor, 166: capacitor, 169: transistor, 171: transistor, 172: transistor, 173: transistor, 174: transistor, 175: capacitor, 176: capacitor, 179: transistor, 180: structure body, 200: display element, 300: display device, 301: light source, 302: lens, 303: screen, 311: light, ND11: node, ND12: node, ND13: node, ND21: node, ND22: node, ND23: node

The invention claimed is:

1. A semiconductor device comprising:
first to fourth transistors;
a first capacitor;
a second capacitor;
first to third electrodes; and
first to sixth wirings,
wherein one of a source electrode and a drain electrode of the first transistor is electrically connected to the first wiring,
wherein the other of the source electrode and the drain electrode of the first transistor is electrically connected to one electrode of the first capacitor and the first electrode,
wherein a gate electrode of the first transistor is electrically connected to the fifth wiring,
wherein one of a source electrode and a drain electrode of the second transistor is electrically connected to the second wiring,
wherein the other of the source electrode and the drain electrode of the second transistor is electrically connected to the other electrode of the first capacitor,
wherein a gate electrode of the second transistor is electrically connected to the sixth wiring,
wherein one of a source electrode and a drain electrode of the third transistor is electrically connected to the third wiring,
wherein the other of the source electrode and the drain electrode of the third transistor is electrically connected to one electrode of the second capacitor and the second electrode,
wherein a gate electrode of the third transistor is electrically connected to the fifth wiring,
wherein one of a source electrode and a drain electrode of the fourth transistor is electrically connected to the fourth wiring,
wherein the other of the source electrode and the drain electrode of the fourth transistor is electrically connected to the other electrode of the second capacitor,
wherein a gate electrode of the fourth transistor is electrically connected to the sixth wiring,
wherein semiconductor layers of the first to the fourth transistors each comprise an oxide semiconductor, and
wherein the third electrode has a function of tilting in accordance with potentials of the first electrode and the second electrode.

2. The semiconductor device according to claim 1, wherein the first to the fourth transistors each comprise a back gate electrode.

3. The semiconductor device according to claim 1, wherein the oxide semiconductor comprises one or both of indium and zinc.

4. The semiconductor device according to claim 1, wherein the first electrode and the second electrode function as fixed electrodes.

5. The semiconductor device according to claim 1, wherein the third electrode functions as a movable electrode.

6. The semiconductor device according to claim 1, wherein the third electrode has a visible light reflectivity of higher than or equal to 70% and lower than or equal to 100%.

7. An electronic device comprising:
the semiconductor device according to claim 1; and
a light source, an optical element, or a reflector.

8. A semiconductor device comprising:
first to fourth transistors;
a first capacitor;
a second capacitor;
first to third electrodes; and
first to sixth wirings,
wherein one of a source electrode and a drain electrode of the first transistor is electrically connected to the first wiring,
wherein the other of the source electrode and the drain electrode of the first transistor is electrically connected to one electrode of the first capacitor and the first electrode,
wherein a gate electrode of the first transistor is electrically connected to the fifth wiring,
wherein one of a source electrode and a drain electrode of the second transistor is electrically connected to the second wiring,
wherein the other of the source electrode and the drain electrode of the second transistor is electrically connected to the other electrode of the first capacitor,
wherein a gate electrode of the second transistor is electrically connected to the sixth wiring,
wherein one of a source electrode and a drain electrode of the third transistor is electrically connected to the third wiring,
wherein the other of the source electrode and the drain electrode of the third transistor is electrically connected to one electrode of the second capacitor and the second electrode,
wherein a gate electrode of the third transistor is electrically connected to the fifth wiring,
wherein one of a source electrode and a drain electrode of the fourth transistor is electrically connected to the fourth wiring,
wherein the other of the source electrode and the drain electrode of the fourth transistor is electrically connected to the other electrode of the second capacitor,
wherein a gate electrode of the fourth transistor is electrically connected to the sixth wiring,
wherein semiconductor layers of the first to the fourth transistors each comprise an oxide semiconductor,
wherein a distance between the first electrode and the third electrode changes in accordance with a potential of the first electrode, and
wherein a distance between the second electrode and the third electrode changes in accordance with a potential of the second electrode.

9. The semiconductor device according to claim 8, wherein the first to the fourth transistors each comprise a back gate electrode.

10. The semiconductor device according to claim 8, wherein the oxide semiconductor comprises one or both of indium and zinc.

11. The semiconductor device according to claim 8, wherein the first electrode and the second electrode function as fixed electrodes.

12. The semiconductor device according to claim 8, wherein the third electrode functions as a movable electrode.

13. The semiconductor device according to claim 8, wherein the third electrode has a visible light reflectivity of higher than or equal to 70% and lower than or equal to 100%.

14. An electronic device comprising:
the semiconductor device according to claim 8; and
a light source, an optical element, or a reflector.

* * * * *